United States Patent
Wang et al.

(10) Patent No.: US 10,903,182 B1
(45) Date of Patent: Jan. 26, 2021

(54) AMPLIFIER DIE BOND PAD DESIGN AND AMPLIFIER DIE ARRANGEMENT FOR COMPACT DOHERTY AMPLIFIER MODULES

(71) Applicant: NXP USA, INC., Austin, TX (US)

(72) Inventors: Lu Wang, Chandler, AZ (US); Elie A. Maalouf, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/563,743

(22) Filed: Sep. 6, 2019

(51) Int. Cl.
| H01L 23/00 | (2006.01) |
| H01L 23/66 | (2006.01) |
| H03F 1/02 | (2006.01) |
| H03F 3/195 | (2006.01) |
| H03F 3/213 | (2006.01) |

(52) U.S. Cl.
CPC .............. *H01L 24/09* (2013.01); *H01L 23/66* (2013.01); *H01L 24/49* (2013.01); *H03F 1/0288* (2013.01); *H03F 3/195* (2013.01); *H03F 3/213* (2013.01); *H01L 2223/6655* (2013.01); *H01L 2224/04042* (2013.01); *H03F 2200/318* (2013.01); *H03F 2200/451* (2013.01); *H03F 2203/21103* (2013.01); *H03F 2203/21139* (2013.01)

(58) Field of Classification Search
CPC ......... H01L 24/09; H01L 24/49; H01L 23/66; H01L 2223/6655; H01L 2224/04042; H03F 1/0288; H03F 3/195; H03F 3/213; H03F 2200/318; H03F 2200/451; H03F 2203/21103; H03F 2203/21139

USPC ........................................................ 257/728
See application file for complete search history.

(56) References Cited

U.S. PATENT DOCUMENTS

| 9,509,252 B2 | 11/2016 | Moronval et al. |
| 9,543,914 B2 | 1/2017 | Bouny |
| 9,774,301 B1 | 9/2017 | Maalouf et al. |
| 2015/0145601 A1* | 5/2015 | Moronval ............. H03F 1/0288 330/295 |
| 2018/0159479 A1* | 6/2018 | Wu ......................... H01L 24/49 |

OTHER PUBLICATIONS

Moronval, "A Compact 60 W MMIC Amplifier based on a Novel 3-Way 1:2:1 Doherty Architecture with Best-in-Class Efficiency for Small Cells," 2017 IEEE MTT-S International Microwave Symposium (IMS), pp. 118—Jun. 9-14, 2017.

* cited by examiner

*Primary Examiner* — Tong-Ho Kim

(57) ABSTRACT

Embodiments of a method and device are disclosed. In an embodiment, a Doherty amplifier module includes a substrate including a mounting surface, and a carrier amplifier die, a first peaking amplifier die, and a second peaking amplifier die on the mounting surface. The carrier amplifier die includes a first output bond pad that has a first length and a first width. The first peaking amplifier die includes a second output bond pad including a first main pad portion having a second length and a second width and including a first side pad portion having a third length and a third width. At least one of the second width or the third width is greater than the first width. The second peaking amplifier includes a third output bond pad. A first wirebond array is coupled between the third output bond pad and at least the first side pad portion.

20 Claims, 16 Drawing Sheets

AMPLIFIER DIE BOND PAD DESIGN AND AMPLIFIER DIE ARRANGEMENT FOR COMPACT DOHERTY AMPLIFIER MODULES

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

The high efficiency of the Doherty architecture makes the architecture desirable for current and next-generation wireless systems. However, the architecture presents challenges in terms of semiconductor package design. Current Doherty amplifier semiconductor package designs call for the use of discrete devices, conductors, and integrated circuits to implement each amplification path. For example, in a three-way Doherty architecture including a carrier amplification path, a first peaking amplification path, and a second peaking amplification path, each of the amplification paths may include a distinct power transistor IC die, along with distinct inductance and capacitance components. These distinct power transistor IC dies and components are maintained a distance apart in a typical device package in order to limit potential performance degradation that may occur due to signal coupling between the carrier amplifier, first peaking amplifier, and/or second peaking amplifier. More specifically, undesirable signal coupling between the carrier amplifier, first peaking amplifier, and/or second peaking amplifier may involve the transfer of energy between components of the carrier amplification path, first peaking amplification path, and/or second peaking amplification path through magnetic and/or electric fields associated with the signals carried on those amplification paths.

Unfortunately, the desire to maintain a significant spatial distance between amplifier paths in a device package in order to reduce coupling between the paths limits the potential for miniaturization of the semiconductor package. Limiting miniaturization is undesirable where low cost, a low weight, and a small volume and small printed circuit board (PCB) real estate are important package attributes for various applications.

SUMMARY

Embodiments of a method and a device are disclosed. In an embodiment, a Doherty amplifier module includes a substrate including a mounting surface, a carrier amplifier die on the mounting surface, a first peaking amplifier die on the mounting surface, and a second peaking amplifier die on the mounting surface. The carrier amplifier die includes a first output bond pad that has a first length and a first width. The first peaking amplifier die has substantially parallel first and second sides, and substantially parallel third and fourth sides. The first peaking amplifier die includes a second output bond pad proximate to the second side, the second output bond pad including a first main pad portion and a first side pad portion, the first main pad portion having a second length that extends parallel with the second side and a second width that extends orthogonal to the second side, the first side pad portion having a third length that extends orthogonal to the second side and a third width that extends parallel with the second side, where at least one of the second width or the third width is greater than the first width.

The second peaking amplifier die has substantially parallel fifth and sixth sides, and substantially parallel seventh and eighth sides. The fifth and sixth sides of the second peaking amplifier die are substantially parallel with the third and fourth sides of the first peaking amplifier die, the second peaking amplifier die including a third output bond pad proximate to the sixth side, where the third output bond pad has a fourth length that extends parallel with the sixth side and a fourth width that extends orthogonal to the sixth side.

The Doherty amplifier module further includes a first wirebond array coupled between the third output bond pad of the second peaking amplifier die and at least the first side pad portion of the second output bond pad of the first peaking amplifier die.

In an embodiment, the carrier amplifier die includes a first power transistor, the first peaking amplifier die includes a second power transistor and the second peaking amplifier die includes a third power transistor. A drain-source capacitance of the third power transistor, a line inductance comprising a first inductance of the first wirebond array and a second inductance of the second output bond pad, and a drain-source capacitance of the second power transistor form a quasi-transmission line configured to perform a phase delay and an impedance transformation for an amplified radio frequency (RF) signal provided at the third output bond pad on the second peaking amplifier die. The at least one of the second width or the third width is configured to reduce the second inductance of the second output bond pad.

In an embodiment, the at least one of the second width or the third width enables the line inductance to be less than 300 picohenries (pH).

In an embodiment, the Doherty amplifier module further includes a second wirebond array coupled between the main pad portion of the second output bond pad and a signal combining bond pad external to the carrier amplifier die, the first peaking amplifier die, and the second peaking amplifier die. The second wirebond array is configured to provide a combined radio frequency (RF) signal comprising a first amplified RF signal from the first peaking amplifier die and a second amplified RF signal from the second peaking amplifier die to the signal combining bond pad, the second wirebond array being orthogonal to the first wirebond array.

In an embodiment, the second peaking amplifier die further includes one or more shunt direct current (DC) blocking capacitors coupled to a bond pad on the second peaking amplifier die. The third output bond pad includes a second main pad portion and a second side pad portion, the second main pad portion having the fourth length and the fourth width, the second side pad portion having a fifth length that extends orthogonal to the sixth side and a fifth width that extends parallel with the sixth side, where at least one of the fourth width or the fifth width is greater than the first width. A second wirebond array is coupled between the second side pad portion of the second output bond pad and the bond pad, the second wirebond array being orthogonal to the first wirebond array.

In an embodiment, the at least one of the fourth width or the fifth width is configured to reduce the inductance of the third output bond pad.

In an embodiment, the carrier amplifier die includes ninth and tenth substantially parallel sides, where the first output bond pad is proximate to the tenth side. The carrier amplifier die is configured to amplify a first radio frequency (RF) signal along a first signal path to produce a first amplified RF signal at the first output bond pad, the first signal path extending from the ninth side to the tenth side of the carrier amplifier die. The first peaking amplifier die is configured to amplify a second RF signal along a second signal path to produce a second amplified RF signal at the second output bond pad, the second signal path extending from the first side of the first peaking amplifier die to the second side of the first peaking amplifier die. The second peaking amplifier die is configured to amplify a third RF signal along a third signal path to produce a third amplified RF signal at the third output bond pad, the third signal path extending from the fifth side of the second peaking amplifier die to the sixth side of the second peaking amplifier die. The third signal path is orthogonal to the first and second signal paths.

In an embodiment, the first side pad portion of the second output bond pad is proximate to the third side of the first peaking amplifier die. The sixth side of the second peaking amplifier die faces the third side of the first peaking amplifier die.

Another embodiment of a Doherty amplifier module is disclosed. The Doherty amplifier module includes a substrate including a mounting surface, a carrier amplifier die on the mounting surface, and a peaking amplifier die on the mounting surface. The carrier amplifier die has substantially parallel first and second sides, and substantially parallel third and fourth sides. The carrier amplifier die includes a first output bond pad proximate to the second side, the first output bond pad including a first main pad portion and a first side pad portion, the first main pad portion having a first length that extends parallel with the second side and a first width that extends orthogonal to the second side, the side pad portion having a second length that extends orthogonal to the second side and a second width that extends parallel with the second side.

The peaking amplifier die has substantially parallel fifth and sixth sides, and substantially parallel seventh and eighth sides. The fifth and sixth sides of the peaking amplifier die are substantially parallel with the third and fourth sides of the carrier amplifier die. The peaking amplifier die includes a second output bond pad proximate to the sixth side, the second output bond pad including a second main pad portion and a second side pad portion, the second main pad portion having a third length that extends parallel with the sixth side and a third width that extends orthogonal to the sixth side, the second side pad portion having a fourth length that extends orthogonal to the sixth side and a fourth width that extends parallel with the sixth side. The third width is greater than the first width, or the fourth width is greater than the second width. The Doherty amplifier module further includes a first wirebond array coupled between the first output bond pad of the carrier amplifier die and at least the second side pad portion of the peaking amplifier die.

In an embodiment, the carrier amplifier die includes a first power transistor and the peaking amplifier die includes a second power transistor. A drain-source capacitance of the first power transistor, a line inductance comprising a first inductance of the first wirebond array and a second inductance of the second output bond pad, and a drain-source capacitance of the second power transistor form a quasi-transmission line configured to perform a phase delay and an impedance transformation for an amplified radio frequency (RF) signal provided at the first output bond pad. At least one of the third width or the fourth width is configured to reduce the second inductance of the second output bond pad.

In an embodiment, at least one of the third width or the fourth width enables the line inductance to be less than 300 picohenries (pH).

In an embodiment, the Doherty amplifier module further includes a second wirebond array coupled between the second main pad portion of the second output bond pad and a conductive contact on the mounting surface. The second wirebond array provides an amplified radio frequency (RF) output signal of the Doherty amplifier module to the conductive contact. The second wirebond array is orthogonal to the first wirebond array.

In an embodiment, the peaking amplifier die includes one or more shunt direct current (DC) blocking capacitors. The one or more shunt DC blocking capacitors are coupled to the second main pad portion of the second output bond pad via at least one conductive trace on the peaking amplifier die.

In an embodiment, at least one conductive trace comprises a meander line inductor or a planar spiral inductor.

In an embodiment, the carrier amplifier die is configured to amplify a first RF signal along a first signal path to produce a first amplified RF signal at the first output terminal, the first signal path extending from the first side of the carrier amplifier die to the second side of the carrier amplifier die. The peaking amplifier die is configured to amplify a second RF signal along a second signal path to produce a second amplified RF signal at the second output bond pad, the second signal path extending from the fifth side of the peaking amplifier die to the sixth side of the peaking amplifier die. The first signal path is orthogonal to the second signal path.

In an embodiment, the second side pad portion of the second output bond pad is proximate to the seventh side of the peaking amplifier die. The second side of the carrier amplifier die faces the seventh side of the peaking amplifier die.

In an embodiment, a method of fabricating a Doherty amplifier module is disclosed. The involves attaching a carrier amplifier die on a mounting surface of a substrate, the carrier amplifier die including a first output bond pad that has a first length and a first width.

The method further involves attaching a first peaking amplifier die on the mounting surface of the substrate, the first peaking amplifier die having substantially parallel first and second sides, and substantially parallel third and fourth sides. The first peaking amplifier die includes a second output bond pad proximate to the second side, the second output bond pad including a first main pad portion and a first side pad portion, the first main pad portion having a second length that extends parallel with the second side and a second width that extends orthogonal to the second side, the side pad portion having a third length that extends orthogonal to the second side and a third width that extends parallel with the second side. At least one of the second width or the third width is greater than the first width.

The method further involves attaching a second peaking amplifier die on the mounting surface of the substrate. The second peaking amplifier die has substantially parallel fifth and sixth sides, and substantially parallel seventh and eighth sides. The fifth and sixth sides of the second peaking amplifier die are substantially parallel with the third and fourth sides of the first peaking amplifier die, the second peaking amplifier die including a third output bond pad proximate to the sixth side. The third output bond pad has a fourth length that extends parallel with the sixth side and a fourth width that extends orthogonal to the sixth side.

The method further involves coupling a first wirebond array between the third output bond pad of the second peaking amplifier die and at least the side pad portion of the second output bond pad of the first peaking amplifier die.

In an embodiment, the carrier amplifier die includes a first power transistor, the first peaking amplifier die includes a second power transistor and the second peaking amplifier die includes a third power transistor. A drain-source capacitance of the third power transistor, a line inductance comprising a first inductance of the first wirebond array and a second inductance of the second output bond pad, and a drain-source capacitance of the second power transistor form a quasi-transmission line configured to perform a phase delay and an impedance transformation for an amplified radio frequency (RF) signal provided at the third output bond pad on the second peaking amplifier die. At least one of the second width or the third width is configured to reduce the second inductance of the second output bond pad.

In an embodiment, the method further involves coupling a second wirebond array between the main pad portion of the second output bond pad and a signal combining bond pad external to the carrier amplifier die, the first peaking amplifier die, and the second peaking amplifier die. The second wirebond array is configured to provide a combined radio frequency (RF) signal comprising a first amplified RF signal from the first peaking amplifier die and a second amplified RF signal from the second peaking amplifier die to the signal combining bond pad. The second wirebond array is orthogonal to the first wirebond array.

In an embodiment, the second peaking amplifier die further includes one or more shunt direct current (DC) blocking capacitors coupled to a bond pad on the second peaking amplifier die, and the third output bond pad includes a second main pad portion and a second side pad portion. The second main pad portion has the fourth length and the fourth width, the second side pad portion has a fifth length that extends orthogonal to the sixth side and a fifth width that extends parallel with the sixth side. At least one of the fourth width or the fifth width is greater than the first width. The method further involves coupling a second wirebond array between the second side pad portion of the second output bond pad and the bond pad, the second wirebond array being orthogonal to the first wirebond array.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
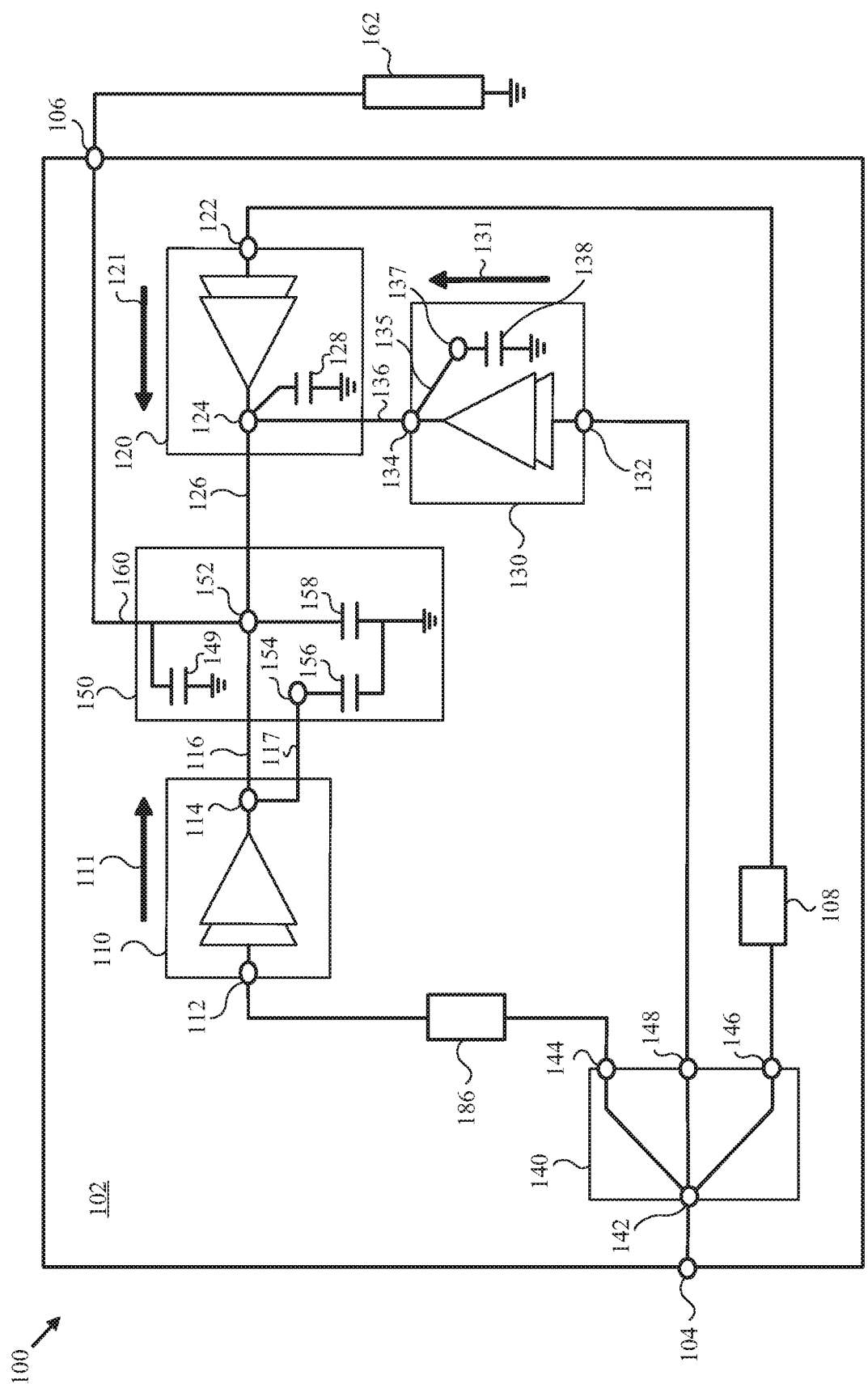
FIG. 1 depicts a schematic diagram of a three-way Doherty amplifier in accordance with various embodiments of the disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

The aspects described herein are directed to high-frequency signal amplifier devices. For example, the aspects described herein may be implemented in high-frequency (e.g., 5.0 gigahertz (GHz) or greater) two-way or three-way Doherty amplifier modules. In a three-way Doherty amplifier, an input signal (e.g., a radio frequency (RF) input signal) is split at an input or power splitter between a carrier amplification path, a first peaking amplification path, and a second peaking amplification path. The split signals are then separately amplified by the carrier and peaking amplifiers of the Doherty amplifier and combined at an output stage. When combining the outputs of the carrier and peaking amplifiers, it may be desired to make minor adjustments in the phase and amplitude or attenuation of the Doherty amplifier module's input splitter to provide optimal balancing between the outputs of each path. To facilitate this adjustment, a Doherty amplifier may include an adjustable power divider or splitter that can be used to fine-tune the configuration of the input signals to both the carrier and peaking amplifiers. A Doherty amplifier may also include an adjustable phase delay and/or an amplitude adjustment configured to selectively modify the phase shift and/or amplitude of one or more amplification paths of the Doherty amplifier.

In a multiple-path amplifier, such as a three-way Doherty amplifier, coupling between signal paths can adversely affect amplifier performance. Coupling can be of two types, including electric coupling (commonly referred to as capacitive coupling) and magnetic coupling (commonly referred to as inductive coupling). Inductive and magnetic coupling, referred to herein as electromagnetic coupling, occurs when a time-varying magnetic field exists between current carrying, parallel conductors that are in close proximity to one another. For example, one type of electromagnetic coupling in a Doherty amplifier power transistor package may occur between arrays of signal wires (e.g., wirebond arrays), which are connected between the various electrical components making up each of the carrier and peaking amplifier paths. The performance of a Doherty amplifier can be adversely affected by electromagnetic coupling between adjacent wirebond arrays. Accordingly, electromagnetic coupling issues have restricted miniaturization efforts for Doherty amplifiers due to minimum spacing requirements between the carrier and peaking amplifier paths.

The Doherty amplifier module embodiments described herein involve the application of CLC networks (also referred to as a capacitor-inductor-capacitor network or a Pi network). In some embodiments, a CLC network may be configured to perform both a phase delay (e.g., an approximately 90 degree phase delay) and impedance transformation for the output of one or more amplifier dies in the Doherty amplifier module. Therefore, since the CLC network can replicate the phase delay and impedance transformation functions of a transmission line that is one quarter of a wavelength long (e.g., λ/4), a CLC network may also be referred to as a "quasi-transmission line" or a "CLC quasi-transmission line." However, as the frequency of the input signal increases into a high-frequency range (e.g., the frequency f is approximately 5.0 GHz or greater), the required inductance L for the CLC quasi-transmission line decreases significantly. This scenario may present difficulties when attempting to physically realize the required inductance L in a Doherty amplifier module. The embodiments described herein may overcome these difficulties.

Three-Way Doherty Amplifier Implementations

FIG. 1 is a schematic diagram of a Doherty amplifier 100 (also referred to as a three-way Doherty amplifier 100), in accordance with an example embodiment. Some or all components of the Doherty amplifier 100 may be implemented in a single device package or module. As will be explained in detail later, and in accordance with various embodiments, the orientations of the various amplifier components enable the size of the package or module to be significantly reduced, when compared with conventional packaging techniques, while still meeting gain, linearity, stability, and efficiency performance criteria. This is achieved, more specifically, by orienting first and second amplifier components in a head-to-head configuration and by orienting a third amplifier component in an orthogonal configuration with respect to the first and second amplifier components. In an embodiment, the first amplifier component may be a carrier amplifier of the Doherty amplifier 100, the third amplifier component may be a first peaking amplifier (also referred to as a peaking 1 amplifier) of the Doherty amplifier 100, and the second amplifier component may be a second peaking amplifier (also referred to as a peaking 2 amplifier) of the Doherty amplifier 100. For example, the orientation of the first and second amplifier components may allow a first signal path (e.g., signal path 111) of the first amplifier component to have an approximately 180 degree angular offset relative to a second signal path (e.g., signal path 121) of the second amplifier component, and the orientation of the third amplifier component may allow a third signal path (e.g., signal path 131) of the third amplifier component to have a 90 degree angular offset relative to the first and second signal paths. The 90 degree angular offset has the effect of reducing electromagnetic coupling between the third signal path (e.g., signal path 131) and the first and second signal paths (e.g., signal paths 111 and 121).

In an embodiment, the Doherty amplifier 100 includes an RF input node 104, an RF output node 106, a power splitter 140, a first signal path 111, a second signal path 121, a third signal path 131, a first combining node 152 (also referred to as a first summing node), and a second combining node (also referred to as a second summing node). In an embodiment, the second combining node may be the output terminal of the second amplifier die 120 (e.g., the RF output terminal 124). When incorporated into a larger RF system, the RF input node 104 is coupled to an RF signal source (not illustrated), and the RF output node 106 is coupled to a load 162 (e.g., a resistive load, such as an antenna). In an embodiment, the RF output node 106 may be coupled to the load 162 via an impedance transformer. For example, the impedance transformer may be configured to match the impedance of the load 162 (e.g., the impedance looking into the output node 106) to a source impedance of 50Ω or other suitable impedance value. In some embodiments, the impedance transformer may be external to the Doherty amplifier 100. Fundamentally, the Doherty amplifier 100 is configured to amplify the input RF signal, and to produce an amplified RF output signal at the RF output node 106. As indicated in FIG. 1 with box 102, some or all components of Doherty amplifier 100 may be implemented in a single device package or module.

In an embodiment, the power splitter 140 has an input 142 and three outputs 144, 146, 148. The power splitter input 142 is coupled to the RF input node 104 to receive the input RF signal. The power splitter 140 is configured to divide the RF input signal received at input 142 into first, second, and third RF signals, which are provided to the first, second, and third signal paths 111, 121, 131 through outputs 144, 146, 148. In some embodiments, the power splitter 140 may include one or more phase shift elements configured to impart an approximately 90 degree phase shift (e.g., a 90 degree phase delay) to the signal provided at output 144, 146, and/or 148. In some embodiments, one or both of the phase shifters 108, 186 described herein may be implemented in the power splitter 140.

When Doherty amplifier 100 has a symmetrical configuration (i.e., a configuration in which the first, second, and third amplifiers include power transistors that are substantially identical in size or power handling capability), the power splitter 140 may divide or split the input RF signal received at the input 142 into three signals that have approximately equal power. Conversely, when Doherty amplifier 100 has an asymmetrical configuration (i.e., a configuration in which one or more of the first, second, and/or third amplifiers includes a power transistor that is significantly larger than the power transistor(s) in one or more of the other amplifiers), the power splitter 140 may output signals having unequal power. In some embodiments, the power splitter 140 may be implemented with fixed-value, passive components. In other embodiments, the power splitter 140 may be implemented with one or more controllable variable attenuators and/or variable phase shifters, which enable the power splitter 140 to attenuate and/or phase shift the first, second, and third RF signals based on externally-provided control signals.

Doherty amplifier 100 includes first, second, and third amplifier die 110, 120, 130 and a signal combiner device 150, according to an embodiment. Each amplifier die 110, 120, 130 includes an input terminal 112, 122, 132 proximate to a first edge of the amplifier die 110, 120, 130, and output terminal 114, 124, 134 proximate to a second edge of the amplifier die 110, 120, 130 that is opposite (and parallel to) the first edge. One or more power transistors are electrically connected between each of the input and output terminals.

The outputs 144, 146, 148 of the power splitter 140 are connected to the first, second, and third signal paths 111, 121, 131, respectively. As used herein, the term "signal path" refers to the path followed by an RF signal through a circuit (e.g., a circuit implemented within each amplifier die 110, 120, 130). The first signal path 111 includes the first amplifier die 110, which is configured to receive the first RF signal from the power splitter 140 at input terminal 112, to amplify the first RF signal, and to provide the amplified first RF signal at RF output terminal 114. The amplified first RF signal is conveyed from the RF output terminal 114 to a first combining node 152 on the signal combiner device 150 via a first signal line 116. In some embodiments, at least a portion of the first signal line 116 may be implemented as a wirebond array including a plurality of parallel wires that extend from a bonding pad coupled to RF output terminal 114 to a bonding pad coupled to the first combining node 152. In an embodiment, the RF output terminal 114 of the first amplifier die 110 also may be coupled, via a second signal line 117, to a first shunt direct current (DC) blocking capacitor 156 through terminal 154, where terminal 154 and capacitor 156 also may be implemented on the signal combiner device 150. In some embodiments, the second signal line 117 may be implemented as a wirebond or a wirebond array (e.g., a plurality of parallel wires) extending from the RF output terminal 114 to the terminal 154.

The second and third signal paths 121, 131 are similarly configured to amplify the second and third RF signals, respectively. More specifically, the second signal path 121 includes the second amplifier die 120, which is configured to receive the second RF signal from the power splitter 140 at input terminal 122, to amplify the second RF signal, and to provide the amplified second RF signal at RF output terminal 124. Similarly, the third signal path 131 includes the third amplifier die 130, which is configured to receive the third RF signal from the power splitter 140 at input terminal 132, to amplify the third RF signal, and to provide the amplified third RF signal at RF output terminal 134.

The amplified second and third RF signals are provided to a second combining node (e.g., a conductive node on second amplifier die 120 that is directly connected to the RF output terminal 124, where "directly connected to" means co-located with or electrically connected through a negligibly resistive conductive path), where the amplified second and third RF signals are summed in phase to produce a first combined RF signal. The amplified third RF signal from the RF output terminal 134 may be provided to the second combining node via a third signal line 136. In some embodiments, the third signal line 136 may be implemented as a wirebond array (e.g., a plurality of wires) extending from a bonding pad coupled to the RF output terminal 134 to a bonding pad coupled to the second combining node. The first combined RF signal at the second combining node may be provided to the first combining node 152 via a fourth signal line 126. In some embodiments, at least a portion of the fourth signal line 126 may be implemented as a wirebond array extending from a bonding pad coupled to the RF output terminal 124 to a bonding pad coupled to the first combining node 152.

The first combined RF signal may be combined (e.g., summed) in phase with the amplified first RF signal at the first combining node 152 to produce a second combined RF signal that includes signal energy from the amplified first, second, and third RF signals. The signal paths 111, 121, 131 may include or be coupled to various impedance matching elements and/or phase matching elements (e.g., capacitors 128, 138, 149, 156, 158) and phase shift elements 108, 186 (e.g., 90 degree phase shift elements) so that the second and third amplified RF signals arrive in phase with each other at the second combining node (e.g., at the RF output terminal 124), and so that the first combined RF signal produced at the second combining node arrives in phase with the amplified first RF signal at the first combining node 152.

The first combining node 152 may be situated on or within the signal combiner device 150, which is external to the first, second, and third amplifier dies 110, 120, 130 (i.e., the signal combiner device 150 is implemented with a separate substrate from the first, second, and third amplifier dies 110, 120, 130). The signal combiner device 150 is situated on (i.e., positioned on and/or coupled to) the mounting surface between the first and second amplifier dies 110, 120 (e.g., between the RF output terminals 114, 124). In an embodiment, the signal combiner device 150 may be an integrated passive device (IPD) that may include one or more passive components (e.g., resistor(s), capacitor(s), inductor(s)) formed in or on a semiconductor substrate. The IPD semiconductor substrate may be distinct from the first, second, and third amplifier dies 110, 120, 130. In other embodiments, the substrate for the signal combiner device 150 may be a printed circuit board (PCB) or a low temperature co-fired ceramic (LTCC) structure that includes one or more passive components. As explained in detail herein, the signal combiner device 150 provides a combining node (e.g., the first combining node 152) for combining the amplified RF signals output from the first, second, and third amplifier dies 110, 120, 130. The signal combiner device 150 may have a small footprint to allow the amplifier components 110, 120 to be placed close together while minimizing the electromagnetic coupling between the signal paths of the first and second amplifier dies 110, 120.

As mentioned above, along the first signal path 111, the first amplifier die 110 includes an RF input terminal 112, an RF output terminal 114, and one or more amplification stages coupled between the input and output terminals 112, 114. The RF input terminal 112 is coupled to the first output 144 of the power splitter 140, and thus the RF input terminal 112 receives the first RF signal that was produced by the power splitter 140. Along the second amplifier path 121, the second amplifier die 120 includes an RF input terminal 122, an RF output terminal 124, and one or more amplification stages coupled between the input and output terminals 122, 124. The RF input terminal 122 is coupled to the second output 146 of the power splitter 140, and thus the RF input terminal 122 receives the second RF signal that was produced by the power splitter 140. Along the third signal path 131, the third amplifier die 130 includes an RF input terminal 132, an RF output terminal 134, and one or more amplification stages coupled between the input and output terminals 132, 134. The RF input terminal 132 is coupled to the third output 148 of the power splitter 140, and thus the RF input terminal 132 receives the third RF signal that was produced by the power splitter 140.

Each amplification stage of the first amplifier die 110 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 112, one of the current-carrying terminals (e.g., the drain terminal or the source terminal) is electrically connected to the RF output terminal 114, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that provides relatively low gain amplification, and a second transistor functions as an output amplifier transistor that provides relatively high gain amplification. In such an embodiment, the control terminal of the driver amplifier transistor is electrically connected to the RF input terminal 112, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 114, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the first amplifier die 110. Further, in an embodiment in which the first amplifier die 110 is a two-stage device, an interstage matching network (not illustrated in FIG. 1) also may be monolithically formed as a portion of the first amplifier die 110.

As with the first amplifier die 110, each amplification stage of the second amplifier die 120 includes a power transistor with a control terminal and first and second current-carrying terminals. The power transistor(s) of the second amplifier die 120 may be electrically coupled between the RF input and output terminals 122, 124 in a manner similar to that described above in conjunction with the description of the first amplifier die 110. In some embodiments, the RF output terminal 124 may be coupled to a first shunt capacitor 128 included in the second amplifier die 120. Additional other details discussed in conjunction with the description of the first amplifier die 110 also apply to the second amplifier die 120, and those additional details are not reiterated here for brevity.

As with the first amplifier die 110, each amplification stage of the third amplifier die 130 includes a power transistor with a control terminal and first and second current-carrying terminals. The power transistor(s) of the third amplifier die 130 may be electrically coupled between the RF input and output terminals 132, 134 in a manner similar to that described above in conjunction with the description of the first amplifier die 110. In some embodiments, the RF output terminal 134 may be coupled to a second shunt DC blocking capacitor 138 included in the third amplifier die 130 via a fifth signal line 135. The fifth signal line 135 may be implemented as a wirebond array (e.g., a plurality of wires) extending from the RF output terminal 134 to a node 137 coupled to the second shunt DC blocking capacitor 138. In an embodiment, the node 137 may be a bond pad (e.g., the bond pad 382 in FIG. 3) coupled to a terminal of the second shunt DC blocking capacitor 138. Additional other details discussed in conjunction with the description of the first amplifier die 110 also apply to the third amplifier die 130, and those additional details are not reiterated here for brevity.

As described in detail with reference to FIG. 2, a second shunt capacitor 158 (also referred to herein as a second shunt capacitor $C_O$) included in the signal combiner device 150 functions to present the proper load impedances to each of the first, second, and third amplifier dies 110, 120, 130. In some embodiments, a third shunt capacitor 149 (also referred to herein as a third shunt capacitor $C_Z$) included in the signal combiner device 150 may be employed as part of an impedance transformer network to match the load impedance (e.g., output load $R_O$ 162) to a source impedance (e.g., 50Ω). The third shunt capacitor 149 may improve the bandwidth of the Doherty amplifier 100 when the impedance of the output load 162 is low. For example, the impedance of the output load 162 may be low when the output load includes large-periphery devices, or when the Doherty amplifier 100 is operating at a power level further back off from peak power, such as a back-off level of approximately 9 decibels or greater. The resulting amplified RF output signal generated by the Doherty amplifier 100 is produced at the RF output node 106, to which the output load 162 (e.g., an antenna) is connected via the transmission line 160. In some embodiments, at least a portion of the transmission line 160 may be implemented as a wirebond array including a plurality of wires.

In an embodiment, the first amplifier die 110 may be a carrier amplifier of the Doherty amplifier 100, the third amplifier die 130 may be a first peaking amplifier (also referred to as a peaking 1 amplifier) of the Doherty amplifier 100, and the second amplifier die 120 may be a second peaking amplifier (also referred to as a peaking 2 amplifier) of the Doherty amplifier 100. Accordingly, the Doherty amplifier 100 may be configured so that the first signal path 111 (also referred to as a carrier signal path) provides amplification for relatively low level input signals. As the magnitude of the input signal increases, a first input power level is reached at which the third signal path 131 (also referred to as a first peaking signal path) also becomes active. Finally, as the magnitude of the input signal increases even further, a second input power level is reached at which the second signal path 121 (also referred to as a second peaking signal path) also becomes active. This may be accomplished, for example, by biasing the first amplifier die 110, such that the first amplifier die 110 operates in a class AB mode, and biasing the second and third amplifier dies 120, 130 such that the second and third amplifier dies 120, 130 operate at different class C bias points.

According to an embodiment, the physical components of the first, second, and third signal paths 111, 121, 131 are oriented, with respect to each other, so that portions of the third signal path 131 are substantially orthogonal relative to the corresponding portions of the first and second signal paths 111 and 121. For example, all or a portion of a first signal path through the first amplifier die 110 extends in a first direction (indicated by arrow 111) between the RF input and output terminals 112, 114, and all or a portion of a second signal path through the second amplifier die 120 extends in a second direction (indicated by arrow 121) between the RF input and output terminals 122, 124, and all or a portion of a third signal path through the third amplifier die 130 extends in a third direction (indicated by arrow 131) between the RF input and output terminals 132, 134. In other words, the direction of each of the first, second, and third signal paths 111, 121, 131 is defined to be substantially parallel to a line drawn between the input and output terminals of each amplifier die 110, 120, 130 (or perpendicular to the first and second edges of each amplifier die 110, 120, 130), in an embodiment. The first direction (indicated by arrow 111) and the second direction (indicated by arrow 121) may be oriented toward one another. For example, the first direction (indicated by arrow 111) may have an approximately 180 degree angular offset relative to the second direction (indicated by arrow 121). The third direction (indicated by arrow 131) may have a 90 degree angular offset relative to the first and second directions (indicated by arrows 111, 121). In other embodiments, the third direction may be angularly separated by more or less than 90 degrees relative to the first and second directions.

According to an embodiment, the angular separation between directions of the portions of the first, second, and third signal paths that traverse the first, second, and third amplifier dies 110, 120, and 130 is achieved by orienting the first and second amplifier dies 110, 120 so that the signal path between the RF input and output terminals 112, 114 of the first amplifier die 110 is toward the signal path between the RF input and output terminals 122, 124 of the second amplifier die 120. The third amplifier die 130 is oriented orthogonally to the first and second amplifier dies 110, 120, in an embodiment, so that the direction of the portion of the signal path through the third amplifier die 130 is orthogonal to the direction of the portions of the signal paths through the first and second amplifier dies 110, 120.

During operation, the angular separation of the signal path through the third amplifier die 130 relative to the signal paths through the first and second amplifier dies 110, 120 reduces the amount of electromagnetic coupling between those portions of the signal paths, when compared with a system in which an amplifier die (e.g., the signal path of the amplifier die) is oriented parallel with and in close proximity to other amplifier dies. Given this reduction in electromagnetic coupling between the signal paths, the second and third amplifier dies 120, 130 may be positioned closer together than they could be with conventional parallel orientations, while still achieving acceptable performance. Moreover, the head-to-head configuration of the first and second amplifier dies 110, 120 as achieved with use of the signal combiner device 150 enables the first and second amplifier dies 110, 120 to be placed closer together than they could be with conventional designs, while still achieving acceptable performance. Accordingly, implementation of the various embodiments may enable high-performance Doherty amplifiers to be implemented in relatively small packages or modules, when compared with the sizes of packages or systems used to house conventionally-arranged Doherty amplifiers.

The operation and design of the Doherty amplifier 100 will now be described with reference to the circuit 200 shown in FIG. 2. The circuit 200 is a schematic diagram representing the Doherty amplifier 100 in FIG. 1. With reference to FIG. 2, the circuit 200 includes a power splitter 240, a first power transistor 210, a second power transistor 220, a third power transistor 230, and a load 262. In the embodiment of FIG. 2, the first power transistor 210 may be an output power transistor in the first amplifier die 110 in FIG. 1, the second power transistor 220 may be an output power transistor in the second amplifier die 120 in FIG. 1, and the third power transistor 230 may be an output power transistor in the third amplifier die 130 in FIG. 1. In FIG. 2, the internal drain-source capacitance (also referred to as a parasitic capacitance or junction capacitance) of the first power transistor 210 is indicated as the capacitance $C_{ds\_1}$ 292, the internal drain-source capacitance of the second power transistor 220 is indicated as the capacitance $C_{ds\_2}$ 294, and the internal drain-source capacitance of the third power transistor 230 is indicated as the capacitance $C_{ds\_3}$ 296. Therefore, it should be understood that the capacitances $C_{ds\_1}$ 292, $C_{ds\_2}$ 294, $C_{ds\_3}$ 296 shown in FIG. 2 do not represent physical components.

Figure 2:
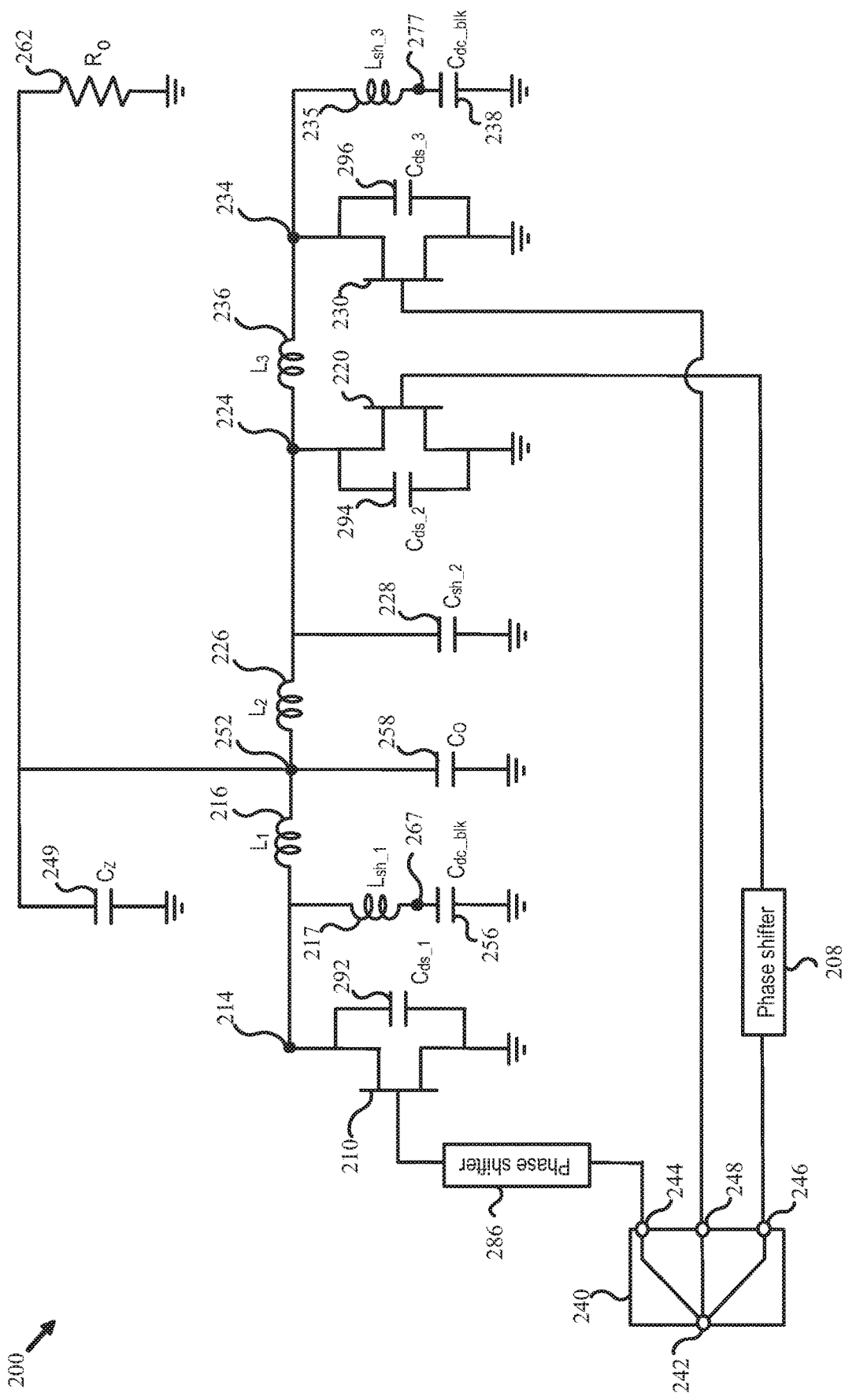
FIG. 2 depicts a schematic diagram representing a three-way Doherty amplifier in accordance with various embodiments of the disclosure.

As shown in FIG. 2, the output of the first power transistor 210 (e.g., the RF output terminal 114 of the first amplifier die 110) is coupled to the first combining node 252 (e.g., the first combining node 152) via the inductor $L_1$ 216 (e.g., the inductance of the first signal line 116). In an embodiment, the output of the first power transistor 210 is the drain terminal of the first power transistor 210 coupled to the first node 214. The output of the first power transistor 210 (e.g., the RF output terminal 114 of the first amplifier die 110) is further coupled to a first shunt DC blocking capacitor $C_{dc\_blk}$ 256 (e.g., first shunt DC blocking capacitor 156) via the inductor $L_{sh\_1}$ 217 (e.g., the inductance of the second signal line 117). In some embodiments, the inductor $L_{sh\_1}$ 217 and the first shunt DC blocking capacitor $C_{dc\_blk}$ 256 may be referred to as a first shunt inductive network.

As further shown in FIG. 2, the output of the second power transistor 220 (e.g., the RF output terminal 124 of the second amplifier die 120) is coupled to the first combining node 252 (e.g., the first combining node 152) via the inductor $L_2$ 226 (e.g., the inductance of the fourth signal line 126). In an embodiment, the output of the second power transistor 220 is the drain terminal of the second power transistor 220 coupled to a second combining node 224. The output of the second power transistor 220 (e.g., the RF output terminal 124 of the second amplifier die 120) is further coupled to the first shunt capacitor $C_{sh\_2}$ 228 (e.g., the first shunt capacitor 128).

As further shown in FIG. 2, the output of the third power transistor 230 (e.g., the RF output terminal 134 of the third amplifier die 130) is coupled to the first combining node 252 (e.g., the first combining node 152) via the inductor $L_3$ 236 (e.g., the inductance of the third signal line 136) and the inductor $L_2$ 226 (e.g., the inductance of the fourth signal line 126). In an embodiment, the output of the third power transistor 230 is the drain terminal of the third power transistor 230 coupled to the second node 234. The output of the third power transistor 230 (e.g., the RF output terminal 134 of the third amplifier die 130) is further coupled to a second shunt DC blocking capacitor $C_{dc\_blk}$ 238 (e.g., second shunt DC blocking capacitor 138) via the inductor $L_{sh\_3}$ 235 (e.g., the inductance of the fifth signal line 135). In some embodiments, the inductor $L_{sh\_3}$ 235 and the second shunt DC blocking capacitor $C_{dc\_blk}$ 238 may be referred to as a second shunt inductive network.

As further shown in FIG. 2, a second shunt capacitor $C_O$ 258 (e.g., the second shunt capacitor 158) is coupled to the first combining node 252. In some embodiments, a third shunt capacitor $C_Z$ 249 (e.g., third shunt capacitor $C_Z$ 149 in FIG. 1) may be employed as part of an impedance transformer network. For example, the third shunt capacitor $C_Z$ 249 may be configured to perform an impedance transformation to match an impedance of a load (e.g., output load $R_O$ 162) to a source impedance (e.g., 50Ω).

The power splitter 240 (e.g., power splitter 140) has an input 242 (e.g., input 142 in FIG. 1) and three output terminals 244, 246, 248 (e.g., outputs 144, 146, 148 in FIG. 1). The power splitter input 242 may receive an input RF signal and may divide the RF input signal into first, second, and third RF signals. The power splitter 240 may provide the first RF signal from the output terminal 244 to the gate of the first power transistor 210. The first power transistor 210 may provide an amplified first RF signal to the first combining node 252. The power splitter 240 may provide the second RF signal from the output terminal 246 to the gate of the second power transistor 220. The second power transistor 220 may provide an amplified second RF signal to the second combining node 224. The power splitter 240 may provide the third RF signal from the output terminal 248 to the gate of the third power transistor 230. The third power transistor 230 may provide an amplified third RF signal to the second combining node 224. The amplified second and third RF signals may be summed in phase at the second combining node 224 to produce a combined RF signal. The combined RF signal produced at the second combining node 224 may arrive in phase with the amplified first RF signal at the first combining node 252. The amplified first RF signal may be combined with the combined RF signal at the first combining node 252 to produce an amplified RF output signal. The amplified RF output signal may be provided to the load $R_O$ 262 (e.g., load 162 in FIG. 1). In some embodiments, each of the phase shift elements 208, 286 (e.g., phase shift elements 108, 186 in FIG. 1) may impart an approximately 90 degree phase shift to the RF signal provided at output terminals 244, 246.

In FIG. 2, the capacitance $C_{ds\_1}$ 292, inductor $L_1$ 216, and the second shunt capacitor $C_O$ 258 form a first CLC network (also referred to as a first capacitor-inductor-capacitor network or a first Pi network). The first CLC network may serve as the output network for the first power transistor 210. In an embodiment, the first CLC network may perform both a phase delay (e.g., an approximately 90 degree phase delay) and impedance transformation for the first power transistor 210. Therefore, since a CLC network (e.g., the first CLC network) can replicate the phase delay and impedance transformation functions of a transmission line that is one quarter of a wavelength long (e.g., λ/4), a CLC network may also be referred to as a "quasi-transmission line" or a "CLC quasi-transmission line."

In some scenarios, the capacitance $C_{ds\_1}$ 292 may not be suitable for the first CLC network to achieve the proper phase delay and/or impedance matching for some high frequency RF signals (e.g., RF signals with frequencies above 2.2 gigahertz (GHz)). In these scenarios, the inductance of the inductor $L_{sh\_1}$ 217 (e.g., the inductance of the second signal line 117) may be configured to resonate out (e.g., reduce) at least some of the capacitance $C_{ds\_1}$ 292, thereby allowing the first CLC network to be tuned to perform the proper phase delay and/or impedance matching for some high frequency RF signal energy.

In an embodiment, the capacitance $C_{ds\_2}$ 294, inductor $L_2$ 226, and the second shunt capacitor $C_O$ 258 form a second CLC network (also referred to as a second capacitor-inductor-capacitor network, second Pi network, or second quasi-transmission line). The second CLC network may serve as the output network for the second power transistor 220. In an embodiment, the second CLC network may perform both a phase delay (e.g., an approximately 90 degree phase delay) and impedance transformation for the second power transistor 220. In FIG. 2, the first shunt capacitor $C_{sh\_2}$228 allows for proper tuning of the second CLC network in scenarios where the capacitance $C_{ds\_2}$ 294 is insufficient (e.g., the capacitance $C_{ds\_2}$ 294 is below a desired value). In an embodiment, a shunt inductor may be connected between the first shunt capacitor $C_{sh\_2}$228 and the second combining node 224, similar to the arrangement of the inductor $L_{sh\_1}$ 217 and the first shunt DC blocking capacitor $C_{dc\_blk}$ 256.

It should be noted that the second shunt capacitor $C_O$ 258 is included in both the first and second CLC networks (e.g., the first and second quasi-transmission lines) described herein. In an embodiment, the first and second CLC networks may both employ the second shunt capacitor $C_O$ 258 simultaneously when performing their respective phase delay and/or impedance transformation functions.

In an embodiment, the capacitance $C_{ds\_3}$ 296, inductor $L_3$ 236, and the capacitance $C_{ds\_2}$ 294 form a third CLC network (also referred to as a third capacitor-inductor-capacitor network, third Pi network, or third quasi-transmission line). The third CLC network may serve as the output network for the third power transistor 230. In an embodiment, the third CLC network may perform both a phase delay (e.g., an approximately 90 degree phase delay) and impedance transformation for the third power transistor 230. In some scenarios, the capacitance $C_{ds\_3}$ 296 may not be suitable for the third CLC network to achieve the proper phase delay and/or impedance matching for some high frequency RF signals (e.g., RF signals with frequencies above 2.2 GHz). For example, due to the higher device peripheries of peaking amplifier dies, peaking amplifier dies may have higher drain-source capacitances relative to carrier amplifier dies. Accordingly, at least some of the excess drain-source capacitance of the peaking amplifier dies may need to be resonated out (e.g., reduced). For example, if the capacitance $C_{ds\_3}$ 296 may not be suitable for the third CLC network to achieve the proper phase delay and/or impedance matching, the inductance of the inductor $L_{sh\_3}$ 235 (e.g., the inductance of the transmission line 135) may be configured to resonate out (e.g., reduce) at least some of the capacitance $C_{ds\_3}$ 296. This may allow the third CLC network to be tuned to perform the proper phase delay and/or impedance matching for some high frequency RF signal energy.

In an embodiment, the first shunt DC blocking capacitor $C_{dc\_blk}$ 256 may be used to further adjust the phase delay and impedance transformation of the first CLC network, and the second shunt DC blocking capacitor $C_{dc\_blk}$ 238 may be used to further adjust the phase delay and impedance transformation of the third CLC network. For example, the capacitance of the first shunt DC blocking capacitor $C_{dc\_blk}$ 256 and the inductance of the inductor $L_{sh\_1}$ 217 may be configured to further adjust the phase delay and impedance transformation of the first CLC network. As another example, the capacitance of the second shunt DC blocking capacitor $C_{dc\_blk}$ 238 and the inductance of the inductor $L_{sh\_3}$ 235 may be configured to further adjust the phase delay and impedance transformation of the third CLC network. In an embodiment, the first shunt DC blocking capacitor $C_{dc\_blk}$ 256 and/or the second shunt DC blocking capacitor $C_{dc\_blk}$ 238 may provide an RF cold point (i.e., a node that functions as a virtual ground reference voltage for RF signals). For example, the node 267 between the inductor $L_{sh\_1}$ 217 and the first shunt DC blocking capacitor $C_{dc\_blk}$ 256, and the node 277 between the inductor $L_{sh\_3}$ 235 and the second shunt DC blocking capacitor $C_{dc\_blk}$ 238 may serve as RF cold points. In an embodiment, one or more RF cold points (e.g., at nodes 267, 277) may be used for baseband termination to improve video bandwidth. More specifically, a baseband termination circuit (e.g., comprising a series coupled inductor, capacitor, and resistor, not illustrated) may be coupled between each RF cold point node 267, 277 and ground.

As described with reference to FIGS. 3-8, the inductors shown in FIG. 2 (e.g., inductor $L_1$ 216, inductor $L_2$ 226, inductor $L_3$ 236, inductor $L_{sh\_1}$ 217, and inductor $L_{sh\_3}$ 235) may be implemented using wirebonds (also referred to as bond wires or wirebond arrays). In an embodiment, the use of one or more wirebonds to obtain a desired inductance value may enhance the tuning and optimization flexibility of the Doherty amplifier circuits (e.g., Doherty amplifier circuit 100) described herein. In an embodiment, the inductance value of a wirebond can be controlled by selecting an appropriate height of the loop of the wirebond and/or the relative position of the wirebond on a bond pad of a device (e.g., first, second, third amplifier dies 110, 120, 130 and/or signal combiner device 150). In an embodiment, the wirebonds may achieve the lowest required inductance value for tuning a corresponding CLC network (e.g., the previously described first, second, third CLC networks) and may have low power loss characteristics. These benefits may be significant for applications involving high frequency RF input signals (e.g., RF input signals having center frequencies of approximately 5.0 GHz or greater).

As described herein, a CLC network (also referred to as a "CLC quasi-transmission line") may be formed from a capacitance C that includes at least a portion of an internal drain-source capacitance of a power transistor in an amplifier die and/or a capacitance of an external device (e.g., a high-Q metal-insulator-metal (MIM) capacitor). For example, the capacitance C for a CLC quasi-transmission line may be determined using equation 1:

$$C = \frac{1}{2\pi f Z} \qquad \text{(equation 1)}$$

where f is the application frequency (e.g., the frequency of the input signal to be amplified by the Doherty amplifier 100, 900 described herein) and Z is the impedance of the CLC quasi-transmission line.

Figure 3:
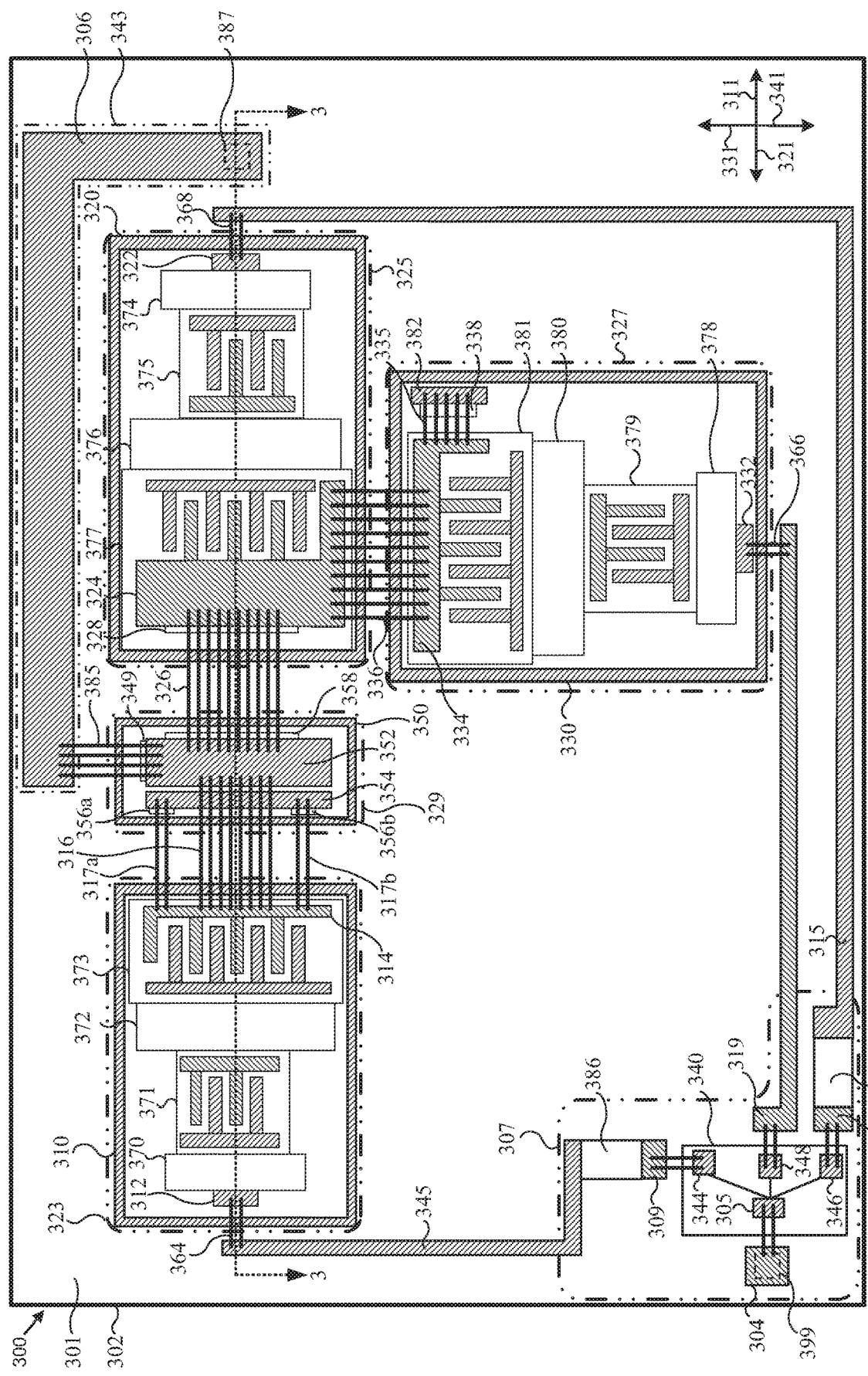
FIG. 3 depicts a top view of a three-way Doherty amplifier module in accordance with various embodiments of the disclosure.
Figure 11:
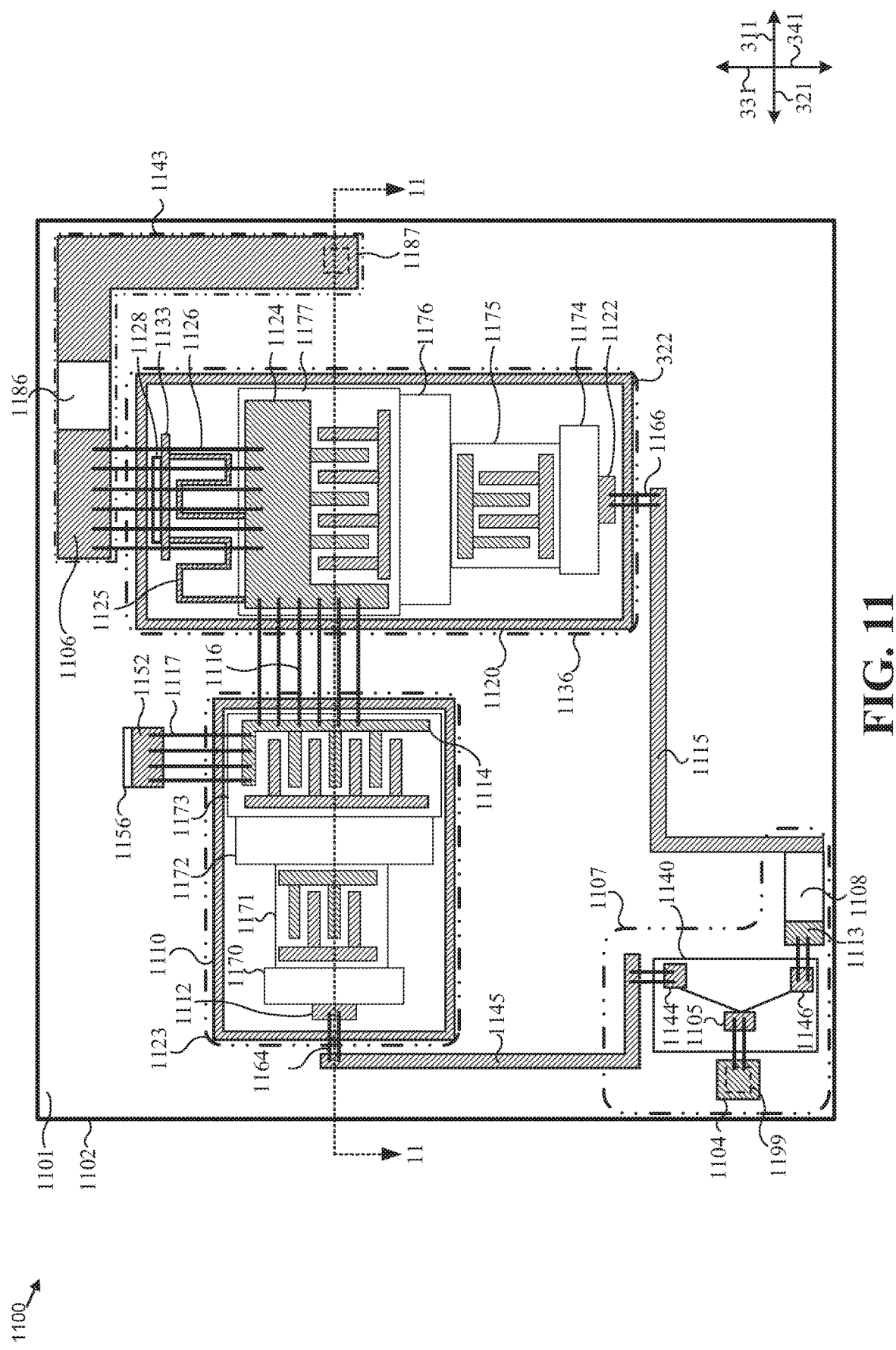
FIG. 11 depicts a top view of a two-way Doherty amplifier module in accordance with various embodiments of the disclosure.

In some embodiments, the CLC quasi-transmission line may be further formed from an inductance L that includes the inductance of one or more wirebonds (e.g., wirebonds 336, 1126 used for coupling one amplifier die to another as shown in FIGS. 3, 11). For example, the inductance L for the CLC quasi-transmission line may be determined using equation 2:

$$L = \frac{Z}{2\pi f} \qquad \text{(equation 2)}$$

where f is the application frequency and Z is the impedance of the CLC quasi-transmission line.

With reference to equation 2, as the frequency f increases into a high-frequency range (e.g., the frequency f is approximately 5.0 GHz or greater), the inductance L of the CLC quasi-transmission line decreases significantly and may become difficult to physically realize in a Doherty amplifier module. Moreover, increasing the output power may decrease the impedance Z, thereby further decreasing the inductance L and making it even more difficult to physically realize the inductance L of the CLC quasi-transmission line.

With reference to equation 1 described above, the capacitance C of the CLC quasi-transmission line decreases as the frequency f increases. Accordingly, if the capacitance C includes an internal drain-source capacitance of a power transistor as previously described, this internal drain-source capacitance of the power transistor may be significantly reduced as the frequency f increases. Therefore, if the internal drain-source capacitance of the power transistor needs to be resonated out (e.g., reduced) to achieve a desired capacitance C for the CLC quasi-transmission line (e.g., when tuning the CLC quasi-transmission line for phase delay and/or impedance transformation functions), then a significantly lower shunt inductance may be needed. For example, if the frequency f increases into a high-frequency range (e.g., the frequency f is approximately 5.0 GHz or greater), the required CLC quasi-transmission line and shunt inductances may likely drop below approximately 300 picohenries (pH).

The output bond pad on an amplifier die of a Doherty amplifier may include a number of wirebond connections at different portions of the output bond pad. For example, a first set of wirebonds may be connected to a first portion (e.g., a side pad portion) of the output bond pad and a second set of wirebonds may be connected to a second portion (e.g., a main pad portion) of the output bond pad. Therefore, the output bond pad may electrically couple the first set of wirebonds to the second set of wirebonds. Accordingly, a current (e.g., also herein referred to as a lateral current) may flow from the first set of wirebonds to the second set of wirebonds through the output bond pad. Such lateral currents traveling through the output bond pad may introduce additional inductance. For example, the additional inductance from the lateral currents may reach approximately 250 pH. Therefore, when the output bond pad of one amplifier die (e.g., a first peaking amplifier die) is coupled via a wirebond array to the output bond pad of another amplifier die (e.g., a second peaking amplifier die), the total inductance of the wirebond array itself and the additional inductance from the output bond pad may make it difficult to achieve the low inductances (e.g., below 300 picohenries (pH)) needed for the CLC quasi-transmission lines at high frequencies.

Figure 4:
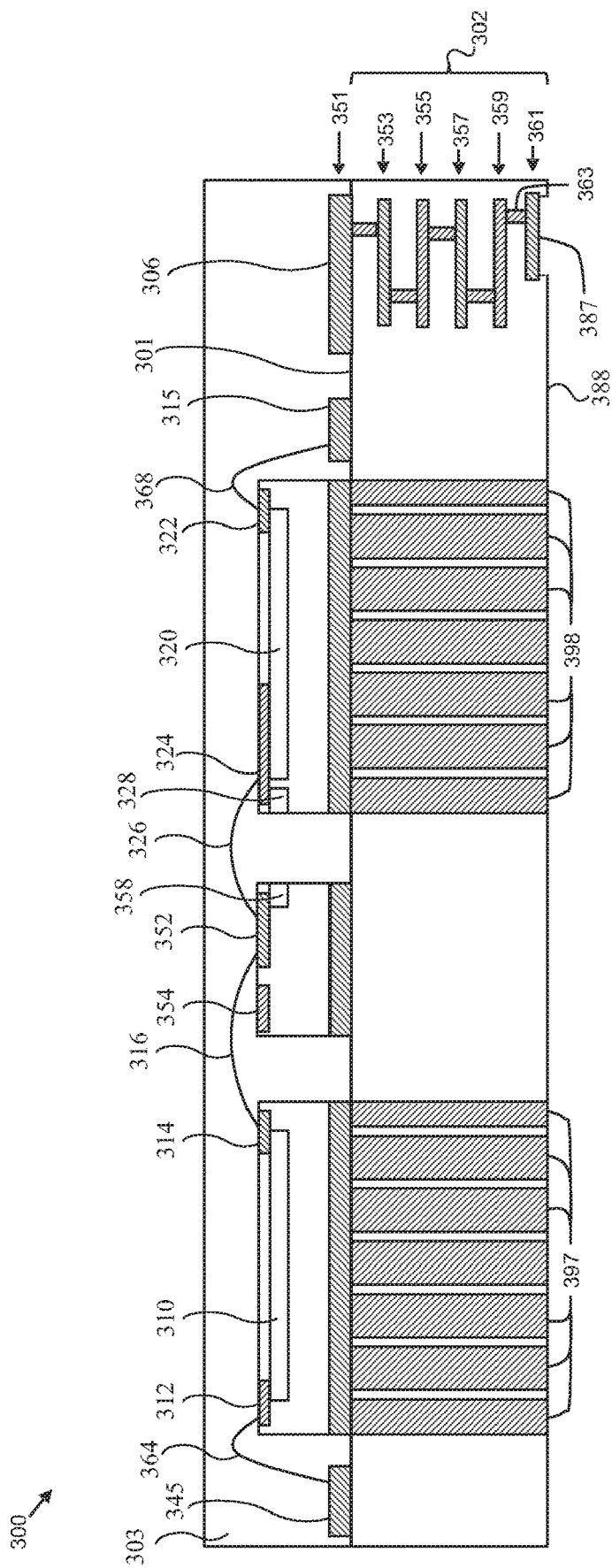
FIG. 4 depicts a cross-sectional, side view of the module of FIG. 3 along line 3-3.

An embodiment of a physical implementation of the three-way Doherty amplifier described with reference to FIGS. 1 and 2 will now be described in detail in conjunction with FIGS. 3 and 4. More specifically, FIG. 3 is a top view of a three-way Doherty amplifier module 300, in accordance with an example embodiment. FIG. 3 should be viewed simultaneously with FIG. 4, which is a cross-sectional, side view of the Doherty amplifier module 300 of FIG. 3 along line 3-3. Doherty amplifier module 300 includes a substrate 302, a power splitter 340 (e.g., power splitter 140 in FIG. 1), a first amplifier die 310 (e.g., first amplifier die 110, FIG. 1), a second amplifier die 320 (e.g., second amplifier die 120, FIG. 1), a third amplifier die 330 (e.g., third amplifier die 130, FIG. 1), a signal combiner device 350 (e.g., signal combiner device 150 in FIG. 1), and various phase shift elements 308, 386 (e.g., phase shift elements 108, 186 in FIG. 1)

According to an embodiment, the Doherty amplifier module 300 is implemented as a land grid array (LGA) module. Accordingly, the substrate 302 has a component mounting surface 301 and a land surface 388. According to an embodiment, the substrate 302 is relatively small, which provides for a particularly compact Doherty amplifier. For example, the component mounting surface 301 may have a width (horizontal dimension in FIG. 3) and a length (vertical dimension in FIG. 3) in a range of about 5 millimeters (mm) to about 20 mm, although the width and/or length may be smaller or larger, as well. In a particular embodiment, for example, the component mounting surface may have a width of about 10 mm and a length of about 8 mm.

For example, the substrate 302 may be a multi-layer organic substrate with a plurality of metal layers 351, 353, 355, 357, 359, 361 which are separated by dielectric material. According to an embodiment, a bottom metal layer 361 is utilized to provide externally-accessible, conductive landing pads 387, 399 of the LGA, where the locations of landing pads 387, 399 are indicated with dashed boxes in FIG. 3. These landing pads 387, 399 (among others, not illustrated) enable surface mounting of the Doherty amplifier module 300 onto a separate substrate (not illustrated) that provides electrical connectivity to other portions of an RF system. Although the Doherty amplifier module 300 is depicted as an LGA module, the Doherty amplifier module 300 alternatively may be packaged as a pin grid array module, a quad flat no leads (QFN) module, or another type of package.

One or more other metal layers (e.g., layers 357, 359) of the substrate 302 may be used to convey DC voltages (e.g., DC bias voltages) and to provide a ground reference. Finally, still other layers (e.g., layers 353, 355) may be used to convey RF and other signals through the module 300. Additionally, a patterned metal layer 351 may be formed on the mounting surface 301 of the substrate 302. As will be discussed in more detail below, the patterned metal layer 351 may include a plurality of conductive contacts 304, 306, 309, 313, 315, 319, 345 on the mounting surface 301, which facilitate electrical connections to dies and other components that may be mounted to the mounting surface 301.

Conductive vias (e.g., via 363) provide for electrical connectivity between the metal layers 351-361.

Each of the amplifier dies 310, 320, 330 may produce significant amounts of heat during operation. In addition, each of the amplifier dies 310, 320, 330 also need access to a ground reference. Accordingly, in an embodiment, substrate 302 also includes a plurality of electrically and thermally conductive trenches (e.g., trenches 397, 398) to which the amplifier dies 310, 320, 330 are coupled (e.g., with solder, brazing material, silver sinter, or other die attach materials). The trenches (e.g., trenches 397, 398) extend through the substrate thickness in first-die, second-die, and third-die mounting zones 323, 325, 327 to provide heat sinks and ground reference access to the first, second, and third amplifier dies 310, 320, 330. For example, the conductive trenches 397, 398 may be filled with copper or another thermally and electrically conductive material. In alternate embodiments, the trenches 397, 398 may be replaced with conductive slugs (e.g., copper slugs) or with thermal vias.

Referring to the top view of module 300 in FIG. 3, a plurality of non-overlapping zones are defined at the mounting surface 301 of the substrate 302. More specifically, the non-overlapping zones include an input signal zone 307, a first-die mounting zone 323, a second-die mounting zone 325, a third-die mounting zone 327, an output signal combiner zone 329, and an output network zone 343. Within the input signal zone 307, a conductive landing pad 304 exposed at the mounting surface 301 is electrically coupled through the substrate 302 to a conductive contact 399 at the land surface 388. The landing pad 304 and contact 399, along with the electrical connections between them, function as the RF input node (e.g., RF input node 104, FIG. 1) for the module 300.

The power splitter 340 (e.g., power splitter 140 in FIG. 1) is coupled to the mounting surface 301 in the input signal zone 307. According to an embodiment, the power splitter 340 may include one or more discrete die and/or components, although it is represented in FIG. 3 as a single element. The power splitter 340 includes an input terminal 305 (e.g., input 142, FIG. 1) and three output terminals 344, 346, 348 (e.g., outputs 144, 146, 148 in FIG. 1). The input terminal 305 is electrically coupled (e.g., through wirebonds as shown in FIG. 3, or through transmission lines in other implementations) to conductive contact 399 to receive an input RF signal. In addition, the output terminals 344, 346, 348 are electrically coupled (e.g., through additional wirebonds, as shown) to conductive contacts 309, 313, 319 at the mounting surface 301. The power splitter 340 is configured to split the power of the input RF signal received through input terminal 305 into first, second, and third RF signals, which are produced at the output terminals 344, 346, 348. In some embodiments, the power splitter 340 may consist of fixed-value, passive components, or the power splitter 340 may include variable phase shifters and/or attenuators.

The first, second and third RF signals may have equal or unequal power, as discussed previously. The first RF signal produced at output terminal 344 and conveyed to conductive contact 309 is amplified through a first signal path, which includes a phase shift element 386 (e.g., phase shift element 186 in FIG. 1) mounted within the input signal zone 307, a first amplifier die 310 (e.g., die 110, FIG. 1) mounted within the first-die mounting zone 323, and the signal combiner device 350 (e.g., signal combiner device 150 in FIG. 1) mounted within the output signal combiner zone 329.

The illustrated embodiment of first amplifier die 310 embodies a two-stage amplifier, which includes an RF input terminal 312 (e.g., the RF input terminal 112 in FIG. 1), an input matching network 370, a driver transistor 371, an interstage matching network 372, an output transistor 373, and an RF output terminal 314 (e.g., the RF output terminal 114 in FIG. 1). The driver and output transistors 371, 373 are coupled in series, where the driver transistor 371 applies a relatively low gain to the first RF signal, and the output transistor 373 applies a relatively high gain to the first RF signal after preliminary amplification by the driver transistor 371. In other embodiments, the first amplifier die 310 may embody a single stage amplifier, or may include more than two amplification stages. The signal path through the first amplifier die 310 is in a direction extending from the RF input terminal 312 to the RF output terminal 314, which direction is indicated by arrow 311.

The amplified first RF signal is produced by the first amplifier die 310 at the RF output terminal 314. According to an embodiment, the RF output terminal 314 is electrically coupled to a first bond pad 352 on the signal combiner device 350 with a first wirebond array 316 (e.g., a plurality of parallel, closely spaced wirebonds) and further electrically coupled to a second bond pad 354 on the signal combiner device 350 with second wirebond arrays 317a, 317b. As illustrated in FIG. 3, the wirebonds of the wirebond arrays 316, 317a, 317b are aligned in the same direction as the signal path through the first amplifier die 310 (i.e., in the direction indicated by arrow 311).

Through the first wirebond array 316 and the first bond pad 352, the RF output terminal 314 is electrically coupled to the shunt capacitor 358 (e.g., second shunt capacitor 158) and the shunt capacitor 349 (e.g., third shunt capacitor 149) located in the signal combiner device 350. Through the second wirebond arrays 317a, 317b and the second bond pad 354, the RF output terminal 314 is electrically coupled to the DC blocking capacitors 356a, 356b (e.g., first shunt DC blocking capacitor 156) located in the signal combiner device 350.

Referring back to the power splitter 340 in the input signal zone 307, the second RF signal produced at output terminal 346 of the power splitter 340 and conveyed to conductive contact 313 is amplified through a second amplifier path, which includes a second phase shift element 308 (e.g., phase shift element 108 in FIG. 1), a second amplifier die 320 (e.g., second amplifier die 120, FIG. 1) mounted within the second-die mounting zone 325, and the signal combiner device 350 (e.g., signal combiner device 150 in FIG. 1) mounted within the output signal combiner zone 329.

The illustrated embodiment of the second amplifier die 320 also embodies a two-stage amplifier, which includes an RF input terminal 322 (e.g., the RF input terminal 122 in FIG. 1), an input matching network 374, a driver transistor 375, an interstage matching network 376, an output transistor 377, a first shunt capacitor 328 (e.g., first shunt capacitor 128 in FIG. 1, first shunt capacitor $C_{sh\_2}$228 in FIG. 2), and an RF output terminal 324 (e.g., the RF output terminal 124 in FIG. 1). The signal path through the second amplifier die 320 is in a direction extending from the RF input terminal 322 to the RF output terminal 324, which direction is indicated by arrow 321. As can be seen in FIG. 3, the signal paths through the first and second amplifier dies 310, 320 are directed toward one another (e.g., offset by 180 degrees).

Referring again to the power splitter 340 in the input signal zone 307, the third RF signal produced at output terminal 348 of the power splitter 340 and conveyed to conductive contact 319 is amplified through a third amplifier path, which includes a third amplifier die 330 (e.g., third amplifier die 130, FIG. 1) mounted within the third-die mounting zone 327, the RF output terminal 324 of the second amplifier die 320, and the signal combiner device 350 (e.g., signal combiner device 150 in FIG. 1) mounted within the output signal combiner zone 329.

The illustrated embodiment of the third amplifier die 330 also embodies a two-stage amplifier, which includes an RF input terminal 332 (e.g., the RF input terminal 132 in FIG. 1), an input matching network 378, a driver transistor 379, an interstage matching network 380, an output transistor 381, and an RF output terminal 334 (e.g., the RF output terminal 134 in FIG. 1). The signal path through the third amplifier die 330 is in a direction extending from the RF input terminal 332 to the RF output terminal 334, which direction is indicated by arrow 331. As can be seen in FIG. 3, the signal path through the third amplifier die 330 is orthogonal (e.g., offset by approximately 90 degrees) relative to the signal paths through the first and second amplifier dies 310, 320.

In some embodiments, the first, second, and third amplifier dies 310, 320, 330 are identical in size, rendering the Doherty amplifier module 300 a symmetric Doherty amplifier. In an alternate embodiment, at least one of the first, second, and third amplifier dies 310, 320, 330 may have a different size relative to the other amplifier dies, rendering the Doherty amplifier module 300 an asymmetric Doherty amplifier. For example, the second amplifier die 320 may be larger than the first amplifier die 310 and/or the third amplifier die 330 by a ratio (e.g., 1.6:1, 2:1, or some other ratio).

In an embodiment, each amplifier die 310, 320, 330 is rectangular in shape with parallel first and second sides, and parallel third and fourth sides extending between the first and second sides. In each amplifier die 310, 320, 330, the RF input terminal 312, 322, 332 is proximate to the first side of the die, and the RF output terminal 314, 324, 334 is proximate to the second side of the die. In an embodiment, and as shown in FIG. 3, the second sides of the first and second amplifier dies 310, 320 are oriented toward one another (e.g., oriented head-to-head), while the second side of the amplifier die 330 is orthogonally arranged with respect to the second sides of the first and second amplifier dies 310, 320. Said another way, the third amplifier die 330 is coupled to the mounting surface 301 of the substrate 302 so that the third amplifier die 330 is orthogonal with respect to the first and second amplifier dies 310, 320, rendering the RF signal path through the third amplifier die 330 orthogonal to RF signal paths through the first and second amplifier dies 310, 320.

The orthogonal orientation of the third amplifier die 330 relative to the first and second amplifier dies 310, 320 may significantly reduce electromagnetic coupling between the signal path of the third amplifier die 330 and the signal paths of the first and second amplifier dies 310, 320. Given this reduction in electromagnetic coupling between the signal paths, the second and third amplifier dies 320, 330 may be positioned closer together than they could be with conventional parallel orientations, while still achieving acceptable performance. Moreover, the head-to-head configuration of the first and second amplifier dies 310, 320 as achieved with use of the signal combiner device 350 enables the first and second amplifier dies 310, 320 to be placed closer together than they could be with conventional orientations, while still achieving acceptable performance.

The amplified second RF signal is produced by the second amplifier die 320 at the RF output terminal 324 (e.g., the RF output terminal 124 of the second amplifier die 120). According to an embodiment, the RF output terminal 324 is electrically coupled to the first bond pad 352 with a third wirebond array 326 (e.g., a plurality of parallel, closely spaced wirebonds) and is further coupled to the first shunt capacitor 328 (e.g., first shunt capacitor 128).

As illustrated in FIG. 3, the wirebonds of the wirebond array 326, are aligned in the same direction as the signal path through the second amplifier die 320 (i.e., in the direction indicated by arrow 321). Through the third wirebond array 326 and the first bond pad 352, the RF output terminal 324 is electrically coupled to the second shunt capacitor 358 (e.g., second shunt capacitor 158) and the shunt capacitor 349 (e.g., third shunt capacitor 149) located in the signal combiner device 350.

The amplified third RF signal is produced by the third amplifier die 330 at the RF output terminal 334. According to an embodiment, the RF output terminal 334 is electrically coupled to the RF output terminal 324 of the second amplifier die 320 with a fourth wirebond array 336 (e.g., the third signal line 136 in FIG. 1) and further coupled to a bond pad 382 with a fifth wirebond array 335 (e.g., the fifth signal line 135 in FIG. 1). As illustrated in FIG. 3, the wirebonds of the fourth wirebond array 336 are aligned in the same direction as the RF signal path through the third amplifier die 330 (e.g., in the direction indicated by arrow 331). In other words, the fourth wirebond array 336 is orthogonally arranged with respect to the first, second and third wirebond arrays 316, 317a, 317b, 326. Accordingly, even though the third and fourth wirebond arrays 326, 336 are positioned relatively close together, their orthogonal orientations may significantly reduce electromagnetic coupling of RF signals carried through the third and fourth wirebond arrays 326, 336. The amplified third RF signal produced by the third amplifier die 330 and the amplified second RF signal produced by the second amplifier die 320 may combine at the RF output terminal 324 of the second amplifier die 320 (e.g., the second combining node 224). The bond pad 382 may be coupled to one or more shunt DC blocking capacitors 338 (e.g., second shunt DC blocking capacitor 138 in FIG. 1).

In an embodiment, during operation of the module 300, the first combining node (e.g., co-located with or directly electrically coupled to the first bond pad 352) may combine (e.g., sum) the amplified first RF signal with the second and/or third amplified RF signals to produce an amplified RF output signal. In an embodiment, the first combining node (e.g., the first bond pad 352) may combine the amplified first RF signal with a combined signal, where the combined signal is a combination of the second and third amplified RF signals, as described below.

The signal combiner device 350 may reduce the electromagnetic coupling between the signal path through the first amplifier die 310 (e.g., direction 311) and the signal path through the second amplifier die 320 (e.g., direction 321) as compared to conventional implementations. For example, the amplified first RF signal may flow out of the first amplifier die 310 and onto the first bond pad 352 through the wirebonds 316. The amplified first RF signal may then flow on the first bond pad 352 in the direction 331 toward the wirebonds 385. The amplified second RF signal and/or the amplified third RF signal may flow out of the RF output terminal 324 and onto the first bond pad 352 through the wirebonds 326. The amplified second RF signal and/or the amplified third RF signal may then flow on the first bond pad 352 in the direction 331 toward the wirebonds 385. The width 892 of the first bond pad 352 may be sufficient to significantly reduce the electromagnetic coupling between the amplified first RF signal flowing out of the first amplifier die 310 and the amplified second and/or amplified third RF signal flowing out of the RF output terminal 324.

In some implementations of the signal combiner device 350, the return path electrode (e.g., a ground plane) in the signal combiner device 350 may be closer to a top metal signal layer (e.g., the first bond pad 352) as compared to the proximity between the return path electrode (e.g., a ground plane) in the substrate 302 and a combining node (e.g., a conductive contact) on the mounting surface 301 of the substrate 302. Therefore, because the return path electrode in the signal combiner device 350 may be closer to the top metal signal layer in the signal combiner device 350, the signal combiner device 350 may reduce interference between proximate signal paths. Accordingly, the signal combiner device 350 may provide further reduction of electromagnetic coupling between the amplified first RF signal and the amplified second and/or amplified third RF signal.

Although not illustrated in FIG. 3, module 300 also includes bias circuitry configured to provide gate and drain bias voltages to some or all of the driver and output transistors 371, 373, 375, 377, 379, 381. For example, the bias circuitry may include, among other things, a plurality of landing pads (at the land surface 388 of the substrate 302), contacts (at the mounting surface 301 of the substrate 302), and other conductive structures and circuitry. Bias voltages provided to the gates and/or drains of the transistors 371, 373, 375, 377, 379, 381 facilitate Doherty operation of the module 300. For example, the transistors 371, 373 of the first amplifier die 310 may be biased to operate in class AB mode, and the transistors 375, 377, 379, 381 of the second and third amplifier dies 320, 330 may be biased to operate in class C mode.

According to an embodiment, all of the components mounted to the mounting surface 301 of the substrate 302 may be encapsulated with non-conductive encapsulation material 303 (FIG. 3). In an alternate embodiment, the components could be contained within an air cavity, which is defined by various structures (not illustrated) overlying the mounting surface 301.

The first, second, and third amplifier dies 310, 320, 330 may be implemented using various types of semiconductor substrates, such as silicon, silicon-on-insulator (SOI), silicon-on-sapphire (SOS), gallium arsenide (GaAs), gallium nitride (GaN), GaN on silicon carbide, GaN on silicon, or other types of substrate materials. Further, each of the transistors 371, 373, 375, 377, 379, 381 of the first, second, and third amplifier dies 310, 320, 330 may be a field effect transistor (FET) (such as a metal oxide semiconductor FET (MOSFET), a laterally diffused MOSFET (LDMOS FET), a high electron mobility transistor (HEMT), and so on), which includes a gate (control terminal), a source (a first current conducting terminal), and a drain (a second current conducting terminal). Alternatively, each of the transistors 371, 373, 375, 377, 379, 381 may be a bipolar junction transistor (BJT). References herein to a "gate," "drain," and "source," which are commonly used to describe FETs, are not intended to be limiting, as each of these designations has analogous features for a BJT implementation (e.g., a base, collector, and emitter, respectively).

Various modifications may be made to module 300 without departing from the scope of the inventive subject matter. For example, although substrate 302 is depicted, in FIG. 4, to include five metal layers 353-361, substrates that include more or fewer metal layers alternatively may be used. In addition, other types of substrates alternatively could be used, including ceramic substrates or other types of substrates. Further, alternate embodiments may include a power splitter and/or amplifier die that are configured as flip-chips.

In such embodiments, some or all of the wirebond arrays (including wirebond arrays 316, 317a, 317b, 326, 336) may be replaced with conductive traces and other structures in and on the substrate 302. In addition, the first, second, and third amplifier dies 310, 320, 330 may include single stage amplifiers. In still other embodiments, two distinct amplifier die (one driver amplifier die and one output/final-stage amplifier die) may be implemented along each path 311, 321, 331. In such embodiments, mixed technologies could be implemented for the two die (e.g., the driver die may be silicon based (e.g., LDMOS) and the output/final-stage amplifier die may be GaN based, or vice versa). In addition to the above, the module 300 also may include various discrete and/or integrated components (e.g., capacitors, inductors, and/or resistors) electrically coupled to phase shift elements 308, 386 to provide desired impedance transformations.

Figure 5:
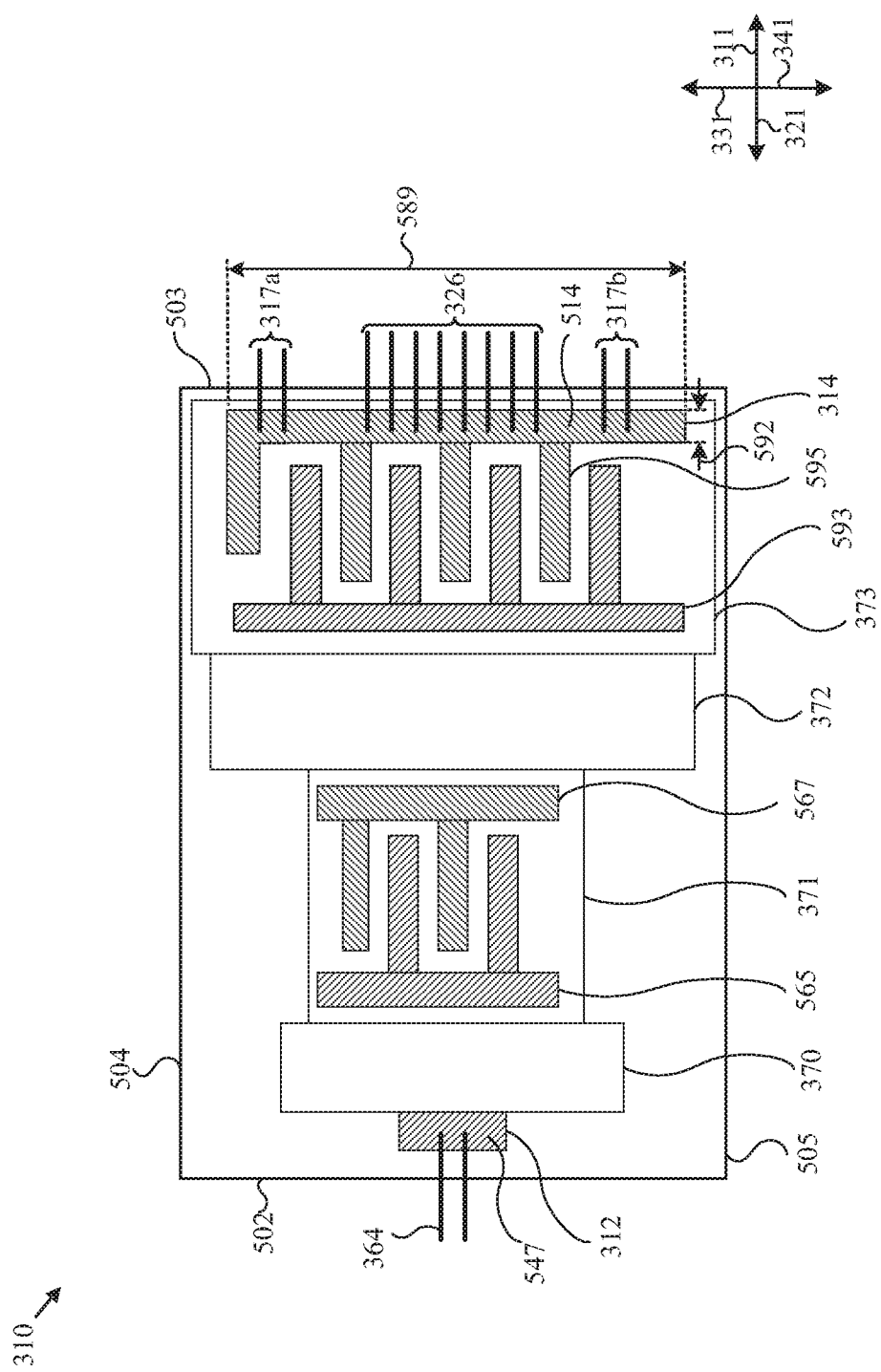
FIG. 5 depicts an enlarged top view of a first amplifier die in accordance with various embodiments of the disclosure.

FIG. 5 depicts an enlarged top view of the first amplifier die 310. As discussed previously in conjunction with FIG. 3, the electrical components of the first amplifier die 310 include RF input terminal 312, an input matching network 370, a driver transistor 371, an interstage matching network 372, an output transistor 373, and an RF output terminal 314. The first amplifier die 310 may have parallel first and second die sides 502, 503, and parallel third and fourth die sides 504, 505 that extend between the first and second die sides 502, 503.

According to an embodiment, the RF input terminal 312 is configured to enable an array or plurality of wirebonds 364 to be coupled in parallel with each other to the RF input terminal 312 so that the wirebonds 364 extend in a direction (e.g., direction 311) that is parallel with the direction of the signal path through the first amplifier die 310 (e.g., direction 311). More specifically, the RF input terminal 312 includes an elongated, conductive pad 547 that is proximate to the first side 502 of the first amplifier die 310, and that has a length that extends in parallel with the first side 502 of the first amplifier die 310. According to an embodiment, the length of the pad 547 is large enough to enable a plurality of wirebonds (e.g., from 2 to 10 or more) to be connected in parallel with each other along the length of the pad 547. As shown in FIG. 5, the length of the pad 547 is large enough to enable the plurality of wirebonds 364 to be connected so that they can extend in a perpendicular direction from side 502.

The RF input terminal 312 of the first amplifier die 310 is electrically coupled to the gate terminal 565 of transistor 371 through input matching network 370, and the drain terminal 567 of transistor 371 is electrically coupled to the gate terminal 593 of transistor 373 through inter-stage matching network 372. Accordingly, the signal path through the first amplifier die 310 is in a direction extending from the first side 502 toward the second side 503, or from the RF input terminal 312 toward the RF output terminal 314, which direction is indicated by arrow 311.

In FIG. 5, the RF output terminal 314 may be a bond pad (also referred to as an output bond pad) that includes an elongated pad 514, and three sets of wirebonds 317a, 317b, and 326 connected in parallel with respect to one another along the length 589 of the elongated pad 514. In FIG. 5, each set of wirebonds 317a, 317b includes two wirebonds and the set of wirebonds 326 includes eight wirebonds. In alternate embodiments, the length 589 may be sufficient to enable more (e.g., 13 or more) wirebonds to be connected in parallel along the length 589 of the elongated pad 514. According to an embodiment, the length 589 may be in a range of about 800 microns to about 1800 microns, or more desirably in a range of about 800 microns to about 1400 microns, although the length may be smaller or larger, as well. In some embodiments, the width 592 of the elongated pad 514 may be in a range of about 100 microns to about 150 microns. In other examples, the width 592 may be smaller than 100 microns or larger than 150 microns. The pad 514 is "elongated", as that term is used herein, because the length 589 of pad 514 is significantly greater than the width 592 of pad 514 (e.g., at least 3 times greater). The elongated pad 514 is proximate to the second die side 503 of the first amplifier die 310, in an embodiment, and the length 589 of the pad 514 is parallel to the second die side 503.

As used herein, a conductive "pad" means a conductive feature of a die that is exposed at a surface of the die, and that is configured to accept direct connection to electrical conductors that are distinct from the die (e.g., wirebonds, solder bonds, and so on). As used herein, the term "proximate to," as it relates to the relative positioning of a pad (e.g., 514, 547) with respect to a side (e.g., sides 502-505) may mean that the pad is within 100 microns from the side. In some embodiments, no significant intervening conductive, active, or passive components integrated within the die are positioned between a pad and a side to which it is proximate. In other embodiments, a pad may be considered to be proximate to a side even when there are one or more conductive, active, and/or passive components between the pad and the side. Alternatively, "proximate to," as it relates to the relative positioning of a pad with respect to a side may mean that the pad is within a wirebond length, as previously defined, of the side to which it is proximate.

The driver and output transistors 371, 373 are coupled in series between the RF input and output terminals 312, 314, where the driver transistor 371 is configured to apply a relatively low gain to the first RF signal (e.g., carrier signal), and the output transistor 373 is configured to apply a relatively high gain to the first RF signal after preliminary amplification by the driver transistor 371. In the illustrated embodiment, each of transistors 371, 373 includes interdigitated source and drain "fingers" (i.e., elongated source regions and drain regions in and proximate to the top surface of the first amplifier die 310), with gate terminals 565, 593 (control terminals) interdigitated with the source and drain fingers. Each of the gate terminals 565, 593 consists of a set of elongated conductive gate terminal fingers and a common conductive gate bar interconnecting the gate terminal fingers. Drain terminals 314, 567 (current conducting terminals) convey current from the drain regions of the transistors 371, 373). Similar to the gate terminals 565, 593, each drain terminal 314, 567 may consist of a set of elongated conductive drain terminal fingers (interdigitated with the gate terminal fingers), along with a common conductive drain bar interconnecting the drain terminal fingers. Although various numbers of gate and drain fingers are illustrated in FIG. 5, a device may include more or fewer fingers, and/or the transistors may have structures other than the interdigitated finger structures discussed herein.

Figure 6:
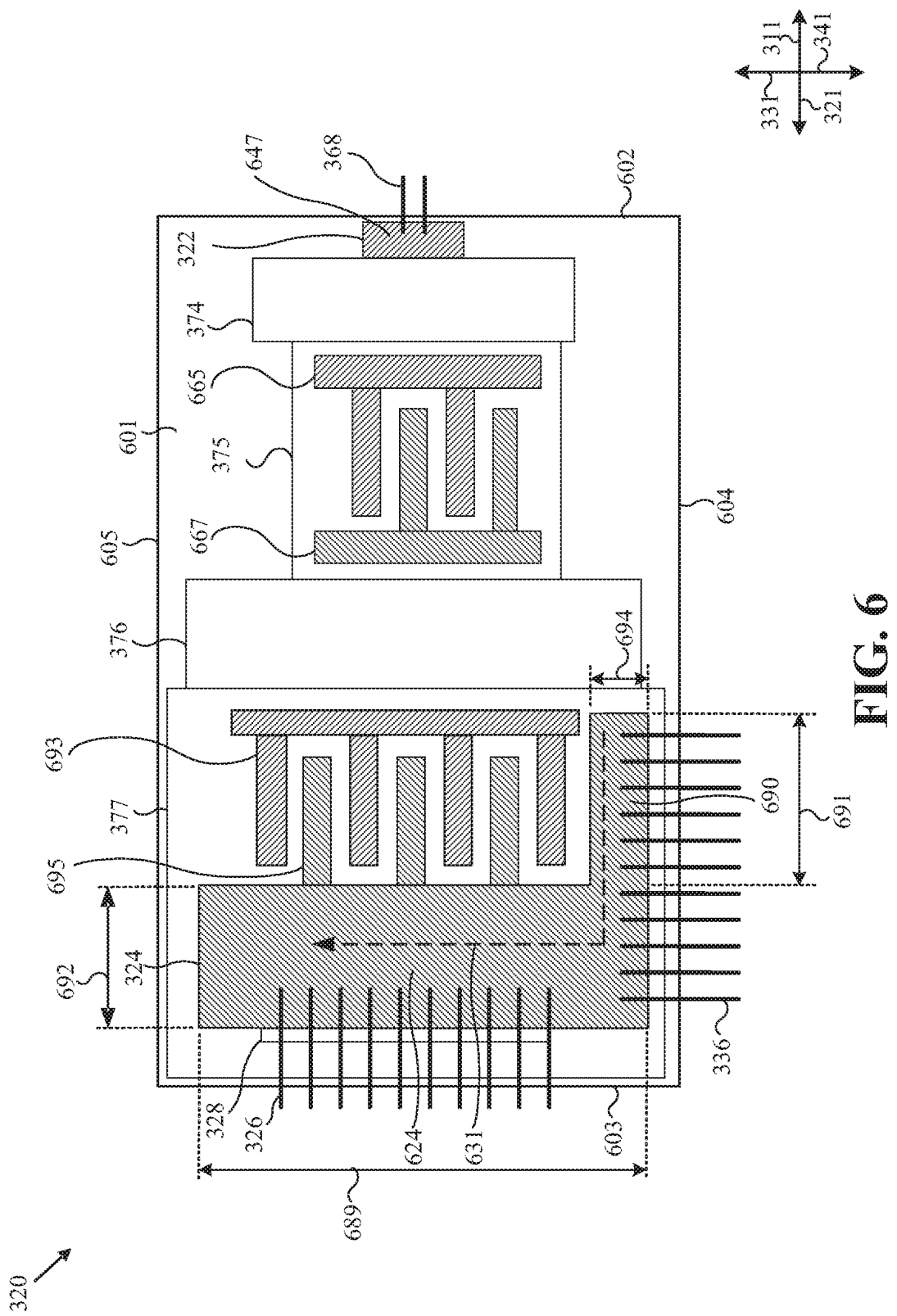
FIG. 6 depicts an enlarged top view of a second amplifier die in accordance with various embodiments of the disclosure.

FIG. 6 is an enlarged top view of the second amplifier die 320. As discussed previously in conjunction with FIG. 3, the electrical components of the second amplifier die 320 include RF input terminal 322, an input matching network 374, a driver transistor 375, an interstage matching network 376, an output transistor 377, and an RF output terminal 324. The second amplifier die 320 may have parallel first and second die sides 602, 603, and parallel third and fourth die sides 604, 605 that extend between the first and second die sides 602, 603.

According to an embodiment, the RF output terminal 324 has an "L" shape, as shown in FIG. 6, which includes first and second, orthogonally-arranged pads 624, 690. Specifically, the RF output terminal 324 is uniquely configured to enable an array or plurality of wirebonds 336 to be coupled in parallel with each other to the RF output terminal 324 so that the wirebonds 336 extend in a direction (e.g., direction 341) that is orthogonal to (e.g., perpendicular to) the direction of the signal path through the second amplifier die 320 (e.g., direction 321). More specifically, the RF output terminal 324 may be a bond pad (also referred to as an output bond pad) that includes an elongated main pad 624 and a side pad 690. The side pad 690 may be proximate to the third side 604 of the second amplifier die 320, and may have a length 691 that extends in parallel with the third side 604 of the second amplifier die 320. According to an embodiment, the length 691 of the side pad 690 is large enough to enable a plurality of wirebonds (e.g., from 2 to 10 or more) to be connected in parallel with each other along the first length of the side pad 690. As shown in FIG. 6, the length 691 of the side pad 690 is large enough to enable the plurality of wirebonds 336 to be connected so that they can extend in a perpendicular direction from the third side 604.

In an embodiment, the side pad 690 has a width 694 that is greater than the width 592 of the elongated pad 514 of the output bond pad (e.g., the RF output terminal 314) of the first amplifier die 310. For example, the width 694 of the side pad 690 may provide a widened current path (e.g., relative to the current path provided by the width 592 of the elongated pad 514) that minimizes (or significantly reduces) the additional inductance and losses that may be introduced by the lateral current 631 flowing from the wirebonds 336 to the wirebonds 326. The width 694 may also be sufficient to enable at least one row of wirebonds 336 to be coupled to the side pad 690. For example, the width 694 may be in a range of about 200 microns to about 300 microns, although the width 694 may be smaller or larger, as well.

In an embodiment, the elongated main pad 624 is electrically coupled to the side pad 690. The first and second pads 624, 690 may form portions of a single pad (e.g., an L-shaped pad, as shown), or the first and second pads 624, 690 may be separate pads. Either way, the elongated main pad 624 is proximate to the second die side 603 of the second amplifier die 320, in an embodiment, and the elongated main pad 624 has a length 689 that extends in parallel with the second die side 603. According to an embodiment, the side pad 690 and the elongated main pad 624 have lengths 691, 689 that are perpendicular to each other. The length 689 of the elongated main pad 624 is large enough to enable a second plurality of wirebonds 326 to be connected in parallel along the length 689 of the elongated main pad 624. As shown in FIG. 6, the length 689 of the elongated main pad 624 is large enough to enable the plurality of wirebonds 326 to be connected so that they can extend in a perpendicular direction from the second die side 603. FIG. 6 shows 10 wirebonds 326 connected in parallel with each other. In alternate embodiments, the length 689 may be sufficient to enable more (e.g., 11 or more) wirebonds to be connected in parallel along the length 689 of the elongated main pad 624. According to an embodiment, the length 689 may be in a range of about 800 microns to about 1800 microns, or more desirably in a range of about 800 microns to about 1400 microns, although the length may be smaller or larger, as well.

In an embodiment, the elongated main pad 624 has a width 692 that is greater than the width 592 of the elongated main pad 514 of the output bond pad (e.g., the RF output terminal 314) of the first amplifier die 310. For example, the width 692 of the elongated main pad 624 may provide a widened current path (e.g., relative to the current path provided by the width 592 of the elongated main pad 514) that minimizes (or significantly reduces) the additional inductance and losses that may be introduced by the flow of lateral current 631 flowing from the wirebonds 336 to the wirebonds 326. The width 692 may also be sufficient to enable at least one row of wirebonds 326 to be coupled to the elongated main pad 624. For example, the width 692 may be in a range of about 100 microns to about 500 microns, although the width may be smaller or larger, as well.

In some embodiments, either the width 692 or the width 694 may be greater than the width 592 to provide the previously described widened current path (e.g., relative to the current path provided by the width 592 of the elongated main pad 514) that minimizes (or significantly reduces) the additional inductance and losses that may be introduced by the flow of lateral current 631 flowing from the wirebonds 336 to the wirebonds 326. In other embodiments, both the width 692 and the width 694 may be greater than the width 592 to provide such widened current path.

As the above description makes clear, the bond pad 324 may function as a combining node (e.g., node 124, 224, FIGS. 1, 2) for amplified RF signals from amplifier dies 320, 330. In other embodiments, the pads 624, 690 implementing the first bond pad 324 may be separate pads that are electrically coupled together to function as the combining node.

The RF input terminal 322 of the second amplifier die 320 is electrically coupled to the gate terminal 665 of transistor 375 through input matching network 374, and the drain terminal 667 of transistor 375 is electrically coupled to the gate terminal 693 of transistor 377 through inter-stage matching network 376. Accordingly, the signal path through the second amplifier die 320 is in a direction extending from the first side 602 toward the second die side 603, or from the RF input terminal 322 toward the RF output terminal 324, which direction is indicated by arrow 321.

The driver and output transistors 375, 377 are coupled in series between the RF input terminal 322 and the RF output terminal 324, where the driver transistor 375 is configured to apply a relatively low gain to the second RF signal (e.g., second peaking signal), and the output transistor 377 is configured to apply a relatively high gain to the second RF signal after preliminary amplification by the driver transistor 375. In the illustrated embodiment, each of transistors 375, 377 includes interdigitated source and drain "fingers" (i.e., elongated source regions and drain regions in and proximate to the top surface of the second amplifier die 320), with gate terminals 665, 693 (control terminals) interdigitated with the source and drain fingers. Each of the gate terminals 665, 693 consists of a set of elongated conductive gate terminal fingers and a common conductive gate bar interconnecting the gate terminal fingers. Drain terminals 324, 667 (current conducting terminals) convey current from the drain regions of the transistors 377, 375). Similar to the gate terminals 665, 693, each drain terminal 324, 667 may consist of a set of elongated conductive drain terminal fingers (interdigitated with the gate terminal fingers), along with a common conductive drain bar interconnecting the drain terminal fingers. Although various numbers of gate and drain fingers are illustrated in FIG. 6, a device may include more or fewer fingers, and/or the transistors may have structures other than the interdigitated finger structures discussed herein.

Figure 7:
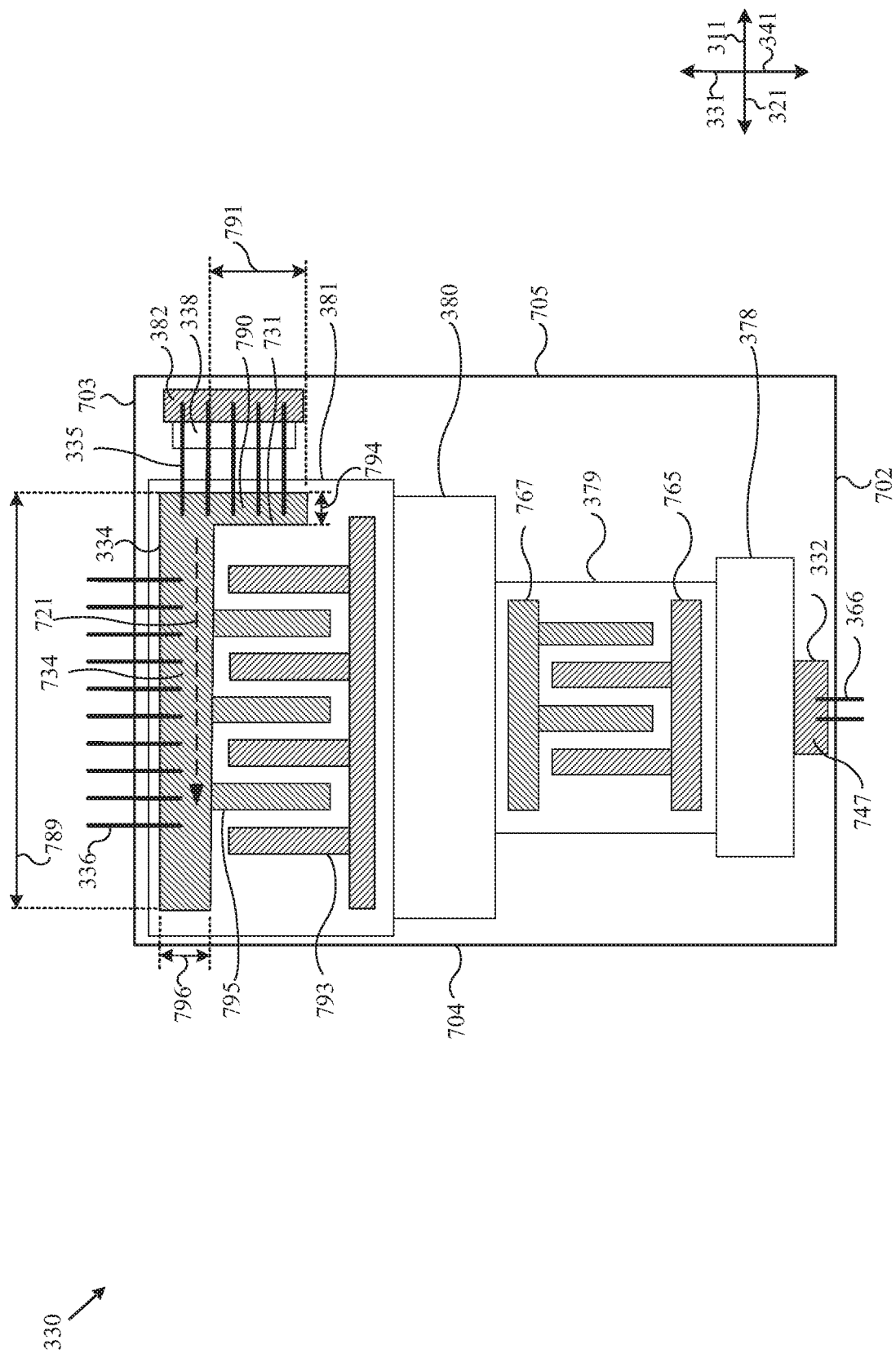
FIG. 7 depicts an enlarged top view of a third amplifier die in accordance with various embodiments of the disclosure.

FIG. 7 depicts an enlarged top view of the third amplifier die 330. As discussed previously in conjunction with FIG. 3, the electrical components of the third amplifier die 330 include RF input terminal 332, an input matching network 378, a driver transistor 379, an interstage matching network 380, an output transistor 381, and an RF output terminal 334. The third amplifier die 330 may have parallel first and second die sides 702, 703, and parallel third and fourth die sides 704, 705 that extend between the first and second die sides 702, 703.

According to an embodiment, the RF input terminal 332 is configured to enable an array or plurality of wirebonds 366 to be coupled in parallel with each other to the RF input terminal 332 so that the wirebonds 366 extend in a direction (e.g., direction 331) that is parallel with the direction of the signal path through the third amplifier die 330 (e.g., direction 331). More specifically, the RF input terminal 332 includes an elongated, conductive pad 747 that is proximate to the first die side 702 of the third amplifier die 330, and that has a length that extends in parallel with the first die side 702 of the third amplifier die 330. According to an embodiment, the length of the pad 747 is large enough to enable a plurality of wirebonds (e.g., from 2 to 10 or more) to be connected in parallel with each other along the length of the pad 747. As shown in FIG. 7, the length of the pad 747 is large enough to enable the plurality of wirebonds 366 to be connected so that they can extend in a perpendicular direction from side 702.

The RF input terminal 332 of the third amplifier die 330 is electrically coupled to the gate terminal 765 of transistor 379 through input matching network 378, and the drain terminal 767 of transistor 379 is electrically coupled to the gate terminal 793 of transistor 381 through inter-stage matching network 380. Accordingly, the signal path through the third amplifier die 330 is in a direction extending from the first die side 702 toward the second die side 703, or from the RF input terminal 332 toward the RF output terminal 334, which direction is indicated by arrow 331.

According to an embodiment, the RF output terminal 334 includes a conductive side pad 790 that is proximate to the fourth die side 705 of the third amplifier die 330, and that has a length 791 that extends in parallel with the fourth die side 705 of the third amplifier die 330. According to an embodiment, the length 791 of the side pad 790 is large enough to enable a plurality of wirebonds (e.g., from 2 to 10 or more) to be connected in parallel with each other along the length 791 of the side pad 790. As shown in FIG. 7, the length 791 of the side pad 790 is large enough to enable the plurality of wirebonds 335 (e.g., the fifth signal line 135 in FIG. 1) to extend in a perpendicular direction with respect to the fourth die side 705. The wirebonds 335 may electrically couple the side pad 790 to the pad 382. As described herein, the pad 382 may be electrically coupled to one or more shunt DC blocking capacitors 338 (e.g., second shunt DC blocking capacitor 138 in FIG. 1). It should be noted that the orthogonal orientation of the wirebonds 335 relative to the wirebonds 336 may minimize or significantly reduce electromagnetic coupling between the wirebonds 335 and the proximate wirebonds 336.

In an embodiment, the side pad 790 may have a width 794 that is greater than or equal to the width 592 of the elongated pad 514 of the output bond pad (e.g., the RF output terminal 314) of the first amplifier die 310. The width 794 may also be sufficient to enable at least one row of wirebonds 335 to be coupled to the side pad 790. For example, the width 794 may be in a range of about 200 microns to about 300 microns, although the width 794 may be smaller or larger, as well. In the illustrated embodiment, shunt DC blocking capacitor 383 is integrally-formed with the third amplifier die 330. In other embodiments, the shunt DC blocking capacitor 383 may be implemented in a distinct device. Further, in some embodiments, wirebonds 335 may be replaced with one or more integrated spiral inductors.

In addition to the side pad 790, the RF output terminal 334 may include an elongated main pad 734, which is electrically coupled to the side pad 790. The first and second pads 734, 790 may form portions of a single pad (e.g., an L-shaped pad, as shown), or the first and second pads 734, 790 may be separate pads. Either way, the elongated main pad 734 is proximate to the second die side 703 of the third amplifier die 330, in an embodiment, and the elongated main pad 734 has a length 789 that extends in parallel with the second die side 703. According to an embodiment, the side pad 790 and the main pad 734 have lengths 791, 789 that are perpendicular to each other. The length 789 of the main pad 734 is large enough to enable a second plurality of wirebonds 336 (e.g., the third signal line 136 in FIG. 1) to be connected in parallel along the length 789 of the main pad 734. As shown in FIG. 7, the length 789 of the main pad 734 is large enough to enable the plurality of wirebonds 336 to be connected so that they can extend in a perpendicular direction from the second die side 703. FIG. 7 shows 10 wirebonds 336 connected in parallel with each other. In alternate embodiments, the length 789 may be sufficient to enable more (e.g., 11 or more) wirebonds to be connected in parallel along the length 789 of the main pad 734. According to an embodiment, the length 789 may be in a range of about 800 microns to about 1800 microns, or more desirably in a range of about 800 microns to about 1400 microns, although the length may be smaller or larger, as well.

In an embodiment, the elongated main pad 734 has a width 796 that is greater than the width 592 of the elongated main pad 514 of the output bond pad (e.g., the RF output terminal 314) of the first amplifier die 310. For example, the width 796 of the elongated main pad 734 may provide a widened current path (e.g., relative to the current path provided by the width 592 of the elongated main pad 514) that minimizes or significantly reduces the additional inductance and losses that may be introduced by the flow of lateral current 721 flowing from the wirebonds 335 to the wirebonds 336. Furthermore, in one embodiment, the reduced inductance of the elongated main pad 734 resulting from the width 796 may enable realization of a shunt inductive network with a sufficiently low inductance for resonating out (e.g., reducing) any excess internal drain-source capacitance of the output transistor 381. For example, the reduced inductance of the elongated main pad 734 may allow the wirebonds 335 to achieve a shunt inductive network with an inductance low enough to resonate out (e.g., reduce) at least some of the excess internal drain-source capacitance of the output transistor 381 (e.g., capacitance $C_{ds\_3}$ 296 in FIG. 2). In an embodiment, the shunt inductive network may include the wirebonds 335 and the one or more shunt DC blocking capacitors 338. The width 796 may also be sufficient to enable at least one row of wirebonds 336 to be coupled to the elongated main pad 734. For example, the width 796 may be in a range of about 200 microns to about 400 microns, although the width may be smaller or larger, as well.

The driver and output transistors 379, 381 are coupled in series between the RF input and output terminals 332, 334, where the driver transistor 379 is configured to apply a relatively low gain to the third RF signal (e.g., second peaking signal), and the output transistor 381 is configured to apply a relatively high gain to the third RF signal after preliminary amplification by the driver transistor 379. In the illustrated embodiment, each of transistors 379, 381 includes interdigitated source and drain "fingers" (i.e., elongated source regions and drain regions in and proximate to the top surface of the third amplifier die 330), with gate terminals 765, 793 (control terminals) interdigitated with the source and drain fingers. Each of the gate terminals 765, 793 consists of a set of elongated conductive gate terminal fingers and a common conductive gate bar interconnecting the gate terminal fingers. Drain terminals 334, 767 (current conducting terminals) convey current from the drain regions of the transistors 381, 379). Similar to the gate terminals 765, 793, each drain terminal 334, 767 may consist of a set of elongated conductive drain terminal fingers (interdigitated with the gate terminal fingers), along with a common conductive drain bar interconnecting the drain terminal fingers. Although various numbers of gate and drain fingers are illustrated in FIG. 7, a device may include more or fewer fingers, and/or the transistors may have structures other than the interdigitated finger structures discussed herein.

Figure 8:
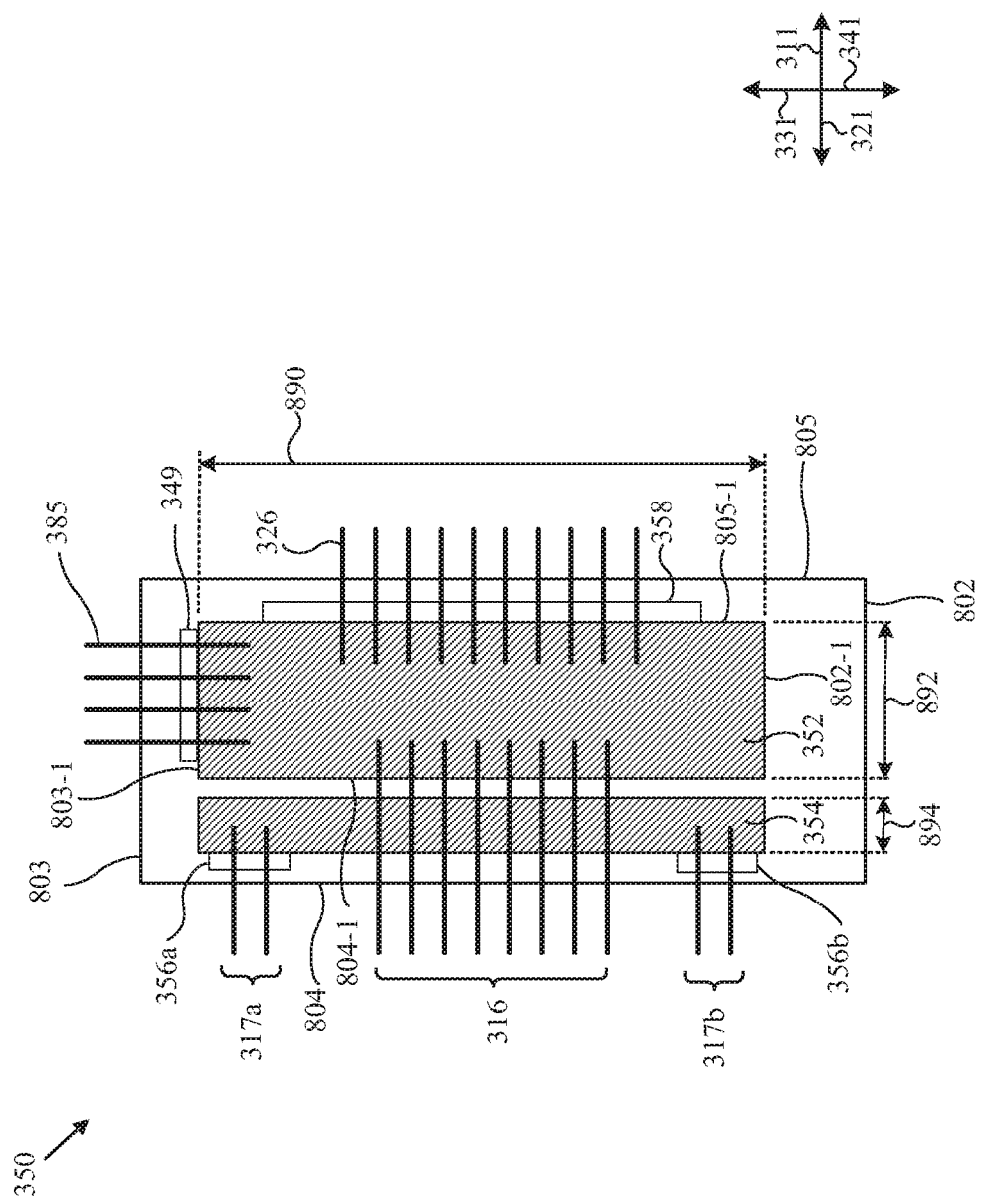
FIG. 8 depicts an enlarged top view of a signal combiner device in accordance with various embodiments of the disclosure.

FIG. 8 depicts an enlarged top view of the signal combiner device 350 in accordance with an example embodiment. As discussed previously in conjunction with FIG. 3, the electrical components of the signal combiner device 350 include second and third shunt capacitors 358, 349, and shunt DC blocking capacitors 356a, 356b. The signal combiner device 350 further includes a first bond pad 352 that is electrically coupled to first terminals of the second and third shunt capacitors 358, 349, and a second bond pad 354 that is electrically coupled to first terminals of the shunt DC blocking capacitors 356a, 356b. The second terminals of each of capacitors 349, 356a, 356b, 358 are electrically coupled to a ground-reference node (e.g., with through substrate vias that extend to the bottom surface of the signal combiner device 350). The signal combiner device 350 may have parallel first and second sides 802, 803, and parallel third and fourth sides 804, 805 that extend between the first and second sides 802, 803. The first bond pad 352 may have parallel first and second pad sides 802-1, 803-1, and parallel third and fourth pad sides 804-1, 805-1 that extend between the first and second pad sides 802-1, 803-1.

According to an embodiment, the first bond pad 352 is configured to enable an array or plurality of wirebonds 316 to be coupled in parallel with each other to the first bond pad 352 so that the wirebonds 316 extend in a direction (e.g., direction 321) that is parallel with the direction of the signal path through the first amplifier die 310 (e.g., direction 311). As shown in FIG. 8, the wirebonds 316 are connected proximate to the third pad side 804_1 of the first bond pad 352. It should be noted that the wirebonds 316 are not in contact with the second bond pad 354 of the signal combiner device 350. In an embodiment, the first bond pad 352 has a length 890 that extends in parallel with the fourth side 805 and is large enough to enable a plurality of wirebonds (e.g., from 2 to 10 or more) to be connected in parallel with each other along the length 890 of the first bond pad 352. As shown in FIG. 8, the length of the pad 890 is large enough to enable the plurality of wirebonds 316 to be connected so that they can extend in a perpendicular direction from side 804.

The first bond pad 352 has a width 892 that is large enough to enable another array or plurality of wirebonds 326 to be coupled in parallel with each other to the first bond pad 352 so that the wirebonds 326 extend in a direction (e.g., direction 311) that is parallel with the direction of the signal path through the second amplifier die 320 (e.g., direction 321). The wirebonds 326 are connected proximate to the fourth pad side 805_1 of the first bond pad 352. As shown in FIG. 8, the length of the pad 890 is large enough to enable the plurality of wirebonds 326 to be connected so that they can extend in a perpendicular direction from side 805. In FIG. 8, the wirebonds 316 include 8 wirebonds, and wirebonds 326 include 10 wirebonds. In alternate embodiments, the length 890 may be sufficient to enable more (e.g., 11 or more) wirebonds to be connected in parallel along the length 890 of the first bond pad 352. According to an embodiment, the length 890 may be in a range of about 800 microns to about 1800 microns, or more desirably in a range of about 800 microns to about 1400 microns, although the length may be smaller or larger, as well. In some embodiments, the width 892 may be in a range of about 300 microns to about 450 microns. In other examples, the width 892 may be smaller than 300 microns or larger than 450 microns.

In an embodiment, the width 892 of the first bond pad 352 is large enough to enable another array or plurality of wirebonds 385 to be coupled in parallel with each other to the first bond pad 352 so that the wirebonds 385 extend in a direction (e.g., direction 331) that is orthogonal (e.g., perpendicular) with the direction of the signal path through the first amplifier die 310 (e.g., direction 311) and the direction of the signal path through the second amplifier die 320 (e.g., direction 321). The wirebonds 385 are connected proximate to the second pad side 803_1 of the first bond pad 352, and proximate to the second device side 803 of the signal combiner device 350. As shown in FIG. 8, the length 890 and the width 892 of the first bond pad 352 are large enough to accommodate the wirebonds 316, 326 and also to enable the plurality of wirebonds 385 to be connected so that they can extend in a perpendicular direction from the second side 803. In FIG. 8, the wirebonds 385 includes four wirebonds. In alternate embodiments, the width 892 may be sufficient to enable more (e.g., five or more) wirebonds to be connected in parallel along the width 892 of the first bond pad 352.

Although the first bond pad 352 in FIG. 8 is shown to be rectangular, and has a length 890 and a width 892 that are sufficient to enable the three sets of wirebonds 316, 326, 385 to be coupled thereto, the functionality of the first bond pad 352 may be implemented in different ways in other embodiments. For example, an alternate embodiment may replace bond pad 352 with an upside-down U-shaped bond pad, where a first leg of the bond pad is configured for attachment of wirebonds 316, a second leg of the bond pad is configured for attachment of wirebonds 326, and a spanning portion of the bond pad between the first and second legs is configured for attachment of wirebonds 385. In still other embodiments, the first leg, the second leg, and/or the spanning portion may be implemented as separate bonding pads, which are electrically connected together within the signal combiner device 350 through various conductive structures (e.g., patterned conductive traces and conductive vias). As the above description makes clear, in some embodiments, the first bond pad 352 may function as the combining node (e.g., node 152, 252, FIGS. 1, 2), but in other embodiments, the first bond pad 352 and/or alternate bonding pads that provide its same functionality may be electrically coupled together to function as the combining node.

According to an embodiment, the second bond pad 354 is situated proximate to the third side 804 of the signal combiner device 350. The second bond pad 354 is configured to enable an array or plurality of wirebonds 317a, 317b to be coupled in parallel with each other to the second bond pad 354 so that the wirebonds 317a, 317b extend in a direction (e.g., direction 321) that is parallel with the direction of the signal path through the first amplifier die 310 (e.g., direction 311). The wirebonds 317a, 317b are connected proximate to the third side 804 of the device 350. In an embodiment, the second bond pad 354 also has the length 890 that extends in parallel with the third side 804 and is large enough to enable a plurality of wirebonds (e.g., from 2 to 10 or more) to be connected in parallel with each other along the length 890 of the second bond pad 354. As shown in FIG. 8, the length 890 and the width 354 of the second pad 354 is large enough to enable the plurality of wirebonds 317a, 317b to be connected so that they can extend in a perpendicular direction from the side 804.

The orthogonal configuration of the wirebonds 385 relative to the wirebonds 316, 317a, 317b, 385, 326 at the signal combiner device 350 may enable significant reduction in electromagnetic coupling between the wirebonds 385 and the wirebonds 316, 317a, 317b, 385, 326. Therefore, the wirebonds 385 may be situated close to the wirebonds 316, 317a, 317b, 385, 326, which enables the first bond pad 352 (and the signal combiner device 350) to maintain a compact size.

In some embodiments, some or all of the wirebonds described with reference to FIGS. 3-8 may be wirebonds having a high Q factor to limit RF signal combining losses. In some embodiments, the shunt capacitors described with reference to FIGS. 1-8 may have a high Q factor to limit RF signal combining losses. In some embodiments, some or all of the shunt capacitors described with reference to FIGS. 1-8 may be metal insulator metal (MIM) capacitors. In other embodiments, some or all of the shunt capacitors may be implemented as discrete devices that are coupled to the top surfaces of dies 310, 320, 330, device 350, or substrate 302.

The embodiments described herein may significantly reduce the footprint size of a three-way Doherty amplifier layout while increasing design flexibility and circuit optimization. For example, the head-to-head orientation of the first and second amplifier dies (e.g., first and second amplifier dies 310, 320) of the three-way Doherty amplifier and the orthogonal orientation of the third amplifier die (e.g., third amplifier die 330) of the three-way Doherty amplifier may reduce electromagnetic coupling effects and allow for the first, second, and third amplifier dies to be placed closer together as compared with conventional three-way Doherty amplifier layout configurations. The reduction in footprint size achieved by the embodiments described herein may increase valuable component mounting and/or trace routing areas on a substrate (e.g., a substrate used in a chip package, such as a land grid array (LGA)).

The signal combiner device (e.g., signal combiner device 150, 350) described herein may achieve a significant reduction in the transmission losses resulting from the CLC networks (e.g., the first, second, and third CLC networks) in the signal paths by implementing the CLC networks with high-Q MIM capacitors (e.g., implementing the second shunt capacitor 358 and/or third shunt capacitor 349 using high-Q MIM capacitors) and low inductance wirebonds (e.g., wirebond arrays 316, 317a, 317b, 385, 326). Moreover, the signal combiner device may include a shunt capacitor (e.g., third shunt capacitor 349) that can improve the bandwidth of the load (e.g., load 162) to 50Ω transformer impedance match (e.g., when the impedance of the load 162 is low or when the average power of the Doherty amplifier 100 is at a relatively high back-off level).

In addition, as the peak power, design frequency, back-off level and/or device drain capacitances in a three-way Doherty amplifier increase, the inductance values required by the CLC networks for performing the appropriate phase delay and/or impedance matching functions may be significantly reduced. Such reduced inductance values may be difficult to realize in conventional three-way Doherty implementations. However, since the signal combiner device (e.g., signal combiner device 150, 350) implements the inductances required by the CLC networks with low inductance wirebonds, the signal combiner device described herein may realize the previously discussed reduced inductance values.

Two-Way Doherty Amplifier Implementations

Figure 9:
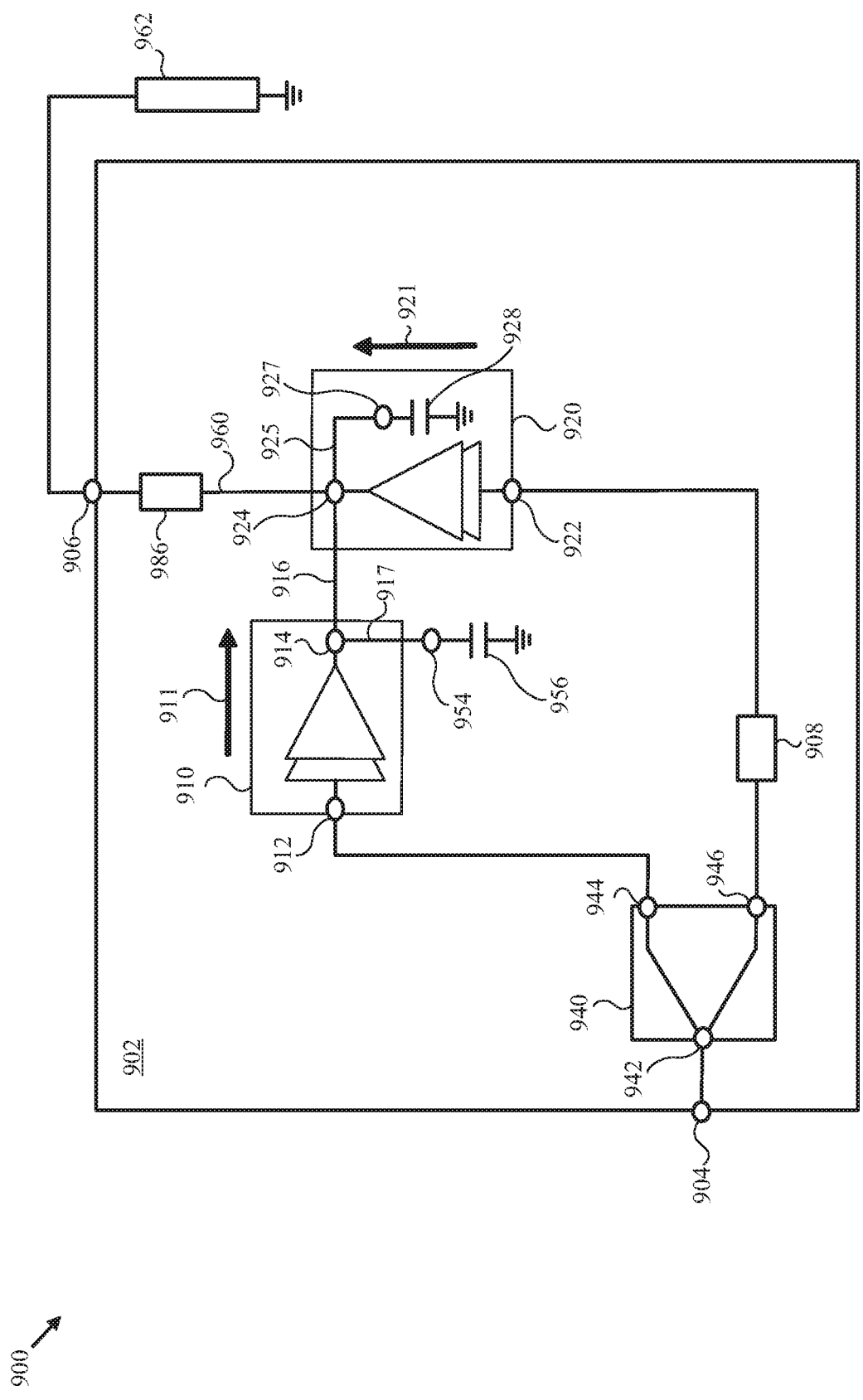
FIG. 9 depicts a schematic diagram of a two-way Doherty amplifier in accordance with various embodiments of the disclosure.

FIG. 9 is a schematic diagram of a Doherty amplifier 900 (also referred to as a two-way Doherty amplifier 900), in accordance with an example embodiment. Some or all components of the Doherty amplifier 900 may be implemented in a single device package or module. As described in detail below, the orientations of the various amplifier components in the two-way Doherty amplifier 900 enable the size of the package or module to be significantly reduced, when compared with conventional packaging techniques, while still meeting gain, linearity, stability, and efficiency performance criteria. This is achieved, more specifically, by orienting first and second amplifier components in a substantially orthogonal (e.g., perpendicular) configuration. In an embodiment, the first amplifier component may be a carrier amplifier of the Doherty amplifier 900 and the second amplifier component may be a peaking amplifier of the Doherty amplifier 900. For example, the orientation of the first and second amplifier components may allow a first signal path (e.g., signal path 911) of the first amplifier component to have an approximately 90 degree angular offset relative to a second signal path (e.g., signal path 921) of the second amplifier component. The 90 degree angular offset has the effect of reducing electromagnetic coupling between the first signal path (e.g., signal path 911) and the second signal path (e.g., signal path 921).

In an embodiment, the Doherty amplifier 900 includes an RF input node 904, an RF output node 906, a power splitter 940, a first signal path 911, a second signal path 921, and a combining node 924 (also referred to as a summing node). When incorporated into a larger RF system, the RF input node 904 is coupled to an RF signal source (not illustrated), and the RF output node 906 is coupled to a load 962 (e.g., a resistive load). For example, the load 962 may be an antenna. In an embodiment, and as shown in FIG. 9, the RF combining node 924 may be coupled to a load 962 via an impedance transformer 986. For example, the impedance transformer 986 may be configured to match the impedance of the load (e.g., the impedance looking into the combining node 924) to a source impedance of 50Ω or other suitable impedance value. In some embodiments, the impedance transformer 986 may be external to the Doherty amplifier 900 (e.g., external to the package or module containing the Doherty amplifier 900). Fundamentally, the Doherty amplifier 900 is configured to amplify the input RF signal, and to produce an amplified RF output signal at the RF output node 906. As indicated in FIG. 9 with box 902, some or all components of Doherty amplifier 900 may be implemented in a single device package or module.

In an embodiment, the power splitter 940 has an input 942 and two outputs 944, 946. The power splitter input 942 is coupled to the RF input node 942 to receive the input RF signal. The power splitter 940 is configured to divide the RF input signal received at input 942 into first and second RF signals, which are provided to the first and second signal paths 911, 921 through outputs 944, 946. In some embodiments, the power splitter 940 may include one or more phase shift elements configured to impart an approximately 90 degree phase shift (e.g., a 90 degree phase delay) to the signal provided at output 944 and/or 946. In some embodiments, the phase shifter 908 described herein may be implemented in the power splitter 940.

When Doherty amplifier 900 has a symmetrical configuration (i.e., a configuration in which the first and second amplifiers include power transistors that are substantially identical in size or power handling capability), the power splitter 940 may divide or split the input RF signal received at the input 942 into two signals that have approximately equal power. Conversely, when Doherty amplifier 900 has an asymmetrical configuration (i.e., a configuration in which the first and second amplifiers includes a power transistor that is significantly larger than the power transistors in the other amplifier), the power splitter 940 may output signals having unequal power. In some embodiments, the power splitter 940 may be implemented with fixed-value, passive components. In other embodiments, the power splitter 940 may be implemented with one or more controllable variable attenuators and/or variable phase shifters, which enable the power splitter 940 to attenuate and/or phase shift the first, second, and third RF signals based on externally-provided control signals.

Doherty amplifier 900 includes first and second amplifier die 910, 920, according to an embodiment. Each amplifier die 910, 920 includes an input terminal 912, 922 proximate to a first edge of the amplifier die 910, 920, and output terminal 914, 924 proximate to a second edge of the amplifier die 910, 920 that is opposite (and parallel to) the first edge. One or more power transistors are electrically connected between each of the input and output terminals.

The outputs 944, 946 of the power splitter 940 are connected to the first and second signal paths 911, 921 respectively. The first signal path 911 includes the first amplifier die 910, which is configured to receive the first RF signal from the power splitter 940 at input terminal 912, to amplify the first RF signal, and to provide the amplified first RF signal at RF output terminal 914. The amplified first RF signal is conveyed from the RF output terminal 914 to a combining node (e.g., the RF output terminal 924) via the first signal line 916. In some embodiments, at least a portion of the first signal line 916 may be implemented as a wirebond array including a plurality of parallel wires that extend from a bonding pad coupled to RF output terminal 914 to a bonding pad coupled to the combining node 924. In an embodiment, the RF output terminal 914 of the first amplifier die also may be coupled, via a second signal line 917, to a first shunt direct current (DC) blocking capacitor 956 via the second signal line 917. In some embodiments, the second signal line 917 may be implemented as a wirebond or a wirebond array (e.g., a plurality of parallel wires) extending from the RF output terminal 914 to the terminal 954.

The second path 921 is similarly configured to amplify the second RF signal. More specifically, the second signal path 921 includes the second amplifier die 920, which is configured to receive the second RF signal from the power splitter 940 at input terminal 922, to amplify the second RF signal, and to provide the amplified second RF signal at RF output terminal 924.

The amplified second RF signal is provided to the combining node (e.g., a conductive node on second amplifier die 920 that is directly connected to the RF output terminal 924, where "directly connected to" means co-located with or electrically connected through a negligibly resistive conductive path), where the amplified first and second RF signals are summed in phase to produce an amplified RF output signal. The signal paths 911, 921 may include or be coupled to various impedance matching elements (e.g., impedance transformer 986), phase matching elements (e.g., capacitors 956, 928), and/or phase shift elements (e.g., a phase shifter 908, which may be configured to impart a 90 degree phase shift) so that the first and second amplified RF signals arrive in phase with each other at the combining node (e.g., a node directly connected to the RF output terminal 924).

Along the first signal path 911, a first amplifier die 910 includes an RF input terminal 912, an RF output terminal 914, and one or more amplification stages coupled between the input and output terminals 912, 914. As with the previously described first amplifier die 110, each amplification stage of the first amplifier die 910 includes a power transistor with a control terminal and first and second current-carrying terminals. The power transistor(s) of the first amplifier die 910 may be electrically coupled between the RF input and output terminals 912, 924 in a manner similar to that described above with the description of the first amplifier die 110. In an embodiment, the RF output terminal 914 may be coupled to a first shunt capacitor 956 via the third signal line 917. In some embodiments, the first shunt capacitor 956 may be situated external to the first amplifier die 910. Additional other details discussed in conjunction with the description of the first amplifier die 110 also apply to the first amplifier die 910, and those additional details are not reiterated here for brevity.

The RF input terminal 912 is coupled to the first output 944 of the power splitter 940, and thus the RF input terminal 912 receives the first RF signal that was produced by the power splitter 940. Along the second amplifier path 921, a second amplifier die 920 includes an RF input terminal 922, the RF output terminal 924, and one or more amplification stages coupled between the input and output terminals 922, 924. The RF input terminal 922 is coupled to the second output 946 of the power splitter 940, and thus the RF input terminal 922 receives the second RF signal that was produced by the power splitter 940.

Each amplification stage of the first amplifier die 910 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 912, one of the current-carrying terminals (e.g., the drain terminal or the source terminal) is electrically connected to the RF output terminal 914, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that has a relatively low power, and a second transistor functions as an output amplifier transistor that has a relatively high power. In such an embodiment, the control terminal of the driver amplifier transistor is electrically connected to the RF input terminal 912, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 914, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the first amplifier die 910. Further, in an embodiment in which the first amplifier die 910 is a two-stage device, an interstage matching network (not illustrated in FIG. 1) also may be monolithically formed as a portion of the first amplifier die 910.

As with the first amplifier die 910, each amplification stage of the second amplifier die 920 includes a power transistor with a control terminal and first and second current-carrying terminals. The power transistor(s) of the second amplifier die 920 may be electrically coupled between the RF input and output terminals 922, 924 in a manner similar to that described above in conjunction with the description of the first amplifier die 910. In some embodiments, the RF output terminal 924 may be coupled to a second shunt capacitor 928 included in the second amplifier die 920 via a fourth signal line 925. In some embodiments, the fourth signal line 925 may be implemented as a wirebond array (e.g., a plurality of wires) extending from the RF output terminal 924 to the terminal 927. Additional other details discussed in conjunction with the description of the first amplifier die 910 also apply to the second amplifier die 920, and those additional details are not reiterated here for brevity.

The resulting amplified RF output signal generated by the Doherty amplifier 900 is produced at the RF output node 906, to which the output load 962 (e.g., an antenna) is connected via the fifth signal line 960. In some embodiments, at least a portion of the fifth signal line 960 may be implemented as a wirebond array including a plurality of wires. In some embodiments, at least a portion of the fifth signal line 960 may include an impedance transformer 986.

In an embodiment, the first amplifier die 910 may be a carrier amplifier of the Doherty amplifier 900 and the second amplifier die 920 may be a peaking amplifier of the Doherty amplifier 900. Accordingly, the Doherty amplifier 900 may be configured so that the first signal path 911 (also referred to as a carrier signal path) provides amplification for relatively low level input signals. As the magnitude of the input signal increases, a first input power level is reached at which the second signal path 921 (also referred to as a peaking signal path) also becomes active. This may be accomplished, for example, by biasing the first amplifier die 910, such that the first amplifier die 910 operates in a class AB mode, and biasing the second amplifier die 920 such that the second amplifier die 920 operates in a class C mode.

According to an embodiment, the physical components of the first and second signal paths 911, 921 are oriented, with respect to each other, so that portions of the first signal path 911 are substantially orthogonal relative to the corresponding portions of the second signal path 921. For example, a portion of a first signal path through the first amplifier die 910 extends in a first direction (indicated by arrow 911) between the RF input and output terminals 912, 914, and a portion of a second signal path through the second amplifier die 920 extends in a second direction (indicated by arrow 921) between the RF input and output terminals 922, 924. In an embodiment, the first direction (indicated by arrow 911) may be angularly separated by more or less than 90 degrees relative to the second direction (indicated by arrow 921).

According to an embodiment, the angular separation between directions of the portions of the first and second signal paths that traverse the first and second amplifier dies 910, 920 is achieved by orienting the first and second amplifier dies 910, 920 so that the signal path between the RF input and output terminals 912, 914 of the first amplifier die 910 is oriented orthogonally to the signal path between the RF input and output terminals 922, 924 of the second amplifier die 920.

During operation, the angular separation of the signal path through the first amplifier die 910 relative to the signal path through the second amplifier die 920 reduces the amount of electromagnetic coupling between those portions of the signal paths, when compared with a system in which an amplifier die (e.g., the signal path of the amplifier die) is oriented parallel with other amplifier dies. Given this reduction in electromagnetic coupling between the signal paths, the first and second amplifier dies 910, 920 may be positioned closer together than they could be with conventional parallel orientations, while still achieving acceptable performance. Accordingly, implementation of the various embodiments may enable high-performance Doherty amplifiers to be implemented in relatively small packages or modules, when compared with the sizes of packages or systems used to house conventionally-arranged Doherty amplifiers.

Figure 10:
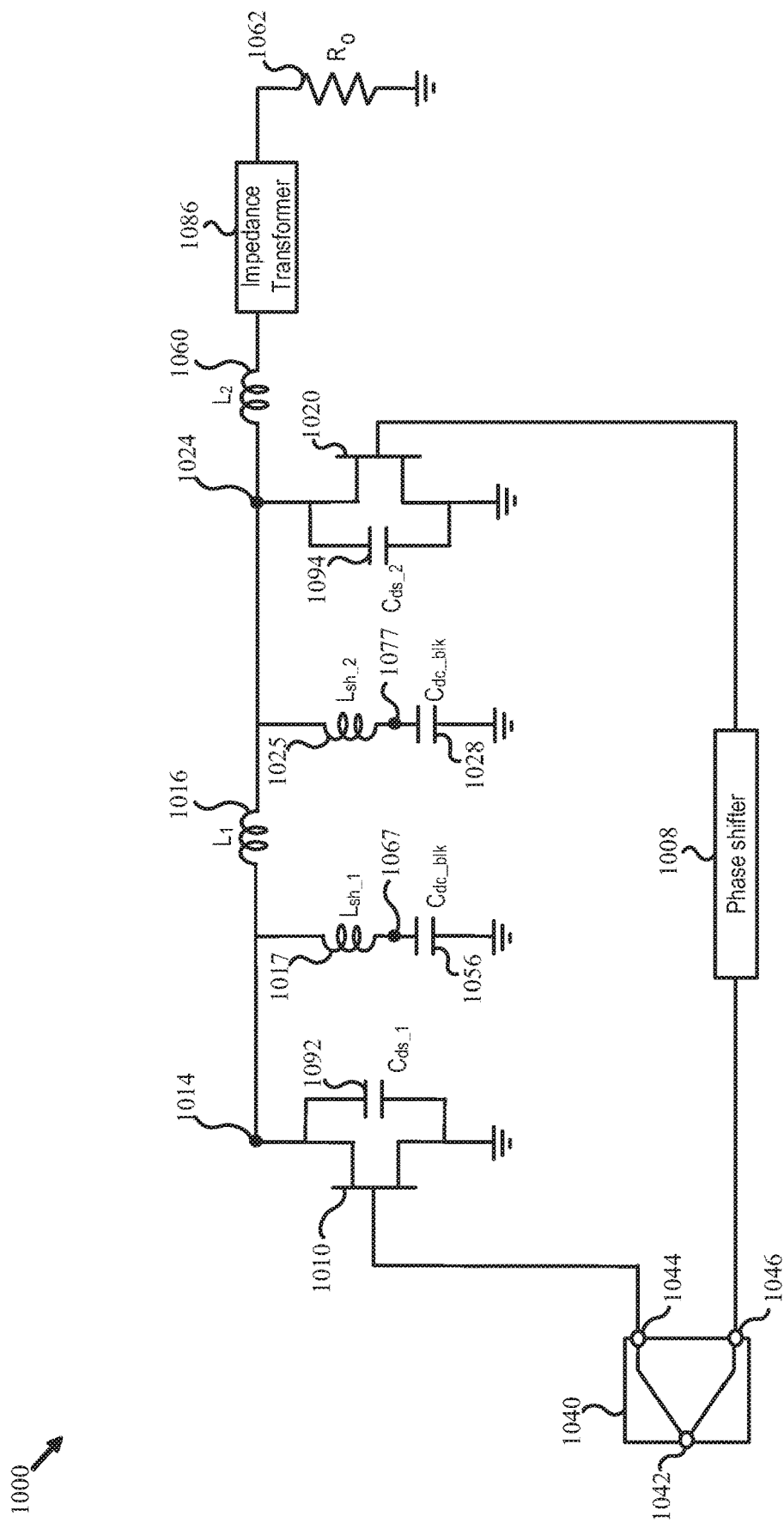
FIG. 10 depicts a schematic diagram representing a two-way Doherty amplifier in accordance with various embodiments of the disclosure.

The operation and design of the Doherty amplifier 900 will now be described with reference to the circuit 1000 shown in FIG. 10. The circuit 1000 is a schematic diagram representing the Doherty amplifier 900 in FIG. 9. With reference to FIG. 9, the circuit 1000 includes a power splitter 1040, a first power transistor 1010, a second power transistor 1020, and a load 1062. In the embodiment of FIG. 10, the first power transistor 1010 may be an output power transistor in the first amplifier die 910 in FIG. 9 and the second power transistor 1020 may be an output power transistor in the second amplifier die 920 in FIG. 9. In FIG. 10, the internal drain-source capacitance (also referred to as a parasitic capacitance or junction capacitance) of the first power transistor 1010 is indicated as the capacitance $C_{ds\_1}$ 1092 and the internal drain-source capacitance of the second power transistor 1020 is indicated as the capacitance $C_{ds\_2}$ 1094. Therefore, it should be understood that the capacitances $C_{ds\_1}$ 292, $C_{ds\_2}$ 294, shown in FIG. 10 do not represent physical components.

As shown in FIG. 10, the output of the first power transistor 1010 (e.g., the RF output terminal 914 of the first amplifier die 910) is coupled to the output of the second power transistor 1020 (e.g., the RF output terminal 924 of the first amplifier die 920) via the inductor $L_1$ 1016 (e.g., the inductance of the first signal line 916). In an embodiment, the output of the first power transistor 1010 is the drain terminal of the first power transistor 1010 coupled to the first node 1014. The output of the first power transistor 1010 (e.g., the RF output terminal 914 of the first amplifier die 910) is further coupled to a first shunt DC blocking capacitor $C_{dc\_blk}1056$ (e.g., first shunt DC blocking capacitor 956) via the inductor $L_{sh\_1}$ 1017 (e.g., the inductance of the second signal line 917). In some embodiments, the inductor $L_{sh\_1}$ 1017 and the first shunt DC blocking capacitor $C_{dc\_blk}$ 1056 may be referred to as a first shunt inductive network.

As further shown in FIG. 10, the output of the second power transistor 1020 (e.g., the RF output terminal 924 of the second amplifier die 920) is coupled to the load 1062 via the inductor $L_2$ 1060 (e.g., the inductance of the fifth signal line 960). In an embodiment, and as shown in FIG. 10, the output of the second power transistor 1020 may be coupled to the load 1062 via the inductor $L_2$ 1060 (e.g., the inductance of the fifth signal line 960) and an impedance transformer 1086. The output of the second power transistor 1020 (e.g., the RF output terminal 1024 of the second amplifier die 1020) is further coupled to a second shunt DC blocking capacitor $C_{dc\_blk}$ 1028 (e.g., second shunt DC blocking capacitor 928) via the inductor $L_{sh\_2}$ 1025 (e.g., the inductance of the fourth signal line 925). In some embodiments, the inductor $L_{sh\_2}$ 1025 and the second shunt DC blocking capacitor $C_{dc\_blk}$ 1028 may be referred to as a second shunt inductive network.

The power splitter 1040 (e.g., power splitter 940) has an input 1042 (e.g., input 942 in FIG. 9) and two output terminals 1044, 1046 (e.g., outputs 944, 946, in FIG. 9). The power splitter input 1042 may receive an input RF signal and may divide the RF input signal into first and second RF signals. The power splitter 1040 may provide the first RF signal from the output terminal 1044 to the gate of the first power transistor 1010. The first power transistor 1010 may provide an amplified first RF signal to a combining node (e.g., the RF output terminal 1024). The power splitter 1040 may provide the second RF signal from the output terminal 1046 to the gate of the second power transistor 1020. The second power transistor 1020 may provide an amplified second RF signal to the combining node (e.g., the RF output terminal 1024). The amplified first and second RF signals may be summed in phase at the combining node (e.g., the RF output terminal 1024) to produce an amplified RF output signal. The amplified RF output signal may be provided to the load $R_O$ 1062 (e.g., load 962 in FIG. 9). In some embodiments, the phase shift element 1008 (e.g., phase shift element 908 in FIG. 9) may impart an approximately 90 degree phase shift to the RF signal provided at output terminals 1046 so that the amplified second RF signal arrives at the combining node (e.g., the RF output terminal 1024) in phase with the amplified first RF signal.

In FIG. 10, the capacitance $C_{ds\_1}$ 1092, inductor $L_1$ 1016, and the capacitance $C_{ds\_2}$ 1094 form a CLC network (also referred to as a capacitor-inductor-capacitor network or a Pi network). The CLC network may serve as the output network for the first power transistor 1010. In an embodiment, the CLC network may perform both phase delay (e.g., an approximately 90 degree phase delay) and impedance transformation for the first power transistor 1010. Therefore, as previously explained with respect to FIG. 2, such CLC network capable of replicating the phase delay and impedance transformation functions of a transmission line that is one quarter wavelength long may also be referred to as a "quasi-transmission line" or "CLC quasi-transmission line."

In some scenarios, the capacitance $C_{ds\_1}$ 1092 and/or the capacitance $C_{ds\_2}$ 1094 may not be suitable for the CLC network to achieve the proper phase delay and/or impedance matching for some high frequency RF signals (e.g., RF signals with frequencies above 5.0 GHz). In these scenarios, at least some of the capacitance $C_{ds\_1}$ 1092 and/or some of the capacitance $C_{ds\_2}$ 1094 may be resonated out (e.g., reduced) to tune the CLC circuit to perform the proper phase delay and/or impedance matching for some high frequency RF signals. In an embodiment, the inductance of the inductor $L_{sh\_1}$ 1017 (e.g., the inductance of the second signal line 917) may be configured to resonate out (e.g., reduce) at least some of the capacitance $C_{ds\_1}$ 1092. In an embodiment, the inductance of the inductor $L_{sh\_2}$ 1025 (e.g., the inductance of the fourth signal line 925) may be configured to resonate out (e.g., reduce) at least some of the capacitance $C_{ds\_2}$ 1094.

In an embodiment, the first shunt DC blocking capacitor $C_{dc\_blk}$ 1056 and/or the second shunt DC blocking capacitor $C_{dc\_blk}$ 1028 may be used to further adjust the phase delay and impedance transformation of the CLC network. In one example, the capacitance of the first shunt DC blocking capacitor $C_{dc\_blk}$ 1056 and the inductance of the inductor $L_{sh\_1}$ 1017 may be configured to further adjust the phase delay and impedance transformation of the CLC network. In another example, the capacitance of the second shunt DC blocking capacitor $C_{dc\_blk}$ 1028 and the inductance of the inductor $L_{sh\_2}$ 1025 may be configured to further adjust the phase delay and impedance transformation of the CLC network. In an embodiment, the first shunt DC blocking capacitor $C_{dc\_blk}$ 1056 and/or the second shunt DC blocking capacitor $C_{dc\_blk}$ 1028 may provide an RF cold point (i.e., a node that functions as a virtual ground reference voltage for RF signals). For example, the node 1067 between the inductor $L_{sh\_1}$ 1017 and the first shunt DC blocking capacitor $C_{dc\_blk}$ 1056, and the node 1077 between the inductor $L_{sh\_2}$ 1025 and the second shunt DC blocking capacitor $C_{dc\_blk}$ 1028 may serve as RF cold points. In an embodiment, one or more RF cold points (e.g., at nodes 1067, 1077) may be used for baseband termination to improve video bandwidth. More specifically, a baseband termination circuit (e.g., comprising a series coupled inductor, capacitor, and resistor, not illustrated) may be coupled between each RF cold point node 1067, 1077 and ground.

Figure 12:
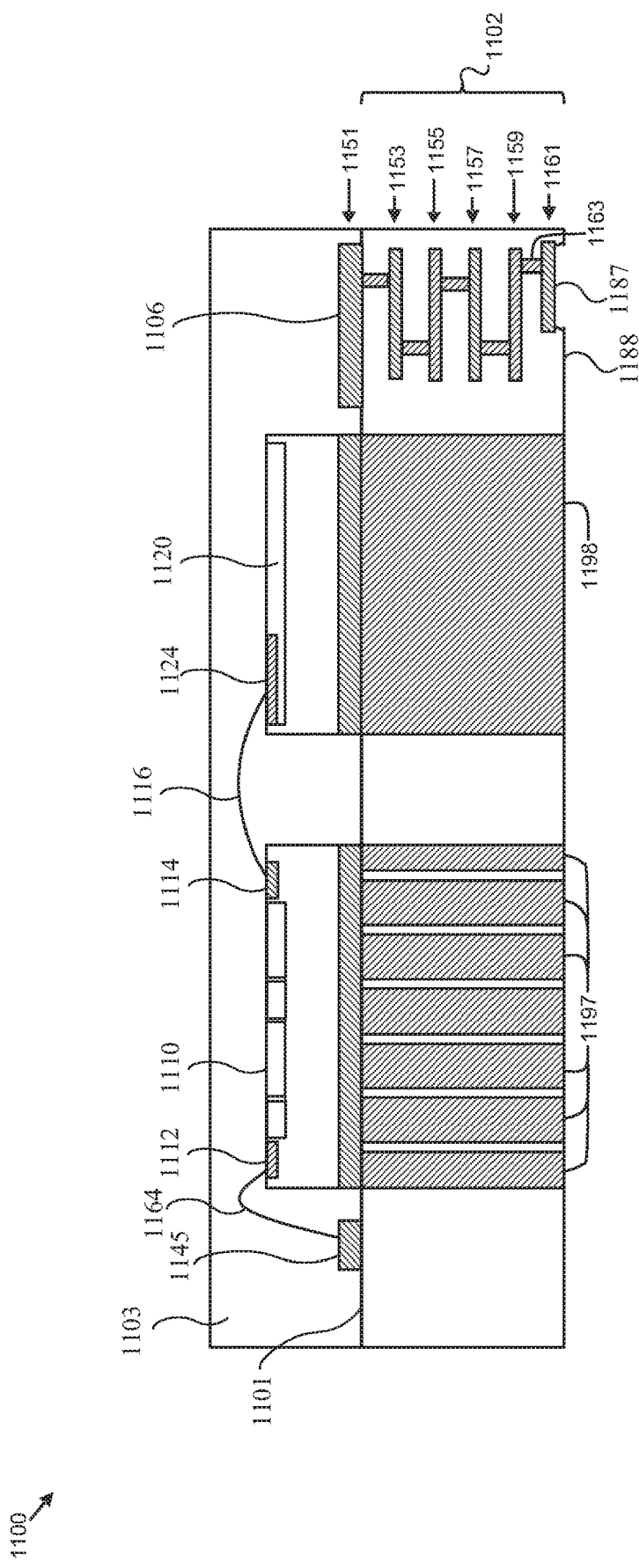
FIG. 12 depicts a cross-sectional, side view of the module of FIG. 11 along line 11-11.

As described with reference to FIGS. 11-13, in an embodiment, some of the inductors shown in FIG. 10 (e.g., inductor $L_1$ 1016, inductor $L_2$ 1060, inductor $L_{sh\_1}$ 1017) may be implemented using wirebonds (also referred to as bond wires or wirebond arrays). In an embodiment, the use of one or more wirebonds to obtain a desired inductance value may enhance the tuning and optimization flexibility of the Doherty amplifier circuits (e.g., Doherty amplifier circuit 900) described herein. In an embodiment, and as previously described, the inductance value of a wirebond can be controlled by selecting an appropriate height of the loop of the wirebond and/or the relative position of the wirebond on a bond pad of a device (e.g., first and second dies 910, 920). The wirebonds may achieve the lowest required inductance value for tuning a corresponding CLC network (e.g., the previously described CLC network including the capacitance $C_{ds\_1}$ 1092, inductor $L_1$ 1016, and the capacitance $C_{ds\_2}$ 1094) and may have low power loss characteristics. In an embodiment, some of the inductors shown in FIG. 10 (e.g., inductor $L_{sh\_2}$ 1025) may be implemented using at least one conductive trace configured as a meander line inductor or a planar spiral inductor.

An embodiment of a physical implementation of the two-way Doherty amplifier described with reference to FIGS. 9 and 10 will now be described in detail in conjunction with FIGS. 11 and 12. More specifically, FIG. 11 is a top view of a two-way Doherty amplifier module 1100, in accordance with an example embodiment. FIG. 11 should be viewed simultaneously with FIG. 12, which is a cross-sectional, side view of the Doherty amplifier module 1100 of FIG. 11 along line 11-11. Doherty amplifier module 1100 includes a substrate 1102, a power splitter 1140 (e.g., power splitter 940 in FIG. 9), a first amplifier die 1110 (e.g., first amplifier die 910, FIG. 9), a second amplifier die 1120 (e.g., second amplifier die 920, FIG. 9), and phase shift element 1108 (e.g., phase shift element 908 in FIG. 1). In an embodiment, the first amplifier die 1110 may be a carrier amplifier die and the second amplifier die 1120 may be a peaking amplifier die.

According to an embodiment, the Doherty amplifier module 1100 is implemented as a land grid array (LGA) module. Accordingly, the substrate 1102 has a component mounting surface 1101 and a land surface 1188. According to an embodiment, the substrate 1102 is relatively small, which provides for a particularly compact Doherty amplifier. For example, the component mounting surface 1101 may have a width (horizontal dimension in FIG. 11) and a length (vertical dimension in FIG. 11) in a range of about 5 millimeters (mm) to about 20 mm, although the width and/or length may be smaller or larger, as well. In a particular embodiment, for example, the component mounting surface may have a width of about 10 mm and a length of about 8 mm.

For example, the substrate 1102 may be a multi-layer organic substrate with a plurality of metal layers 1151, 1153, 1155, 1157, 1159, 1161, which are separated by dielectric material. According to an embodiment, the bottom metal layer 1161 is utilized to provide externally-accessible, conductive landing pads 1187, 1199 of the LGA, where the locations of some example landing pads 1187, 1199 are indicated with dashed boxes in FIG. 11. These landing pads 1187, 1189 (among others, not illustrated) enable surface mounting of the Doherty amplifier module 1100 onto a separate substrate (not illustrated) that provides electrical connectivity to other portions of an RF system. Although the Doherty amplifier module 1100 is depicted as an LGA module, the Doherty amplifier module 1100 alternatively may be packaged as a pin grid array module, a quad flat no leads (QFN) module, or another type of package.

One or more other metal layers (e.g., layers 1157, 1159) of the substrate 1102 may be used to convey DC voltages (e.g., DC bias voltages) and to provide a ground reference. Finally, still other layers (e.g., layers 1153, 1155) may be used to convey RF and other signals through the module 1100. Additionally, a patterned metal layer 1151 may be formed on the mounting surface 1101 of the substrate 1102. As will be discussed in more detail below, the patterned metal layer 1151 may include a plurality of conductive contacts 1104, 1106, 1113, 1115, 1145, 1152 on the mounting surface 1101, which facilitate electrical connections to dies and other components that may be mounted to the mounting surface 1101. Conductive vias (e.g., via 1163) provide for electrical connectivity between the metal layers 1151-1161.

Each of the amplifier dies 1110, 1120, may produce significant amounts of heat during operation. In addition, each of the amplifier dies 1110, 1120, also need access to a ground reference. Accordingly, in an embodiment, substrate 1102 also includes a plurality of electrically and thermally conductive trenches (e.g., trenches 1197, 1198) to which the amplifier dies 910, 920, are coupled (e.g., with solder, brazing material, silver sinter, or other die attach materials). The trenches (e.g., trenches 1197, 1198) extend through the substrate thickness in first-die and second-die mounting zones 1123, 1136 to provide heat sinks and ground reference access to the first and second amplifier dies 1110, 1120. For example, the conductive trenches 1197, 1198 may be filled with copper or another thermally and electrically conductive material. In alternate embodiments, the trenches 1197, 1198 may be replaced with conductive slugs (e.g., copper slugs) or with thermal vias.

Referring to the top view of module 1100 in FIG. 11, a plurality of non-overlapping zones are defined at the mounting surface 1101 of the substrate 1102. More specifically, the non-overlapping zones include an input signal zone 1107, a first-die mounting zone 1123, a second-die mounting zone 1136, and an output network zone 1143. Within the input signal zone 1107, a conductive landing pad 1104 exposed at the mounting surface 1101 is electrically coupled through the substrate 1102 to a conductive contact 1199 at the land surface 1188. The landing pad 1104 and contact 1199, along with the electrical connections between them, function as the RF input node (e.g., RF input node 904, FIG. 9) for the module 1100.

The power splitter 1140 (e.g., power splitter 940 in FIG. 9) is coupled to the mounting surface 1101 in the input signal zone 1107. According to an embodiment, the power splitter 1140 may include one or more discrete die and/or components, although it is represented in FIG. 11 as a single element. The power splitter 1140 includes an input terminal 1105 (e.g., input 942, FIG. 9) and two output terminals 1144, 1146 (e.g., outputs 944, 946 in FIG. 9). The input terminal 1105 is electrically coupled (e.g., through wirebonds, as shown, or through transmission lines) to conductive contact 1199 to receive an input RF signal. In addition, the output terminals 1144, 1146 are electrically coupled (e.g., through additional wirebonds, as shown) to conductive contacts 1145, 1113 at the mounting surface 1101. The power splitter 1140 is configured to split the power of the input RF signal received through input terminal 1105 into first and second RF signals, which are produced at the output terminals 1144, 1146. In some embodiments, the power splitter 1140 may consist of fixed-value, passive components, or the power splitter 1140 may include variable phase shifters and/or attenuators.

The first and second RF signals may have equal or unequal power, as discussed previously. The first RF signal produced at output terminal 1144 and conveyed to conductive contact 1145 is amplified through a first signal path, which includes a first amplifier die 1110 (e.g., die 910, FIG. 9) mounted within the first-die mounting zone 1123.

The illustrated embodiment of first amplifier die 1110 embodies a two-stage amplifier, which includes an RF input terminal 1112 (e.g., the RF input terminal 912 in FIG. 9), an input matching network 1170, a driver transistor 1171, an interstage matching network 1172, an output transistor 1173, and an RF output terminal 1114 (e.g., the RF output terminal 914 in FIG. 9). The driver and output transistors 1171, 1173 are coupled in series, where the driver transistor 1171 applies a relatively low gain to the first RF signal, and the output transistor 1173 applies a relatively high gain to the first RF signal after preliminary amplification by the driver transistor 1171. In other embodiments, the first amplifier die 1110 may embody a single stage amplifier, or may include more than two amplification stages. The signal path through the first amplifier die 1110 is in a direction extending from the RF input terminal 1112 to the RF output terminal 1114, which direction is indicated by arrow 311.

The amplified first RF signal is produced by the first amplifier die 1110 at the RF output terminal 1114. According to an embodiment, the RF output terminal 1114 is electrically coupled to the RF output terminal 1124 on the second amplifier die 1120 with a first wirebond array 1116 (e.g., a plurality of parallel, closely spaced wirebonds) and further electrically coupled to a conductive contact 1152 with second wirebond array 1117. As illustrated in FIG. 11, the wirebonds of the first wirebond array 1116 are aligned in the same direction as the signal path through the first amplifier die 1110 (i.e., in the direction indicated by arrow 311).

Through the first wirebond array 1116 and the RF output terminal 1124, the RF output terminal 1114 is electrically coupled to the second shunt DC blocking capacitor $C_{dc\_blk}$ 1128. Through the second wirebond array 1117 and the conductive contact 1152, the RF output terminal 1114 is electrically coupled to the first shunt DC blocking capacitor $C_{dc\_blk}$ 1156 (e.g., first shunt DC blocking capacitor 956).

Referring back to the power splitter 1140 in the input signal zone 1107, the second RF signal produced at output terminal 1146 of the power splitter 1140 and conveyed to conductive contact 1113 is amplified through a second amplifier path, which includes a phase shift element 1108

(e.g., phase shift element 908 in FIG. 9) and a second amplifier die 1120 (e.g., second amplifier die 920, FIG. 9) mounted within the second-die mounting zone 1136.

The illustrated embodiment of the second amplifier die 1120 also embodies a two-stage amplifier, which includes an RF input terminal 1122 (e.g., the RF input terminal 922 in FIG. 9), an input matching network 1174, a driver transistor 1175, an interstage matching network 1176, an output transistor 1177, a second shunt capacitor 1128 (e.g., second shunt DC blocking capacitor $C_{dc\_blk}$ 928 in FIG. 9), and an RF output terminal 1124 (e.g., the RF output terminal 924 in FIG. 9). The signal path through the second amplifier die 920 is in a direction extending from the RF input terminal 1122 to the RF output terminal 1124, which direction is indicated by arrow 331. As can be seen in FIG. 11, the signal paths through the first and second amplifier dies 1110, 1120 are substantially orthogonal (e.g., offset by approximately 90 degrees).

In some embodiments, the first and second amplifier dies 1110, 1120 are identical in size, rendering the Doherty amplifier module 1100 a symmetric Doherty amplifier. In an alternate embodiment, at least one of the first and second amplifier dies 1110, 1120 may have a different size relative to the other amplifier dies, rendering the Doherty amplifier module 1100 an asymmetric Doherty amplifier. For example, the second amplifier die 1120 may be larger than the first amplifier die 1110 by a ratio (e.g., 1.6:1, 2:1, or some other ratio).

In an embodiment, each amplifier die 1110, 1120 is rectangular in shape with parallel first and second sides, and parallel third and fourth sides extending between the first and second sides. In each amplifier die 1110, 1120, the RF input terminal 1112, 1122 is proximate to the first side of the die, and the RF output terminal 1114, 1124, is proximate to the second side of the die. In an embodiment, and as shown in FIG. 11, the second side of the first amplifier die 1120 is oriented orthogonally with respect to the second side of the second amplifier die 1120. Said another way, the second amplifier die 1120 is coupled to the mounting surface 1101 of the substrate 1102 so that the second amplifier die 1120 is orthogonal with respect to the first amplifier die 1110, rendering the RF signal path through the second amplifier die 1120 orthogonal to the RF signal path through the first amplifier die 1110.

The orthogonal orientation of the second amplifier die 1120 relative to the first amplifier die 1110 may significantly reduce electromagnetic coupling between the signal path of the second amplifier die 1120 and the signal path of the first amplifier die 1110. Given this reduction in electromagnetic coupling between the signal paths, the first and second amplifier dies 1110, 1120 may be positioned closer together than they could be with conventional parallel orientations, while still achieving acceptable performance.

The amplified second RF signal is produced by the second amplifier die 1120 at the RF output terminal 1124 (e.g., the RF output terminal 924 of the second amplifier die 920). According to an embodiment, the RF output terminal 1124 is electrically coupled to the conductive contact 1106 with a third wirebond array 1126 (e.g., a plurality of parallel, closely spaced wirebonds) and is further coupled to the second shunt capacitor 1128 (e.g., the second shunt DC blocking capacitor $C_{dc\_blk}$ 928 in FIG. 9). As illustrated in FIG. 11, the wirebonds of the third wirebond array 1126, are aligned in the same direction as the signal path through the second amplifier die 1120 (i.e., in the direction indicated by arrow 331). In an embodiment, as shown in FIG. 11, the RF output terminal 1124 may be coupled to the second shunt capacitor 1128 (e.g., the second shunt DC blocking capacitor $C_{dc\_blk}$ 928 in FIG. 9) via one or more meander line inductors 1125 and a conductive contact 1133. In other embodiments, the meander line inductors 1125 may be replaced with a planar spiral inductor.

As illustrated in FIG. 11, the orthogonal arrangement of the first wirebond array 1116 relative to the third wirebond array 1126 may significantly reduce electromagnetic coupling of RF signals carried through the first and third wirebond arrays 1116, 1126. Therefore, the first and second amplifier dies 1110, 1120 may be positioned relatively close together.

In an embodiment, during operation of the module 1100, the RF output terminal 1124 may combine (e.g., sum) the amplified first RF signal with the second amplified RF signal to produce an amplified RF output signal. The amplified RF output signal at the RF output terminal 1124 may be provided to the conductive contact 1106 via the third wirebond array 1126, and then provided to the load (e.g., load 962 in FIG. 9) via the conductive landing pad 1187.

Although not illustrated in FIG. 11, module 1100 also includes bias circuitry configured to provide gate and drain bias voltages to some or all of the driver and output transistors 1171, 1173, 1175, 1177. For example, the bias circuitry may include, among other things, a plurality of landing pads (at the land surface 1188 of the substrate 1102), contacts (at the mounting surface 1101 of the substrate 1102), and other conductive structures and circuitry. Bias voltages provided to the gates and/or drains of the transistors 1171, 1173, 1175, 1177 facilitate Doherty operation of the module 1100. For example, the transistors 1171, 1173 of the first amplifier die 1110 may be biased to operate in class AB mode, and the transistors 1175, 1177 of the second amplifier die 1120 may be biased to operate in class C mode.

According to an embodiment, all of the components mounted to the mounting surface 1101 of the substrate 1102 are encapsulated with non-conductive encapsulation material 1103 (FIG. 11). In an alternate embodiment, the components could be contained within an air cavity, which is defined by various structures (not illustrated) overlying the mounting surface 1101. The first and second amplifier dies 1110, 1120 may be implemented using various types of semiconductor substrates and transistors as previously described with respect to the first, second, and third amplifier dies 310, 320, 330 in FIG. 3.

Various modifications may be made to module 1100 without departing from the scope of the inventive subject matter. For example, although substrate 1102 is depicted, in FIG. 12, to include five metal layers 1153-1161, substrates that include more or fewer metal layers alternatively may be used. In addition, other types of substrates alternatively could be used, including ceramic substrates or other types of substrates. Further, alternate embodiments may include a power splitter and/or amplifier die that are configured as flip-chips. In addition, the first and second amplifier dies 1110, 1120 may include single stage amplifiers, or two distinct amplifier die (one driver amplifier die and one output amplifier die) may be implemented along each path 311, 331. In addition to the above, the module 1100 also may include various discrete and/or integrated components (e.g., capacitors, inductors, and/or resistors) electrically coupled to phase shift element 1108 to provide a desired phase delay (e.g., an approximately 90 degree phase shift).

Figure 13:
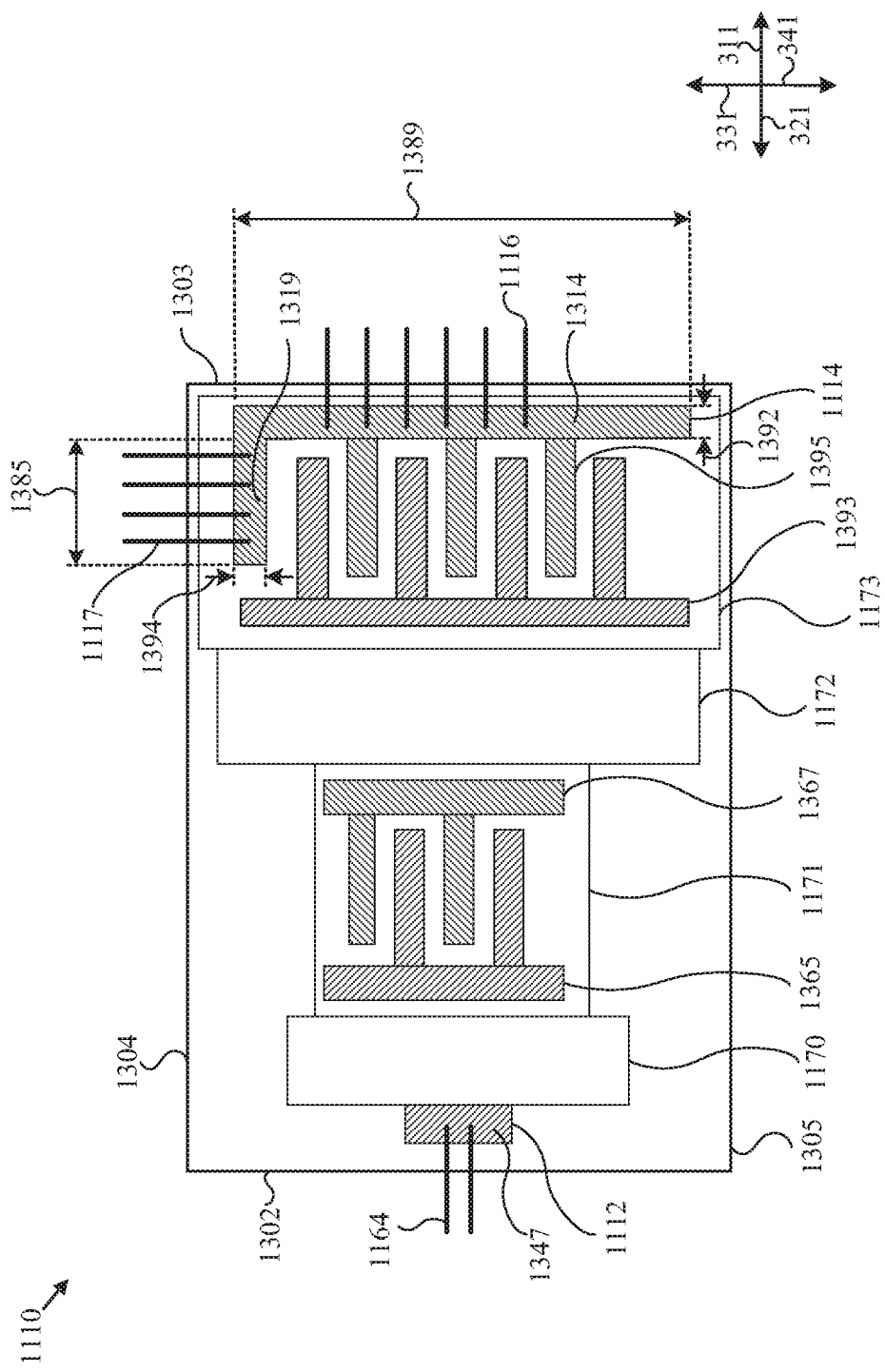
FIG. 13 depicts an enlarged top view of a first amplifier die in accordance with various embodiments of the disclosure.

FIG. 13 depicts an enlarged top view of the first amplifier die 1110. As discussed previously in conjunction with FIG. 11, the electrical components of the first amplifier die 1110 include RF input terminal 1112, an input matching network 1170, a driver transistor 1171, an interstage matching network 1172, an output transistor 1173, and an RF output terminal 1114. The first amplifier die 1110 may have parallel first and second die sides 1302, 1303, and parallel third and fourth die sides 1304, 1305 that extend between the first and second die sides 1302, 1303.

According to an embodiment, the RF input terminal 1112 is configured to enable an array or plurality of wirebonds 1164 to be coupled in parallel with each other to the RF input terminal 1112 so that the wirebonds 1164 extend in a direction (e.g., direction 311) that is parallel with the direction of the signal path through the first amplifier die 1110 (e.g., direction 311). More specifically, the RF input terminal 1112 includes an elongated, conductive pad 1347 that is proximate to the first side 1302 of the first amplifier die 1110, and that has a length that extends in parallel with the first side 1302 of the first amplifier die 1110. According to an embodiment, the length of the pad 1347 is large enough to enable a plurality of wirebonds (e.g., from 2 to 10 or more) to be connected in parallel with each other along the length of the pad 1347. As shown in FIG. 13, the length of the pad 1347 is large enough to enable the plurality of wirebonds 1164 to be connected so that they can extend in a perpendicular direction from side 1302.

The RF input terminal 1112 of the first amplifier die 1110 is electrically coupled to the gate terminal 1365 of transistor 1171 through input matching network 1170, and the drain terminal 1367 of transistor 1171 is electrically coupled to the gate terminal 1393 of transistor 1173 through inter-stage matching network 1172. Accordingly, the signal path through the first amplifier die 1110 is in a direction extending from the first side 1302 toward the second side 1303, or from the RF input terminal 1112 toward the RF output terminal 1114, which direction is indicated by arrow 311.

In FIG. 13, the RF output terminal 1114 includes an elongated main pad 1314 and a first set of wirebonds 1116 connected in parallel with respect to one another along the length 1389 of the elongated main pad 1314. The RF output terminal 1114 further includes a side pad 1319 and a second set of wirebonds 1117 connected in parallel with respect to one another along the length 1385 of the side pad 1319. In FIG. 13, the set of wirebonds 1116 includes six wirebonds. In alternate embodiments, the length 1389 may be sufficient to enable more (e.g., seven or more) wirebonds to be connected in parallel along the length 1389 of the elongated main pad 1314. According to an embodiment, the length 1389 may be in a range of about 800 microns to about 1800 microns, or more desirably in a range of about 800 microns to about 1400 microns, although the length may be smaller or larger, as well. In some embodiments, the widths 1392 and 1394 may be approximately equal. For example, the widths 1392, 1394 may each be in a range of about 100 microns to about 150 microns. In other examples, the widths 1392, 1394 may be smaller than 100 microns or larger than 150 microns. The elongated main pad 1314 is proximate to the second die side 1303 of the first amplifier die 1110, in an embodiment.

The driver and output transistors 1171, 1173 are coupled in series between the RF input and output terminals 1112, 1114, where the driver transistor 1171 is configured to apply a relatively low gain to the first RF signal (e.g., carrier signal), and the output transistor 1173 is configured to apply a relatively high gain to the first RF signal after preliminary amplification by the driver transistor 1171. In the illustrated embodiment, each of transistors 1171, 1173 includes interdigitated source and drain "fingers" (i.e., elongated source regions and drain regions in and proximate to the top surface of the first amplifier die 1110), with gate terminals 1365, 1393 (control terminals) interdigitated with the source and drain fingers. Each of the gate terminals 1365, 1393 consists of a set of elongated conductive gate terminal fingers and a common conductive gate bar interconnecting the gate terminal fingers. Drain terminals 1114, 1367 (current conducting terminals) convey current from the drain regions of the transistors 1171, 1173). Similar to the gate terminals 1365, 1393, each drain terminal 1114, 1367 may consist of a set of elongated conductive drain terminal fingers (interdigitated with the gate terminal fingers), along with a common conductive drain bar interconnecting the drain terminal fingers. Although various numbers of gate and drain fingers are illustrated in FIG. 13, a device may include more or fewer fingers, and/or the transistors may have structures other than the interdigitated finger structures discussed herein.

Figure 14:
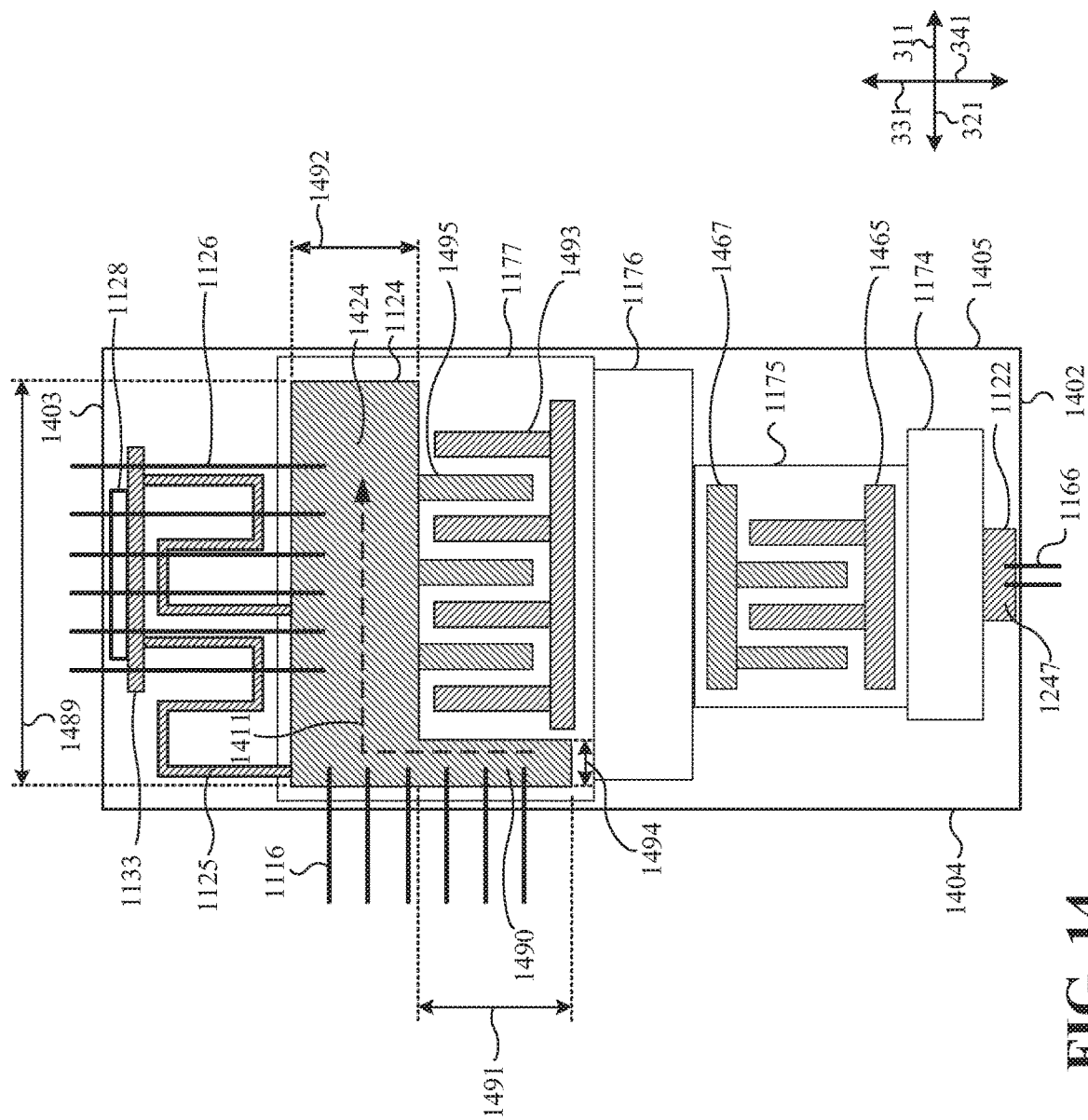
FIG. 14 depicts an enlarged top view of a second amplifier die in accordance with various embodiments of the disclosure.

FIG. 14 is an enlarged top view of the second amplifier die 1120. As discussed previously in conjunction with FIG. 11, the electrical components of the second amplifier die 1120 include RF input terminal 1122, an input matching network 1174, a driver transistor 1175, an interstage matching network 1176, an output transistor 1177, and an RF output terminal 1124. The second amplifier die 1120 may have parallel first and second die sides 1402, 1403, and parallel third and fourth die sides 1404, 1405 that extend between the first and second die sides 1402, 1403.

According to an embodiment, the RF output terminal 1124 has an "L" shape, as shown in FIG. 14, which includes first and second, orthogonally-arranged pads 1424, 1490. Specifically, the RF output terminal 1124 is uniquely configured to enable an array or plurality of wirebonds 1116 to be coupled in parallel with each other to the RF output terminal 1124 so that the wirebonds 1116 extend in a direction (e.g., direction 321) that is orthogonal to (e.g., perpendicular to) the direction of the signal path through the second amplifier die 1120 (e.g., direction 331). More specifically, the RF output terminal 1124 includes an elongated, conductive side pad 1490 that is proximate to the third die side 1404 of the second amplifier die 1120, and that has a length 1491 that extends in parallel with the third die side 1404 of the second amplifier die 1120. According to an embodiment, the length 1491 of the side pad 1490 is large enough to enable a plurality of wirebonds (e.g., from 2 to 10 or more) to be connected in parallel with each other along the first length of the side pad 1490. As shown in FIG. 14, the length 1491 of the side pad 1490 is large enough to enable the plurality of wirebonds 1116 to be connected so that they can extend in a perpendicular direction from the third die side 1404.

In an embodiment, the side pad 1490 has a width 1494 that is greater than the width 1394 of the side pad 1319 of the output bond pad (e.g., the RF output terminal 1114) of the first amplifier die 1110. For example, the width 1494 of the side pad 1490 may provide a widened current path (e.g., relative to the current path provided by the width 1394 of the side pad 1319) that minimizes (or significantly reduces) the additional inductance and losses that may be introduced by the lateral current 1411 flowing from the wirebonds 1116 to the wirebonds 1126. The width 1494 may also be sufficient to enable at least one row of wirebonds 1116 to be coupled to the side pad 1490. For example, the width 1494 may be in a range of about 150 microns to about 300 microns, although the width 1494 may be smaller or larger, as well.

In addition to the side pad 1490, the RF output terminal 1124 may include an elongated main pad 1424, which is electrically coupled to the side pad 1490. The first and second pads 1424, 1490 may form portions of a single pad (e.g., an L-shaped pad, as shown), or the first and second pads 1424, 1490 may be separate pads. Either way, the elongated main pad 1424 is proximate to the second die side 1403 of the second amplifier die 1120, in an embodiment, and the elongated main pad 1424 has a length 1489 that extends in parallel with the second die side 1403. According to an embodiment, the side pad 1490 and the elongated main pad 1424 have lengths 1491, 1489 that are perpendicular to each other. The length 1489 of the elongated main pad 1424 is large enough to enable a second plurality of wirebonds 1126 to be connected in parallel along the length 1489 of the elongated main pad 1424. As shown in FIG. 14, the length 1489 of the elongated main pad 1424 is large enough to enable the plurality of wirebonds 1126 to be connected so that they can extend in a perpendicular direction from the second die side 1403. FIG. 14 shows six wirebonds 1126 connected in parallel with each other. In alternate embodiments, the length 1489 may be sufficient to enable more (e.g., seven or more) wirebonds to be connected in parallel along the length 1489 of the elongated main pad 1424. According to an embodiment, the length 1489 may be in a range of about 800 microns to about 1800 microns, or more desirably in a range of about 800 microns to about 1400 microns, although the length may be smaller or larger, as well.

In an embodiment, the elongated main pad 1424 has a width 1492 that is greater than the width 1392 of the elongated main pad 1314 of the output bond pad (e.g., the RF output terminal 1114) of the first amplifier die 1110. For example, the width 1492 of the elongated main pad 1424 may provide a widened current path (e.g., relative to the current path provided by the width 1392 of the elongated main pad 1314) that minimizes or significantly reduces the additional inductance and losses that may be introduced by the flow of lateral current 1411 from the wirebonds 1116 to the wirebonds 1126. In one embodiment, the reduced inductance of the elongated main pad 1424 resulting from the width 1492 may enable realization of a CLC network with a sufficiently low inductance 1016. The width 1492 may also be sufficient to enable at least one row of wirebonds 1126 to be coupled to the elongated main pad 1424. For example, the width 1492 may be in a range of about 100 microns to about 500 microns, although the width may be smaller or larger, as well.

As the above description makes clear, the bond pad 1124 may function as a combining node (e.g., node 924, 1024, FIGS. 9, 10) for amplified RF signals from amplifier dies 1110, 1120. In other embodiments, the pads 1424, 1490 implementing the first bond pad 1424 may be separate pads that are electrically coupled together to function as the combining node.

In an embodiment, the second shunt inductive network may include the meander line inductors 1125 and one or more shunt DC blocking capacitors 1128. Since the one or more meander line inductors 1125 (e.g., the inductor $L_{sh\_2}$ 1025 in FIG. 10) of the second shunt inductive network may be integrated with the elongated main pad 1424, lateral currents (e.g., the lateral current 1411) may be avoided. As a result, the one or more meander line inductors 1125 may achieve an inductance low enough to resonate out (e.g., reduce) at least some of the excess internal drain-source capacitance of the output transistor 1177 (e.g., capacitance $C_{ds\_2}$ 1094 in FIG. 10). In an embodiment, the meander line inductors 1125 may be situated on a plane that is perpendicular to the wirebonds 1126, which may reduce electromagnetic coupling between the meander line inductors 1125 and the wirebonds 1126.

The RF input terminal 1122 of the second amplifier die 1120 is electrically coupled to the gate terminal 1465 of transistor 1175 through input matching network 1174, and the drain terminal 1467 of transistor 1175 is electrically coupled to the gate terminal 1493 of transistor 1177 through inter-stage matching network 1176. Accordingly, the signal path through the second amplifier die 1120 is in a direction extending from the first die side 1402 toward the second die side 1403, or from the RF input terminal 1122 toward the RF output terminal 1124, which direction is indicated by arrow 331.

The driver and output transistors 1175, 1177 are coupled in series between the RF input terminal 1122 and the RF output terminal 1124, where the driver transistor 1175 is configured to apply a relatively low gain to the second RF signal (e.g., second peaking signal), and the output transistor 1177 is configured to apply a relatively high gain to the second RF signal after preliminary amplification by the driver transistor 1175. In the illustrated embodiment, each of transistors 1175, 1177 includes interdigitated source and drain "fingers" (i.e., elongated source regions and drain regions in and proximate to the top surface of the second amplifier die 1120), with gate terminals 1465, 1493 (control terminals) interdigitated with the source and drain fingers. Each of the gate terminals 1465, 1493 consists of a set of elongated conductive gate terminal fingers and a common conductive gate bar interconnecting the gate terminal fingers. Drain terminals 1124, 1467 (current conducting terminals) convey current from the drain regions of the transistors 1177, 1175). Similar to the gate terminals 1465, 1493, each drain terminal 1124, 1467 may consist of a set of elongated conductive drain terminal fingers (interdigitated with the gate terminal fingers), along with a common conductive drain bar interconnecting the drain terminal fingers. Although various numbers of gate and drain fingers are illustrated in FIG. 14, a device may include more or fewer fingers, and/or the transistors may have structures other than the interdigitated finger structures discussed herein.

First Example Doherty Amplifier Module

In an embodiment, a three-way Doherty amplifier module (e.g., Doherty amplifier module 100, 300) includes a substrate having a mounting surface, a carrier amplifier die (e.g., carrier amplifier die 110, 310) on the mounting surface, a first peaking amplifier die (e.g., peaking amplifier die 120, 320) on the mounting surface, and a second peaking amplifier die (e.g., peaking amplifier die 130, 330) on the mounting surface. The carrier amplifier die includes a first output bond pad (e.g., RF output terminal 314) that has a first length (e.g., length 589) and a first width (e.g., width 592).

The first peaking amplifier die has substantially parallel first and second sides (e.g., first die side 602, second die side 603), and substantially parallel third and fourth sides (e.g., third die side 604, fourth die side 605). The first peaking amplifier die includes a second output bond pad (e.g., RF output terminal 324) proximate to the second side, where the second output bond pad includes a first main pad portion (e.g., elongated main pad 624) and a first side pad portion (e.g., side pad 690). The first main pad portion has a second length (e.g., length 689) that extends parallel with the second side and a second width (e.g., width 692) that extends orthogonal to the second side. The first side pad portion has a third length (e.g., length 691) that extends orthogonal to the second side and a third width (e.g., width 694) that extends parallel with the second side. At least one of the second width or the third width is greater than the first width (e.g., 592).

The second peaking amplifier die has substantially parallel fifth and sixth sides (e.g., fifth die side 702, sixth die side 703) and substantially parallel seventh and eighth sides (e.g., seventh die side 704, eighth die side 705). The fifth and sixth sides of the second peaking amplifier die are substantially parallel with the third and fourth sides of the first peaking amplifier die. The second peaking amplifier die includes a third output bond pad (e.g., RF output terminal 334) proximate to the sixth side, where the third output bond pad has a fourth length (e.g., length 789) that extends parallel with the sixth side and a fourth width (e.g., width 796) that extends orthogonal to the sixth side.

The three-way Doherty amplifier module further includes a first wirebond array (e.g., wirebond array 336) coupled between the third output bond pad of the second peaking amplifier die and at least the first side pad portion (e.g., side pad 690) of the second output bond pad of the first peaking amplifier die.

In some embodiments, the carrier amplifier die includes a first power transistor, the first peaking amplifier die includes a second power transistor and the second peaking amplifier die includes a third power transistor. The drain-source capacitance of the third power transistor (e.g., the capacitance $C_{ds\_3}$ 296), a line inductance (inductor $L_3$ 236) that includes a first inductance of the first wirebond array and a second inductance of the second output bond pad (e.g., inductance of the RF output terminal 324), and the drain-source capacitance of the second power transistor (e.g., the capacitance $C_{ds\_2}$ 294) may form a quasi-transmission line configured to perform a phase delay and an impedance transformation for an amplified radio frequency (RF) signal provided at the third output bond pad (e.g., RF output terminal 334) on the second peaking amplifier die. The second width (e.g., width 692) and/or the third width (e.g., width 694) is configured to reduce the second inductance of the second output bond pad (e.g., RF output terminal 324). For example, the second width and/or the third width enables the total line inductance (e.g., the sum of the first inductance of the first wirebond array (e.g., inductor $L_3$ 236) and the second inductance of the second output bond pad (e.g., inductance of the RF output terminal 324)) to be less than 300 pH.

In some embodiments, a second wirebond array (e.g., wirebond array 326) is coupled between the main pad portion of the second output bond pad and a signal combining bond pad (e.g., the first bond pad 352) external to the carrier amplifier die, the first peaking amplifier die, and the second peaking amplifier die. The second wirebond array is configured to provide a combined RF signal comprising a first amplified RF signal from the first peaking amplifier die and a second amplified RF signal from the second peaking amplifier die to the signal combining bond pad. The second wirebond array is orthogonal to the first wirebond array.

In some embodiments, the second peaking amplifier die further includes one or more shunt DC blocking capacitors (e.g., shunt DC blocking capacitors 338) coupled to a bond pad (e.g., bond pad 382) on the second peaking amplifier die. The third output bond pad includes a second main pad portion (e.g., elongated main pad 734) and a second side pad portion (e.g., side pad 790), where the second main pad portion has the fourth length (e.g., length 789) and the fourth width (e.g., width 796), the second side pad portion has a fifth length (e.g., length 791) that extends orthogonal to the fifth side and a fifth width (e.g., width 794), that extends parallel with the fifth side. The fourth width and/or the fifth width is greater than the first width (e.g., width 592).

In some embodiments, another wirebond array (e.g., wirebond array 335) is coupled between the second side pad portion (e.g., side pad 790) of the second output bond pad and the bond pad (e.g., bond pad 382). The second wirebond array is orthogonal to the first wirebond array (e.g., wirebond array 336). In some embodiments, the fourth width and/or the fifth width is configured to reduce the inductance of the third output bond pad.

In some embodiments, the carrier amplifier die includes ninth and tenth substantially parallel sides (e.g., ninth die side 502, tenth die side 503), where the first output bond pad is proximate to the tenth side. In some embodiments, the carrier amplifier die is configured to amplify a first RF signal along a first signal path to produce a first amplified RF signal at the first output bond pad, the first signal path extending from the ninth side to the tenth side of the carrier amplifier die. In some embodiments, the first peaking amplifier die is configured to amplify a second RF signal along a second signal path to produce a second amplified RF signal at the second output bond pad. The second signal path extends from the first side of the first peaking amplifier die to the second side of the first peaking amplifier die. In some embodiments, the second peaking amplifier die is configured to amplify a third RF signal along a third signal path to produce a third amplified RF signal at the third output bond pad, the third signal path extending from the fifth side of the second peaking amplifier die to the sixth side of the second peaking amplifier die. The third signal path is orthogonal to the first and second signal paths.

In some embodiments, the first side pad portion (e.g., side pad 690) of the second output bond pad is proximate to the third side (e.g., third die side 604) of the first peaking amplifier die. In these embodiments, the sixth side (e.g., sixth die side 703) of the second peaking amplifier die faces the third side (e.g., third die side 604) of the first peaking amplifier die.

Second Example Doherty Amplifier Module

In an embodiment, a two-way Doherty amplifier module (e.g., Doherty amplifier module 900, 1100) includes a substrate having a mounting surface, a carrier amplifier die (e.g., carrier amplifier die 910, 1110) on the mounting surface, and a peaking amplifier die (e.g., peaking amplifier die 920, 1120) on the mounting surface. The carrier amplifier die has substantially parallel first and second sides (e.g., first die side 1302, second die side 1303), and substantially parallel third and fourth sides (e.g., third die side 1304, fourth die side 1305). The carrier amplifier die includes a first output bond pad (e.g., RF output terminal 1114) proximate to the second side. The first output bond pad includes a first main pad portion (e.g., elongated main pad 1314) and a first side pad portion (e.g., side pad 1319). The first main pad portion has a first length (e.g., length 1389) that extends parallel with the second side and a first width (e.g., width 1392) that extends orthogonal to the second side. The first side pad portion has a second length (e.g., length 1385) that extends orthogonal to the second side and a second width (e.g., length 1394) that extends parallel with the second side.

The peaking amplifier die has substantially parallel fifth and sixth sides (e.g., first die side 1402, second die side 1403), and substantially parallel seventh and eighth sides (e.g., third die side 1404, fourth die side 1405). The fifth and sixth sides of the peaking amplifier die are substantially parallel with the third and fourth sides of the carrier amplifier die. The peaking amplifier die includes a second output bond pad (e.g., RF output terminal 1124) proximate to the sixth side. The second output bond pad includes a second main pad portion (e.g., elongated main pad 1424) and a second side pad portion (e.g., side pad 1490). The second main pad portion has a third length (e.g., length 1489) that extends parallel with the sixth side and a third width (e.g., width 1492) that extends orthogonal to the sixth side. The second side pad portion has a fourth length (e.g., length 1491) that extends orthogonal to the sixth side and a fourth width (e.g., width 1494) that extends parallel with the sixth side. The third width is greater than the first width and/or the fourth width is greater than the second width.

The two-way Doherty amplifier module further includes a first wirebond array (e.g., wirebond array 1116) coupled between the first output bond pad (e.g., elongated main pad 1314) of the carrier amplifier die and at least the second side pad portion (e.g., side pad 1490) of the peaking amplifier die.

In some embodiments, the carrier amplifier die includes a first power transistor and the peaking amplifier die includes a second power transistor. A drain-source capacitance of the first power transistor (e.g., the capacitance $C_{ds\_1}$ 1092), a line inductance (inductor $L_1$ 1016) that includes a first inductance of the first wirebond array and a second inductance of the second output bond pad (e.g., inductance of the RF output terminal 1124), and a drain-source capacitance of the second power transistor (e.g., the capacitance $C_{ds\_2}$ 1094) form a quasi-transmission line configured to perform a phase delay and an impedance transformation for an amplified RF signal provided at the first output bond pad (e.g., RF output terminal 1114). The third width and/or the fourth width is configured to reduce the second inductance of the second output bond pad (e.g., inductance of the RF output terminal 1124). For example, the third width and/or the fourth width enables the total line inductance (e.g., the sum of the first inductance of the first wirebond array and the second inductance of the second output bond pad (e.g., inductance of the RF output terminal 1124)) to be less than 300 pH.

In some embodiments, the two-way Doherty amplifier module includes a second wirebond array (e.g., wirebond array 1126) coupled between the second main pad portion of the second output bond pad and a conductive contact (e.g., conductive contact 1106) on the mounting surface. The second wirebond array provides an amplified RF output signal of the Doherty amplifier module to the conductive contact. The second wirebond array (e.g., wirebond array 1126) is orthogonal to the first wirebond array (e.g., wirebond array 1116).

In some embodiments, the peaking amplifier die includes one or more shunt DC blocking capacitors (e.g., second shunt DC blocking capacitor 1028, 1128). The one or more shunt DC blocking capacitors are coupled to the second main pad portion (e.g., elongated main pad 1424) of the second output bond pad via at least one conductive trace (e.g., meander line inductor 1125) on the peaking amplifier die. In some embodiments, the conductive trace may be configured as a meander line inductor or a planar spiral inductor.

In some embodiments, the carrier amplifier die is configured to amplify a first RF signal along a first signal path (e.g., indicated by arrow 911) to produce a first amplified RF signal at the first output terminal. The first signal path extends from the first side of the carrier amplifier die to the second side of the carrier amplifier die. The peaking amplifier die is configured to amplify a second RF signal along a second signal path (e.g., indicated by arrow 921) to produce a second amplified RF signal at the second output bond pad. The second signal path extends from the fifth side of the peaking amplifier die to the sixth side of the peaking amplifier die. The first signal path is substantially orthogonal to the second signal path.

In some embodiments, the second side pad (e.g., side pad 1490) portion of the second output bond pad is proximate to the seventh side (e.g., third die side 1404) of the peaking amplifier die. In these embodiments, the second side (e.g., second die side 1303) of the carrier amplifier die faces the seventh side of the peaking amplifier die.

Therefore, in the aspects described herein, one or more peaking amplifier dies in a Doherty amplifier module may have enlarged output bond pads (e.g., output bond pads having an enlarged main pad portion and/or an enlarged side pad portion) relative to the output bond pads of a carrier amplifier die. The enlarged output bond pads of the one or more peaking amplifier dies may reduce the inductance of these output bond pads. For example, the inductance may be reduced due to the widened current paths (e.g., provided by the enlarged output bond pads), which may minimize or significantly reduce lateral currents in the enlarged output bond pads. By reducing the inductance of the output bond pads of the one or more peaking amplifier dies, the low inductance values required by the CLC quasi-transmission lines and shunt inductive networks in the disclosed Doherty amplifier modules may be physically realized (e.g., using the low inductance provided by wirebonds, meander line inductors, etc.). The widened current paths of the enlarged output bond pads of the one or more peaking amplifier dies may increase the quality factor (Q) of the inductors (e.g. $L_3$ 236, $L_{sh\_3}$ 235) implemented in the disclosed Doherty amplifier modules, which may reduce loss and improve performance. For example, the inductance of the enlarged output bond pads may be reduced by more than 100 pH and the Q value of the inductors in the disclosed Doherty amplifier modules may be improved by 15 in some implementations.

Figure 15A:
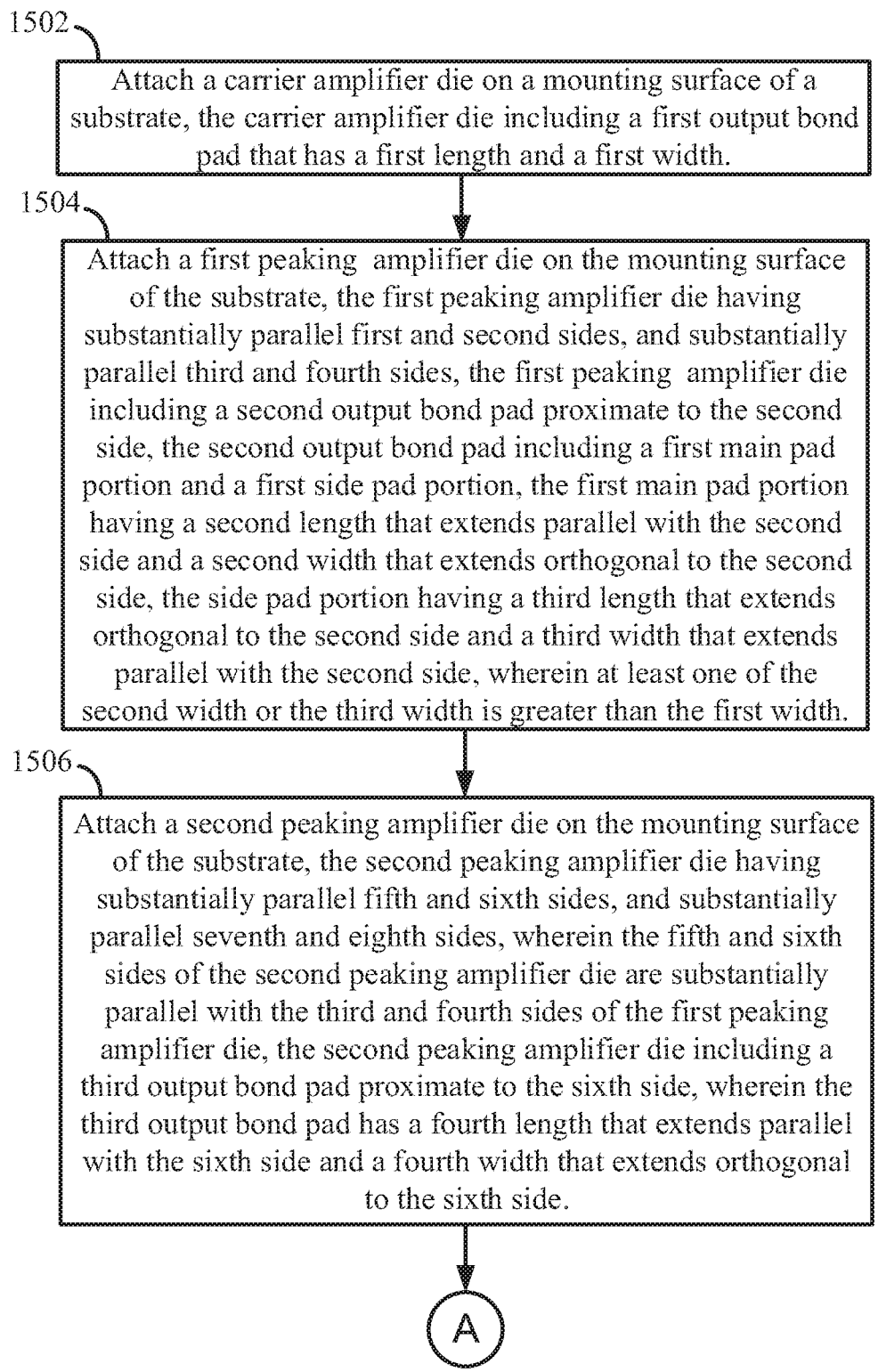
FIG. 15 (including FIGS. 15A and 15B) is a flowchart of a method for fabricating a Doherty amplifier module in accordance with various embodiments of the disclosure.
Figure 15B:
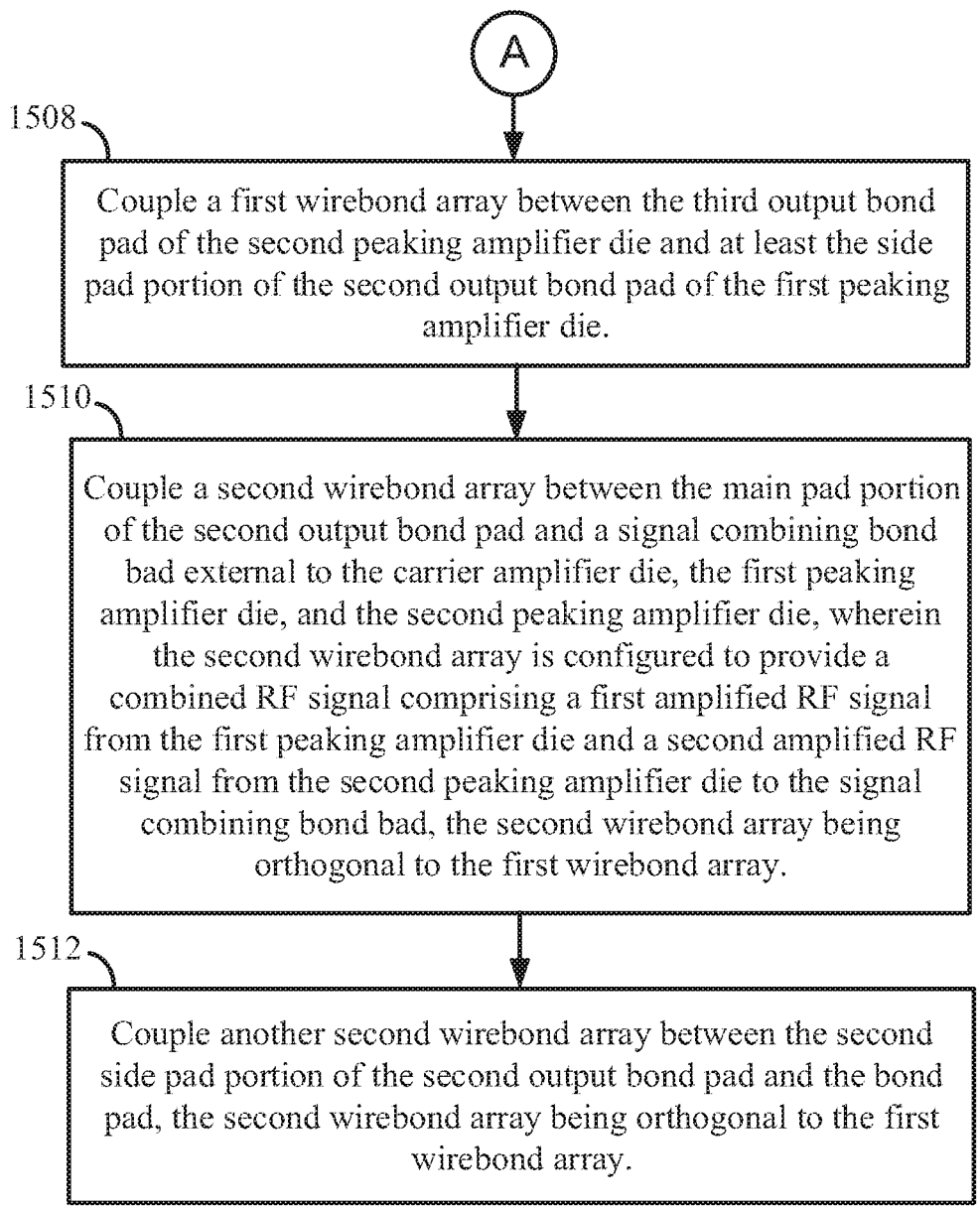

FIG. 15 (including FIGS. 15A and 15B) is a flow diagram of a method for fabricating a Doherty amplifier module (e.g., Doherty amplifier module 300, FIG. 3), in accordance with an example embodiment. With reference to FIG. 15A, at block 1502, the method involves attaching a carrier amplifier die (e.g., carrier amplifier die 110, 310) on or over a mounting surface of a substrate. The carrier amplifier die includes a first output bond pad (e.g., RF output terminal 314) that has a first length (e.g., length 589) and a first width (e.g., width 592).

At block 1504, the method involves attaching a first peaking amplifier die (e.g., peaking amplifier die 120, 320) on or over the mounting surface of the substrate. The first peaking amplifier die has substantially parallel first and second sides (e.g., first die side 602, second die side 603), and substantially parallel third and fourth sides (e.g., third die side 604, fourth die side 605). The first peaking amplifier die includes a second output bond pad (e.g., RF output terminal 324) proximate to the second side, the second output bond pad including a first main pad portion (e.g., elongated main pad 624) and a first side pad portion (e.g., side pad 690). The first main pad portion has a second length (e.g., side pad 690) that extends parallel with the second side and a second width (e.g., width 692) that extends orthogonal to the second side. The first side pad portion has a third length (e.g., length 691) that extends orthogonal to the second side and a third width (e.g., width 694) that extends parallel with the second side. At least one of the second width or the third width is greater than the first width (e.g., width 592).

At block 1506, the method involves attaching a second peaking amplifier die (e.g., peaking amplifier die 130, 330) on or over the mounting surface of the substrate. The second peaking amplifier die has substantially parallel fifth and sixth sides (e.g., fifth die side 702, sixth die side 703), and substantially parallel seventh and eighth sides (e.g., seventh die side 704, eighth die side 705). The fifth and sixth sides of the second peaking amplifier die are substantially parallel with the third and fourth sides of the first peaking amplifier die. The second peaking amplifier die includes a third output bond pad (e.g., RF output terminal 334) proximate to the sixth side. The third output bond pad has a fourth length (e.g., length 789) that extends parallel with the sixth side and a fourth width (e.g., width 796) that extends orthogonal to the sixth side.

With reference to FIG. 15B, at block 1508, the method involves coupling a first wirebond array (e.g., wirebond array 336) between the third output bond pad (e.g., RF output terminal 334) of the second peaking amplifier die and at least the first side pad portion (e.g., side pad 690) of the second output bond pad of the first peaking amplifier die. In an embodiment, the carrier amplifier die includes a first power transistor, the first peaking amplifier die includes a second power transistor and the second peaking amplifier die includes a third power transistor. A drain-source capacitance of the third power transistor (e.g., the capacitance $C_{ds\_3}$ 296), a line inductance (e.g. $L_3$ 236) that includes a first inductance of the first wirebond array and a second inductance of the second output bond pad (e.g., inductance of the RF output terminal 324), and the drain-source capacitance of the second power transistor (e.g., the capacitance $C_{ds\_2}$ 294) may form a quasi-transmission line configured to perform a phase delay and an impedance transformation for an amplified RF signal provided at the third output bond pad on the second peaking amplifier die. The at least one of the second width or the third width is configured to reduce the second inductance of the second output bond pad. In other embodiments, all or portions of the conductive path provided by the first wirebond array alternatively may be implemented using conductive traces on or within the substrate to which the amplifier dies are attached.

At block 1510, the method involves coupling a second wirebond array (e.g., wirebond array 326) between the main pad portion of the second output bond pad and a signal combining bond pad (e.g., the first bond pad 352) external to the carrier amplifier die, the first peaking amplifier die, and the second peaking amplifier die. The second wirebond array is configured to provide a combined RF signal comprising a first amplified RF signal from the first peaking amplifier die and a second amplified RF signal from the second peaking amplifier die to the signal combining bond pad, the second wirebond array being orthogonal to the first wirebond array. In an embodiment, the second peaking amplifier die further includes one or more shunt DC blocking capacitors (e.g., shunt DC blocking capacitors 338) coupled to a bond pad (e.g., bond pad 382) on the second peaking amplifier die, and the third output bond pad includes a second main pad portion (e.g., elongated main pad 734) and a second side pad portion (e.g., side pad 790). The second main pad portion has the fourth length (e.g., length 789) and the fourth width (e.g., width 796), and the second side pad portion has a fifth length (e.g., length 791) that extends orthogonal to the sixth side and a fifth width (e.g., width 794) that extends parallel with the sixth side. At least one of the fourth width or the fifth width is greater than the first width. In other embodiments, all or portions of the conductive path provided by the second wirebond array alternatively may be implemented using conductive traces on or within the substrate to which the amplifier dies and signal combiner device are attached.

At block 1512, the method involves coupling another second wirebond array (e.g., wirebond array 335) between the second side pad portion (e.g., side pad 790) of the second output bond pad and the bond pad (e.g., bond pad 382), the second wirebond array being orthogonal to the first wirebond array. In other embodiments, all or portions of the conductive path provided by the another second wirebond array alternatively may be implemented using conductive traces on or within the substrate.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier module comprising:
a substrate including a mounting surface;
a carrier amplifier die on the mounting surface, the carrier amplifier die including a first output bond pad that has a first length and a first width;
a first peaking amplifier die on the mounting surface, the first peaking amplifier die having substantially parallel first and second sides, and substantially parallel third and fourth sides, the first peaking amplifier die including a second output bond pad proximate to the second side, the second output bond pad including a first main pad portion and a first side pad portion, the first main pad portion having a second length that extends parallel with the second side and a second width that extends orthogonal to the second side, the first side pad portion having a third length that extends orthogonal to the second side and a third width that extends parallel with the second side, wherein at least one of the second width or the third width is greater than the first width;
a second peaking amplifier die on the mounting surface, the second peaking amplifier die having substantially parallel fifth and sixth sides, and substantially parallel seventh and eighth sides, wherein the fifth and sixth sides of the second peaking amplifier die are substantially parallel with the third and fourth sides of the first peaking amplifier die, the second peaking amplifier die including a third output bond pad proximate to the sixth side, wherein the third output bond pad has a fourth length that extends parallel with the sixth side and a fourth width that extends orthogonal to the sixth side; and
a first wirebond array coupled between the third output bond pad of the second peaking amplifier die and at least the first side pad portion of the second output bond pad of the first peaking amplifier die.

2. The Doherty amplifier module of claim 1, wherein the carrier amplifier die includes a first power transistor, the first peaking amplifier die includes a second power transistor and the second peaking amplifier die includes a third power transistor, wherein a drain-source capacitance of the third power transistor, a line inductance comprising a first inductance of the first wirebond array and a second inductance of the second output bond pad, and a drain-source capacitance of the second power transistor form a quasi-transmission line configured to perform a phase delay and an impedance transformation for an amplified radio frequency (RF) signal provided at the third output bond pad on the second peaking amplifier die, and wherein the at least one of the second width or the third width is configured to reduce the second inductance of the second output bond pad.

3. The Doherty amplifier module of claim 2, wherein the at least one of the second width or the third width enables the line inductance to be less than 300 picohenries (pH).

4. The Doherty amplifier module of claim 1, further comprising:
a second wirebond array coupled between the main pad portion of the second output bond pad and a signal combining bond pad external to the carrier amplifier die, the first peaking amplifier die, and the second peaking amplifier die, wherein the second wirebond array is configured to provide a combined radio frequency (RF) signal comprising a first amplified RF signal from the first peaking amplifier die and a second amplified RF signal from the second peaking amplifier die to the signal combining bond pad, the second wirebond array being orthogonal to the first wirebond array.

5. The Doherty amplifier module of claim 1, wherein:
the second peaking amplifier die further includes one or more shunt direct current (DC) blocking capacitors coupled to a bond pad on the second peaking amplifier die; and
the third output bond pad includes a second main pad portion and a second side pad portion, the second main pad portion having the fourth length and the fourth width, the second side pad portion having a fifth length that extends orthogonal to the sixth side and a fifth width that extends parallel with the sixth side, wherein at least one of the fourth width or the fifth width is greater than the first width,
wherein a second wirebond array is coupled between the second side pad portion of the second output bond pad and the bond pad, the second wirebond array being orthogonal to the first wirebond array.

6. The Doherty amplifier module of claim 5, wherein the at least one of the fourth width or the fifth width is configured to reduce the inductance of the third output bond pad.

7. The Doherty amplifier module of claim 1, wherein the carrier amplifier die includes ninth and tenth substantially parallel sides, wherein the first output bond pad is proximate to the tenth side, the carrier amplifier die configured to amplify a first radio frequency (RF) signal along a first signal path to produce a first amplified RF signal at the first output bond pad, the first signal path extending from the ninth side to the tenth side of the carrier amplifier die,
wherein the first peaking amplifier die is configured to amplify a second RF signal along a second signal path to produce a second amplified RF signal at the second output bond pad, the second signal path extending from the first side of the first peaking amplifier die to the second side of the first peaking amplifier die, and
wherein the second peaking amplifier die is configured to amplify a third RF signal along a third signal path to produce a third amplified RF signal at the third output bond pad, the third signal path extending from the fifth side of the second peaking amplifier die to the sixth side of the second peaking amplifier die, and wherein the third signal path is orthogonal to the first and second signal paths.

8. The Doherty amplifier module of claim 7, wherein the first side pad portion of the second output bond pad is proximate to the third side of the first peaking amplifier die, and wherein the sixth side of the second peaking amplifier die faces the third side of the first peaking amplifier die.

9. A Doherty amplifier module comprising:
a substrate including a mounting surface;
a carrier amplifier die on the mounting surface, the carrier amplifier die having substantially parallel first and second sides, and substantially parallel third and fourth sides, the carrier amplifier die including a first output bond pad proximate to the second side, the first output bond pad including a first main pad portion and a first side pad portion, the first main pad portion having a first length that extends parallel with the second side and a first width that extends orthogonal to the second side, the side pad portion having a second length that extends orthogonal to the second side and a second width that extends parallel with the second side;
a peaking amplifier die on the mounting surface, the peaking amplifier die having substantially parallel fifth and sixth sides, and substantially parallel seventh and eighth sides, wherein the fifth and sixth sides of the peaking amplifier die are substantially parallel with the third and fourth sides of the carrier amplifier die, the peaking amplifier die including a second output bond pad proximate to the sixth side, the second output bond pad including a second main pad portion and a second side pad portion, the second main pad portion having a third length that extends parallel with the sixth side and a third width that extends orthogonal to the sixth side, the second side pad portion having a fourth length that extends orthogonal to the sixth side and a fourth width that extends parallel with the sixth side, wherein the third width is greater than the first width, or the fourth width is greater than the second width; and a first wirebond array coupled between the first output bond pad of the carrier amplifier die and at least the second side pad portion of the peaking amplifier die.

10. The Doherty amplifier module of claim 9, wherein the carrier amplifier die includes a first power transistor and the peaking amplifier die includes a second power transistor, wherein a drain-source capacitance of the first power transistor, a line inductance comprising a first inductance of the first wirebond array and a second inductance of the second output bond pad, and a drain-source capacitance of the second power transistor form a quasi-transmission line configured to perform a phase delay and an impedance transformation for an amplified radio frequency (RF) signal provided at the first output bond pad, and wherein the at least one of the third width or the fourth width is configured to reduce the second inductance of the second output bond pad.

11. The Doherty amplifier module of claim 10, wherein the at least one of the third width or the fourth width enables the line inductance to be less than 300 picohenries (pH).

12. The Doherty amplifier module of claim 9, further comprising:
a second wirebond array coupled between the second main pad portion of the second output bond pad and a conductive contact on the mounting surface, wherein the second wirebond array provides an amplified radio frequency (RF) output signal of the Doherty amplifier module to the conductive contact, and wherein the second wirebond array is orthogonal to the first wirebond array.

13. The Doherty amplifier module of claim 9, wherein the peaking amplifier die comprises one or more shunt direct current (DC) blocking capacitors, wherein the one or more shunt DC blocking capacitors are coupled to the second main pad portion of the second output bond pad via at least one conductive trace on the peaking amplifier die.

14. The Doherty amplifier module of claim 13, wherein the at least one conductive trace comprises a meander line inductor or a planar spiral inductor.

15. The Doherty amplifier module of claim 9, wherein:
the carrier amplifier die is configured to amplify a first RF signal along a first signal path to produce a first amplified RF signal at the first output terminal, the first signal path extending from the first side of the carrier amplifier die to the second side of the carrier amplifier die; and
the peaking amplifier die is configured to amplify a second RF signal along a second signal path to produce a second amplified RF signal at the second output bond pad, the second signal path extending from the fifth side of the peaking amplifier die to the sixth side of the peaking amplifier die, wherein the first signal path is orthogonal to the second signal path.

16. The Doherty amplifier module of claim 15, wherein the second side pad portion of the second output bond pad is proximate to the seventh side of the peaking amplifier die, and wherein the second side of the carrier amplifier die faces the seventh side of the peaking amplifier die.

17. A method of fabricating a Doherty amplifier module, the method comprising:
attaching a carrier amplifier die on a mounting surface of a substrate, the carrier amplifier die including a first output bond pad that has a first length and a first width;
attaching a first peaking amplifier die on the mounting surface of the substrate, the first peaking amplifier die having substantially parallel first and second sides, and substantially parallel third and fourth sides, the first peaking amplifier die including a second output bond pad proximate to the second side, the second output bond pad including a first main pad portion and a first side pad portion, the first main pad portion having a second length that extends parallel with the second side and a second width that extends orthogonal to the second side, the side pad portion having a third length that extends orthogonal to the second side and a third width that extends parallel with the second side, wherein at least one of the second width or the third width is greater than the first width;
attaching a second peaking amplifier die on the mounting surface of the substrate, the second peaking amplifier die having substantially parallel fifth and sixth sides, and substantially parallel seventh and eighth sides, wherein the fifth and sixth sides of the second peaking amplifier die are substantially parallel with the third and fourth sides of the first peaking amplifier die, the second peaking amplifier die including a third output bond pad proximate to the sixth side, wherein the third output bond pad has a fourth length that extends parallel with the sixth side and a fourth width that extends orthogonal to the sixth side; and
coupling a first wirebond array between the third output bond pad of the second peaking amplifier die and at least the side pad portion of the second output bond pad of the first peaking amplifier die.

18. The method of claim 17, wherein the carrier amplifier die includes a first power transistor, the first peaking amplifier die includes a second power transistor and the second peaking amplifier die includes a third power transistor, wherein a drain-source capacitance of the third power transistor, a line inductance comprising a first inductance of the first wirebond array and a second inductance of the second output bond pad, and a drain-source capacitance of the second power transistor form a quasi-transmission line configured to perform a phase delay and an impedance transformation for an amplified radio frequency (RF) signal provided at the third output bond pad on the second peaking amplifier die, and wherein the at least one of the second width or the third width is configured to reduce the second inductance of the second output bond pad.

19. The method of claim 17, further comprising:
coupling a second wirebond array between the main pad portion of the second output bond pad and a signal combining bond pad external to the carrier amplifier die, the first peaking amplifier die, and the second peaking amplifier die, wherein the second wirebond array is configured to provide a combined radio frequency (RF) signal comprising a first amplified RF signal from the first peaking amplifier die and a second amplified RF signal from the second peaking amplifier die to the signal combining bond pad, the second wirebond array being orthogonal to the first wirebond array.

20. The method of claim 17, wherein the second peaking amplifier die further includes one or more shunt direct current (DC) blocking capacitors coupled to a bond pad on the second peaking amplifier die, and the third output bond pad includes a second main pad portion and a second side pad portion, the second main pad portion having the fourth length and the fourth width, the second side pad portion having a fifth length that extends orthogonal to the sixth side and a fifth width that extends parallel with the sixth side, wherein at least one of the fourth width or the fifth width is greater than the first width, further comprising:

coupling a second wirebond array between the second side pad portion of the second output bond pad and the bond pad, the second wirebond array being orthogonal to the first wirebond array.

\* \* \* \* \*